| (12) | United States Patent | (10) Patent No.: US 10,304,768 B2 |
|---|---|---|
| | Nakagawa et al. | (45) Date of Patent: May 28, 2019 |

(54) SEMICONDUCTOR DEVICE AND METHOD FOR MANUFACTURING THE SAME

(71) Applicant: RENESAS ELECTRONICS CORPORATION, Tokyo (JP)

(72) Inventors: Kazuyuki Nakagawa, Tokyo (JP); Shinji Baba, Tokyo (JP); Takeumi Kato, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/989,771

(22) Filed: May 25, 2018

(65) Prior Publication Data

US 2018/0277473 A1 Sep. 27, 2018

Related U.S. Application Data

(62) Division of application No. 15/302,632, filed as application No. PCT/JP2014/061625 on Apr. 24, 2014, now Pat. No. 10,056,323.

(51) Int. Cl.
*H01L 23/498* (2006.01)
*H01L 25/00* (2006.01)
(Continued)

(52) U.S. Cl.
CPC ........ *H01L 23/49838* (2013.01); *H01L 21/56* (2013.01); *H01L 22/14* (2013.01);
(Continued)

(58) Field of Classification Search
CPC ................................................. H01L 27/3276
See application file for complete search history.

(56) References Cited

U.S. PATENT DOCUMENTS 9,153,504 B2 * 10/2015 Lai .......................... H01L 22/14
2002/0074669 A1 6/2002 Watanabe et al.
(Continued)

FOREIGN PATENT DOCUMENTS

CN 103066338 A 4/2013
JP 07-147521 A 6/1995
(Continued)

OTHER PUBLICATIONS

Office Action issued in corresponding Taiwanese Patent Application No. 104111680, dated Jun. 6, 2018.
(Continued)

*Primary Examiner* — Thao P Le
(74) *Attorney, Agent, or Firm* — McDermott Will & Emery LLP

(57) ABSTRACT

A semiconductor device includes a wiring substrate including wiring layers, a semiconductor chip including electrode pads and mounted on the wiring substrate, and a first capacitor including a first electrode and a second electrode, and mounted on the wiring substrate. The wiring layers include a first wiring layer including a first terminal pad electrically connected with the first electrode of the first capacitor and a second terminal pad electrically connected with the second electrode of the first capacitor; and a second wiring layer on an inner side by one layer from the first wiring layer of the wiring substrate and including a first conductor pattern having a larger area than each of the first terminal pad and the second terminal pad. The first conductor pattern includes a first opening in a region overlapping with each of the first terminal pad and the second terminal pad in the second wiring layer.

5 Claims, 28 Drawing Sheets

(51) Int. Cl.
- H05K 3/46 (2006.01)
- H01L 21/56 (2006.01)
- H01L 21/66 (2006.01)
- H01L 23/31 (2006.01)
- H01L 23/367 (2006.01)
- H01L 23/66 (2006.01)
- H01L 23/00 (2006.01)
- H01L 23/50 (2006.01)
- H05K 1/02 (2006.01)

(52) U.S. Cl.
CPC ........ *H01L 23/3128* (2013.01); *H01L 23/367* (2013.01); *H01L 23/3675* (2013.01); *H01L 23/49816* (2013.01); *H01L 23/49822* (2013.01); *H01L 23/49827* (2013.01); *H01L 23/50* (2013.01); *H01L 23/66* (2013.01); *H01L 24/49* (2013.01); *H01L 24/85* (2013.01); *H01L 25/00* (2013.01); *H01L 25/50* (2013.01); *H05K 1/0225* (2013.01); *H05K 1/0231* (2013.01); *H05K 1/0253* (2013.01); *H05K 3/46* (2013.01); *H01L 24/48* (2013.01); *H01L 2223/6611* (2013.01); *H01L 2223/6616* (2013.01); *H01L 2224/13111* (2013.01); *H01L 2224/13116* (2013.01); *H01L 2224/13139* (2013.01); *H01L 2224/13147* (2013.01); *H01L 2224/16225* (2013.01); *H01L 2224/32225* (2013.01); *H01L 2224/45099* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2924/00014* (2013.01); *H01L 2924/014* (2013.01); *H01L 2924/1517* (2013.01); *H01L 2924/15311* (2013.01); *H01L 2924/16195* (2013.01); *H01L 2924/181* (2013.01); *H01L 2924/19041* (2013.01); *H01L 2924/19105* (2013.01)

(56) References Cited

U.S. PATENT DOCUMENTS

| | | |
|---|---|---|
| 2004/0032637 A1 | 2/2004 | Imamura |
| 2005/0157236 A1* | 7/2005 | Kawasaki ............ G02F 1/1362 349/139 |
| 2009/0032922 A1 | 2/2009 | Koga |
| 2009/0057913 A1 | 3/2009 | Hsu |
| 2009/0242252 A1 | 10/2009 | Tanaka |
| 2010/0032802 A1* | 2/2010 | Togawa ................ H01L 23/642 257/532 |
| 2010/0301473 A1 | 12/2010 | Sasaoka |
| 2012/0152606 A1 | 6/2012 | Kurokawa |
| 2013/0101871 A1 | 4/2013 | Byun |
| 2014/0144675 A1 | 5/2014 | Hsu |
| 2017/0033038 A1* | 2/2017 | Nakagawa ........... H05K 1/0253 |
| 2018/0254252 A1* | 9/2018 | Nakagawa ............... H01G 2/06 |

FOREIGN PATENT DOCUMENTS

| | | |
|---|---|---|
| JP | 2002-184933 A | 6/2002 |
| JP | 2007-208207 A | 8/2007 |
| JP | 2009-038111 A | 2/2009 |
| JP | 2010-021275 A | 1/2010 |
| JP | 2012-089590 A | 5/2012 |
| JP | 2013-046364 A | 3/2013 |
| WO | 2006/001087 A | 1/2006 |

OTHER PUBLICATIONS

Chinese Office Action issued in corresponding Chinese Patent Application No. 201480078258.1, dated Jun. 21, 2018, with English Translation.
International Search Report issued in International Application No. PCT/JP2014/061625, dated Jun. 17, 2014, with English Translation.
Non-Final Office Action issued in related parent U.S. Appl. No. 15/302,632, dated Sep. 21, 2017.
Notice of Allowance issued in related parent U.S. Appl. No. 15/302,632, dated Feb. 26, 2018.

* cited by examiner

SEMICONDUCTOR DEVICE AND METHOD FOR MANUFACTURING THE SAME

CROSS-REFERENCE TO RELATED APPLICATIONS

This application is a Divisional of U.S. application Ser. No. 15/302,632, filed on Oct. 7, 2016, which is an U.S. National Phase of PCT/JP2014/061625 filed on Apr. 24, 2014, the subject matter of which are incorporated herein by reference in their entirety.

TECHNICAL FIELD

The present invention relates to a semiconductor device that includes a wiring substrate on which a semiconductor chip and a capacitor are mounted, for example, and a method for manufacturing the same.

BACKGROUND ART

Japanese Patent Application Laid-Open Publication No. 2010-21275 (Patent Document 1) describes a semiconductor device in which a semiconductor chip and chip components are mounted on a wiring substrate.

RELATED ART DOCUMENT

Patent Document

Patent Document 1: Japanese Patent Application Laid-Open Publication No. 2010-21275

SUMMARY OF THE INVENTION

Problems to be Solved by the Invention

There is a technique in which a plurality of semiconductor devices is mounted on a wiring substrate such as a motherboard and a capacitor is connected in series to a signal path that electrically connects the plurality of semiconductor devices to each other. This capacitor is used for cutting a DC component included in an AC signal and is referred to as a DC (Direct Current) cut capacitor or an AC (Alternate Current) coupling capacitor (hereinafter, referred to as the DC cut capacitor).

The inventors of the present application have studied a technique of mounting the DC cut capacitor which has been mounted on a wiring substrate so far inside the semiconductor device as part of an effort for reducing a size of an electronic device that performs input and output of a signal among the plurality of semiconductor devices as described above.

Then, it has been found out that there is a problem in terms of reliability of the semiconductor device depending on layout of the capacitor in the case of simply having the DC cut capacitor built in the semiconductor device as a result of the above-described study.

Other objects and novel characteristics of the present invention will be apparent from the description of the present specification and the accompanying drawings.

Means for Solving the Problems

A semiconductor device according to an embodiment includes a wiring substrate including a plurality of wiring layers, a semiconductor chip including a plurality of electrode pads, and mounted on the wiring substrate, and a first capacitor including a first electrode and a second electrode, and mounted on the wiring substrate. In addition, the plurality of wiring layers has a first wiring layer including a first terminal pad electrically connected with the first electrode of the first capacitor and a second terminal pad electrically connected with the second electrode of the first capacitor. Moreover, the plurality of wiring layers has a second wiring layer positioned on an inner side by one layer from the first wiring layer of the wiring substrate, and including a first conductor pattern having a larger area than each of the first terminal pad and the second terminal pad. Further, in the second wiring layer, the first conductor pattern includes a first opening portion formed in a region overlapping with each of the first terminal pad and the second terminal pad.

Effect of the Invention

According to the embodiment, it is possible to improve reliability of a semiconductor device.

BRIEF DESCRIPTIONS OF THE DRAWINGS

DETAILED DESCRIPTION OF PREFERRED EMBODIMENT

Figure 1:
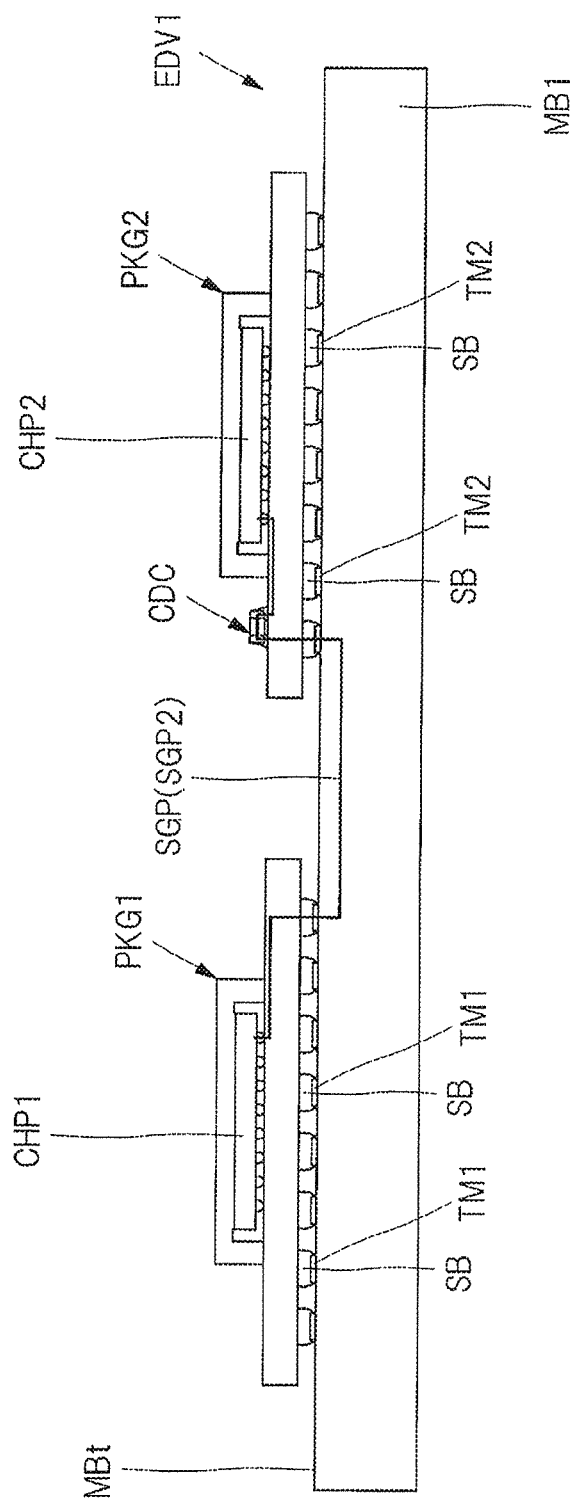
FIG. 1 is an explanatory diagram illustrating a configuration example of an electronic device that includes a semiconductor device as an embodiment.

Description of Description Form, Basic Terms and Method in Present Application

In this application, the embodiment will be described in a plurality of sections or the like when required as a matter of convenience. However, these sections are not independent or distinct from each other unless particularly explicitly described otherwise, and they are individual parts of a single example, one of them is a partial detail of the other, or one of them is a modification example or the like of part or the whole of the other, irrespective of the order of descriptions. Also, the description of the same portions is not repeated in principle. Further, each component in the embodiment is not indispensable unless particularly explicitly described otherwise, unless the component is logically limited to a specific number, and unless it is obvious from the context that the component is indispensable.

Similarly, in the description of an embodiment and others, even when "X made up of A" or the like is referred to with respect to a material, a composition, and the like, X containing elements other than A is not excluded unless particularly explicitly described otherwise and unless it is obvious from the context that X does not contain elements other than A. For example, when referring to an ingredient, it means "X containing A as a main ingredient" or the like. For example, even when "silicon member" or the like is mentioned, the meaning is not limited to pure silicon, and it is needless to say that a member containing a SiGe alloy, another multi-element alloy containing silicon as a main ingredient, another additive, or the like is also included. In addition, even when a gold plating, a Cu layer, a nickel plating and others are mentioned, not only a pure one but also a member containing each of gold, Cu and nickel as a main ingredient is included unless particularly explicitly described otherwise.

Further, even when a specific value or amount is mentioned, a value larger than a specific value or smaller than the specific value is also applicable unless particularly explicitly described otherwise, unless it is logically limited to the specific value, and unless it is obvious from the context that a value is not larger than the specific value or smaller than the specific value.

Also, the same or similar portions are denoted by the same or similar reference signs or characters throughout the drawings for describing the embodiment, and the repetitive description thereof is omitted.

In addition, in the accompanying drawings, hatching may be omitted even in a cross section in the case where the drawings become rather complicated or distinction from a clearance is apparent. In association with this, when it is obvious from the description or the like, a contour line in a background may be omitted even in a case of a planar closed hole. In addition, in order to specify the fact that a portion is not a clearance or specify a boundary of regions, hatching or dot pattern may be given even in the case other than the cross section.

Embodiment

Electronic Device

Figure 2:
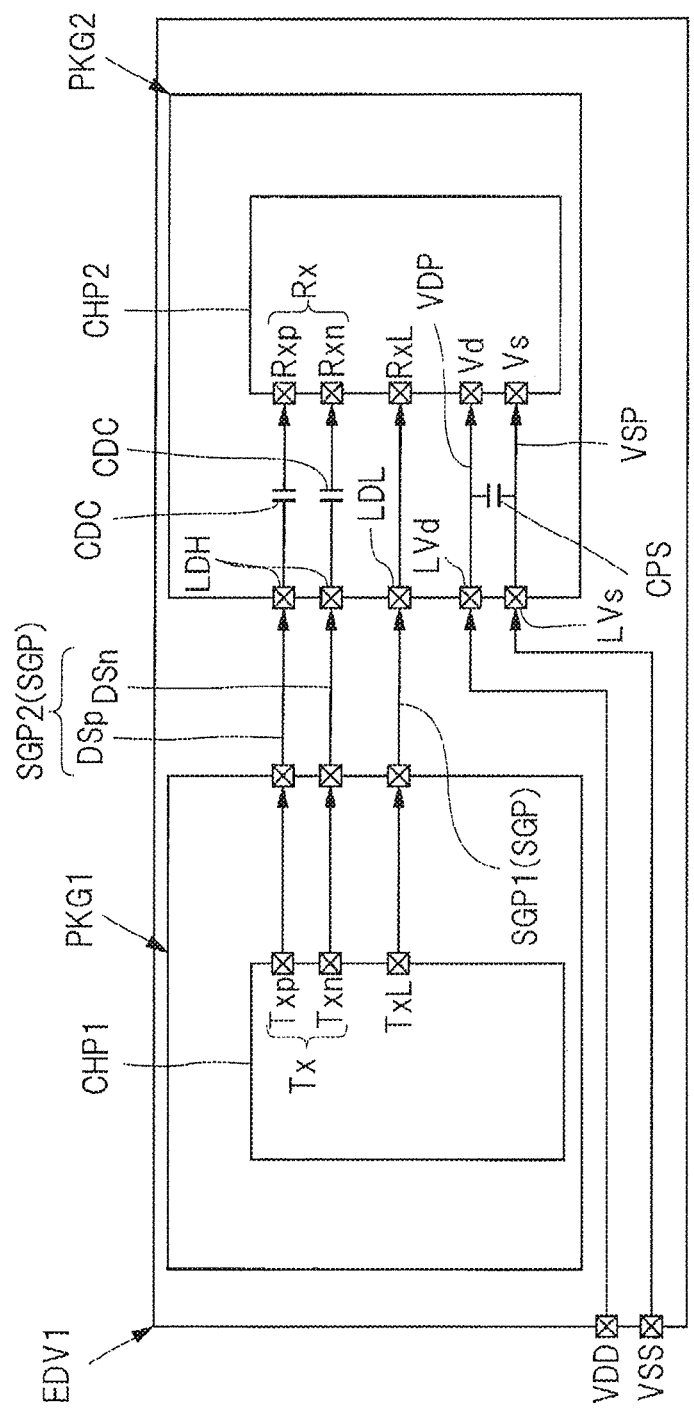
FIG. 2 is an explanatory diagram illustrating a configuration example of a circuit provided in the electronic device illustrated in FIG. 1.

First, a description will be given regarding a configuration example of an electronic device in which a plurality of semiconductor devices (a semiconductor package) is mounted on a motherboard, and an electrical signal is transmitted among the plurality of semiconductor devices with reference to FIGS. 1 and 2. FIG. 1 is an explanatory diagram illustrating a configuration example of an electronic device that includes a semiconductor device as an embodiment. In addition, FIG. 2 is an explanatory diagram illustrating a configuration example of a circuit provided in the electronic device illustrated in FIG. 1. Note that FIG. 1 schematically illustrates a high-speed transmission path SGP2 illustrated in FIG. 2 using a bold line in order to clearly illustrate a semiconductor device PKG1 and a semiconductor device PKG2 being electrically connected with each other.

An electronic device (electronic equipment) EDV1 illustrated in FIG. 1 includes a wiring substrate (a motherboard or a mounting board) MB1, the semiconductor device PKG1 mounted on the wiring substrate MB1, and the semiconductor device PKG2 mounted on the wiring substrate MB1. The semiconductor device PKG1 and the semiconductor device PKG2 are electrically connected with each other via a signal transmission path SGP formed in the wiring substrate MB1.

Specifically, the electronic device EDV1 includes a plurality of signal transmission paths SGP as illustrated in FIG. 2. In the example illustrated in FIG. 2, the plurality of signal transmission paths SGP includes a low-speed transmission path SGP1 through which an electrical signal is transmitted at a first transmission speed and a high-speed transmission path SGP2 through which an electrical signal is transmitted at a second transmission speed which is faster than the first transmission speed. In addition, the high-speed transmission path SGP2 is constituted by a pair of differential signal transmission paths DSp and DSn through which a differential signal is transmitted in the example illustrated in FIG. 2.

Note that, although the description is given in the present embodiment by exemplifying the embodiment in which the differential signals are transmitted via the pair of differential signal transmission paths DSp and DSn as an example of the high-speed transmission path SGP2, various modification examples can be applied as types of a high-speed signal other than the differential signal. For example, it is possible to perform high-speed transmission by increasing a frequency even in the case of a so-called single-ended structure that employs one signal transmission path SGP.

In addition, for example, an electrode (electrode pad) TxL for sending a low-speed signal which is transmitted at the first transmission speed is formed in the semiconductor chip CHP1 provided in the semiconductor device PKG1 in the example illustrated in FIG. 2. In addition, for example, an electrode (electrode pad) Tx (specifically, an electrode Txp and an electrode Txn from which a pair of differential signals is output) for sending a high-speed signal which is transmitted at the second transmission speed faster than the first transmission speed is formed in the semiconductor chip CHP1.

Meanwhile, an electrode (the electrode pad) RxL for receiving of the low-speed signal which is transmitted at the first transmission speed is formed in the semiconductor chip CHP2 provided in the semiconductor device PKG2. In addition, for example, an electrode (electrode pad) Rx (specifically, an electrode Rxp and an electrode Rxn to which a pair of differential signals is input) for receiving the high-speed signal which is transmitted at the second transmission speed faster than the first transmission speed is formed in the semiconductor chip CHP2.

Further, the electrical signal is transmitted at a transmission speed lower than, for example, 3 Gbps (Gigabit per second) in the low-speed transmission path SGP1 which is formed by electrically connecting the electrode TxL and the electrode RxL. In addition, the electrical signal is transmitted at a transmission speed about, for example, 3 Gbps to 50 Gbps in the high-speed transmission path SGP2 which is formed by electrically connecting the electrode Tx and the electrode Rx.

It is preferable to connect a capacitor CDC in series in the high-speed transmission path SGP2 in a case in which the signal is transmitted at high speed as in the electronic device EDV1. It is possible to cut a DC component included in an AC signal through the capacitor CDC which is inserted in the high-speed transmission path SGP2. Accordingly, it is possible to stabilize input and output of the signal performed at the high speed. The capacitor CDC which is inserted in the signal transmission path in series connection and cuts the DC component of the AC signal as above is referred to as a DC (Direct Current) cut capacitor or an AC (Alternate Current) coupling capacitor (hereinafter, referred to as the DC cut capacitor).

The capacitor CDC serving as the DC cut capacitor is distinguished from a capacitor for a power supply circuit that is inserted in a power supply circuit in parallel connection like a capacitor CPS illustrated in FIG. 2, for example. The capacitor CPS illustrated in FIG. 2 is inserted between a reference potential supplying path VSP which supplies a reference potential (first potential) VSS to the semiconductor chip CHP2, and a power supply potential supplying path VDP which supplies a power supply potential (second potential) VDD to the semiconductor chip CHP2. The capacitor CPS can function as a bypass capacitor that causes noise (signal) included in the power supply potential supplying path VDP to flow to the reference potential supplying path VSP side by bypassing. In addition, the capacitor CPS can function as a decoupling capacitor that reduces influence of an impedance component included in the power supply potential supplying path VDP and the reference potential supplying path VSP by decreasing a loop (path distance) of current flowing in a circuit formed in the semiconductor chip CHP2. In addition, the capacitor CPS can function as a battery that suppresses a phenomenon in which a drive voltage instantaneously drops by connecting the capacitor CPS to the vicinity of the circuit that consumes supplied power.

The above-described capacitor CPS for the power supply circuit which is used as the bypass capacitor, the decoupling capacitor, or the battery is inserted in the power supply circuit in parallel connection in any case. In contrast, the capacitor CDC is inserted in the signal transmission path SGP in series connection. Thus, the capacitor CDC is inserted in each of the differential signal transmission path DSp and the differential signal transmission path DSn in a case in which the high-speed transmission path SGP2 is constituted by the differential signal transmission paths DSp and DSn as illustrated in FIG. 2.

Herein, at least one or more of the capacitors CDC serving as the DC cut capacitor may be inserted in the high-speed transmission path SGP2 as described above. Accordingly, it is also possible to mount the capacitor CDC on the wiring substrate MB1 illustrated in FIG. 1, for example. However, the DC cut capacitor needs to be mounted corresponding to the number of the high-speed transmission paths SGP2. For example, it is necessary to provide the same number of the capacitors CDC as the number of high-speed transmission paths in the case of the high-speed transmission path having the single-ended structure. In addition, one capacitor CDC is required for each of the high-speed transmission paths SGP2 of the differential pair (two capacitors CDC are required in total) in the case of the high-speed transmission path SGP2 that transmits the differential signals as illustrated in FIG. 2, for example.

When a large number of the capacitors CDC are mounted on the wiring substrate MB1 in this manner, layout of wires which constitute the high-speed transmission path SGP2 among a plurality of wires formed in the wiring substrate MB1 becomes complex. In addition, it is difficult to reduce a size of the electronic device EDV1 as the layout of wires becomes complex.

In addition, it is preferable to form the wire which constitutes the high-speed transmission path SGP2 on an inner layer (wiring layer formed on an inner side from a wiring layer on which the terminal to be mounted on the semiconductor devices PKG1 and PKG2 is formed) of the wiring substrate MB1 illustrated in FIG. 1 from a viewpoint of reducing crosstalk noise in the high-speed transmission path SGP2. However, in the case of mounting the capacitor CDC on the wiring substrate MB1, in order to electrically connect the capacitor CDC and the high-speed transmission path SGP2, it is necessary to pass through an interlayer conducting path such as a via and a through-hole (not illustrated) that electrically connects the stacked wiring layers. The interlayer conducting path such as the via and the through-hole causes impedance discontinuity in the high-speed transmission path SGP2. Accordingly, it is preferable to reduce the number of interlayer conducting paths provided in the high-speed transmission path SGP2 from a viewpoint of improving electrical characteristics of the high-speed transmission path SGP2.

Thus, the inventors of the present application have conducted a study on a technique of mounting the capacitor CDC serving as the DC cut capacitor in the semiconductor device PKG2 as illustrated in FIG. 1. It is possible to simplify the layout of wires formed in the wiring substrate MB1 by mounting the capacitor CDC in the semiconductor device PKG2. Accordingly, it is possible to reduce a size of the wiring substrate MB1.

In addition, it is possible to reduce the number of interlayer conducting paths inserted in the high-speed transmission path SGP2 provided in the wiring substrate MB1 by mounting the capacitor CDC inside the semiconductor device PKG2. Accordingly, it is possible to improve the electrical characteristics of the high-speed transmission path SGP2.

Note that the capacitor CDC is mounted in the semiconductor device PKG2 that includes a circuit for receiving between the semiconductor device PKG1 that includes a circuit for sending and the semiconductor device PKG2 that includes the circuit for receiving in the present embodiment as illustrated in FIG. 1. However, one or more of the capacitors CDC may be inserted in the high-speed transmission path SGP2 as described above. Accordingly, as a modification example with respect to FIG. 1, the capacitor CDC may be mounted in the semiconductor device PKG1 that includes the circuit for sending, and the capacitor CDC may not be mounted in the semiconductor device PKG2. In addition, as another modification example with respect to FIG. 1, it is also possible to mount the capacitors CDC in both of the semiconductor device PKG1 and the semiconductor device PKG2.

Semiconductor Device

Figure 3:
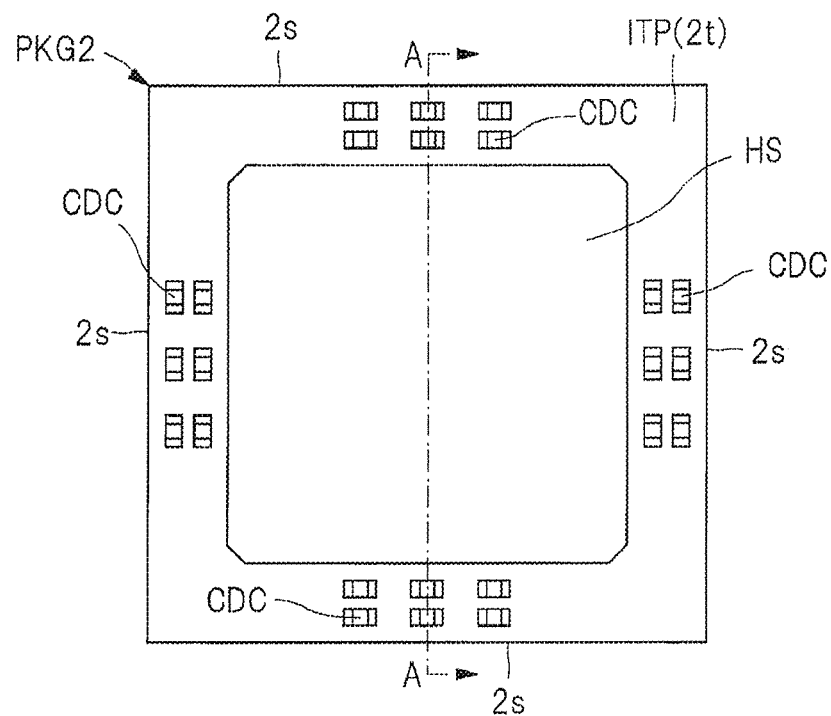
FIG. 3 is a top view of a semiconductor device which has DC cut capacitors built therein among a plurality of semiconductor devices illustrated in FIG. 1.
Figure 4:
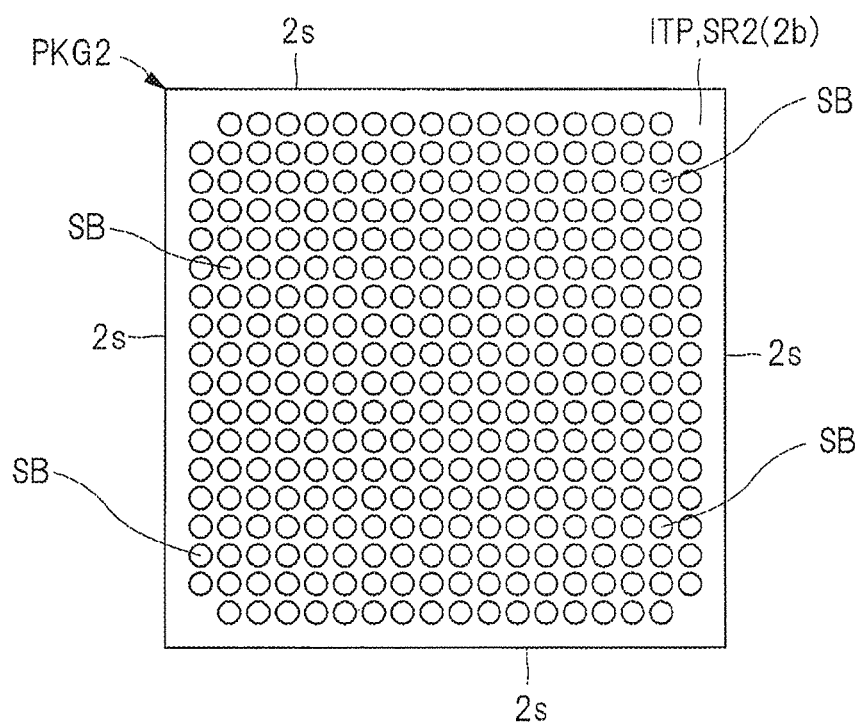
FIG. 4 is a bottom view of the semiconductor device illustrated in FIG. 3.
Figure 5:
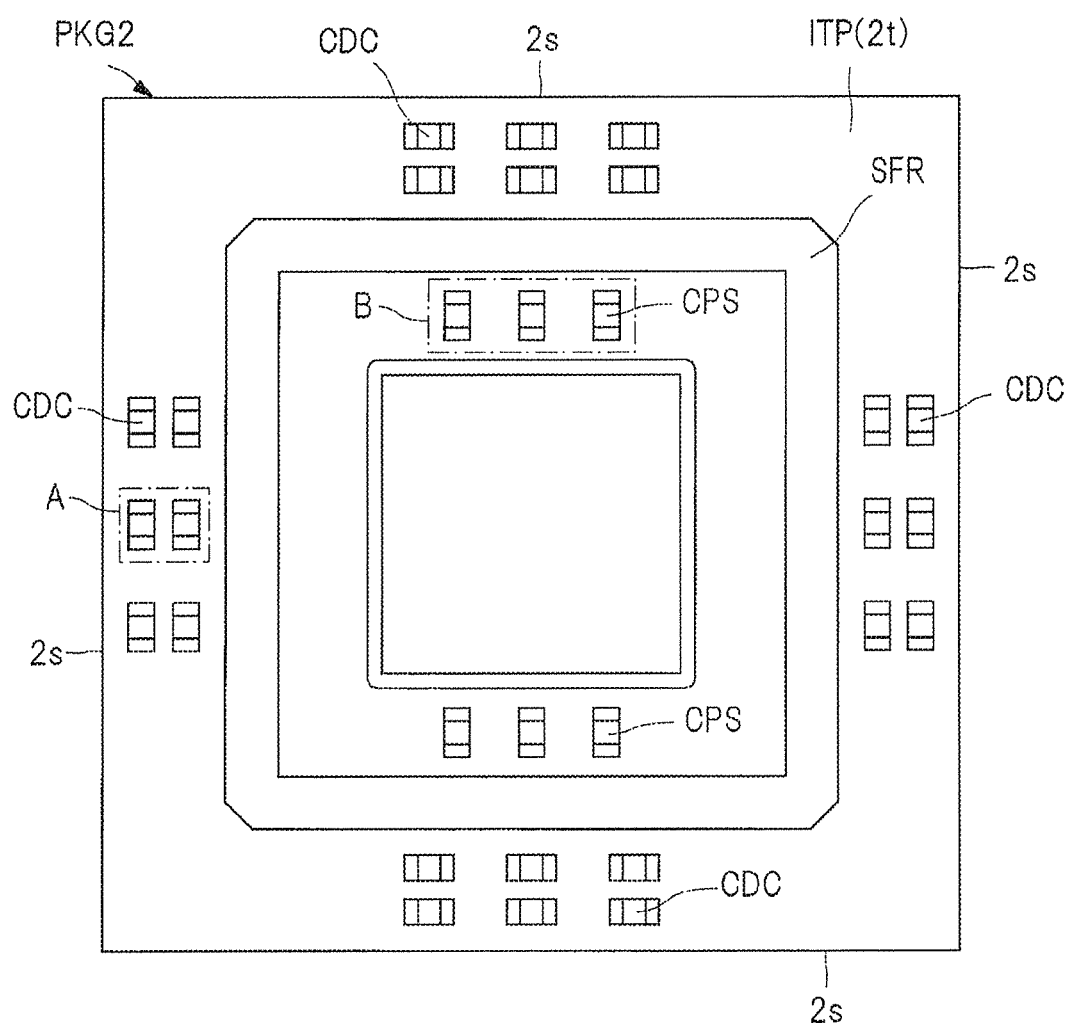
FIG. 5 is a plan view illustrating an internal structure of the semiconductor device on a wiring substrate in a state of removing a heat dissipation plate illustrated in FIG. 3.

Next, a description will be given in detail regarding an embodiment in which the capacitor CDC is mounted in the semiconductor device PKG2 as an example of the semiconductor device PKG2 illustrated in FIG. 1. FIG. 3 is a top view of a semiconductor device that has the DC cut capacitors built therein among the plurality of semiconductor devices illustrated in FIG. 1. In addition, FIG. 4 is a bottom view of the semiconductor device illustrated in FIG. 3. In addition, FIG. 5 is a plan view illustrating an internal structure of the semiconductor device on a wiring substrate in a state of removing a heat dissipation plate illustrated in FIG. 3. In addition, FIG. 6 is a cross-sectional view taken along a line A-A of FIG. 3.

Figure 6:
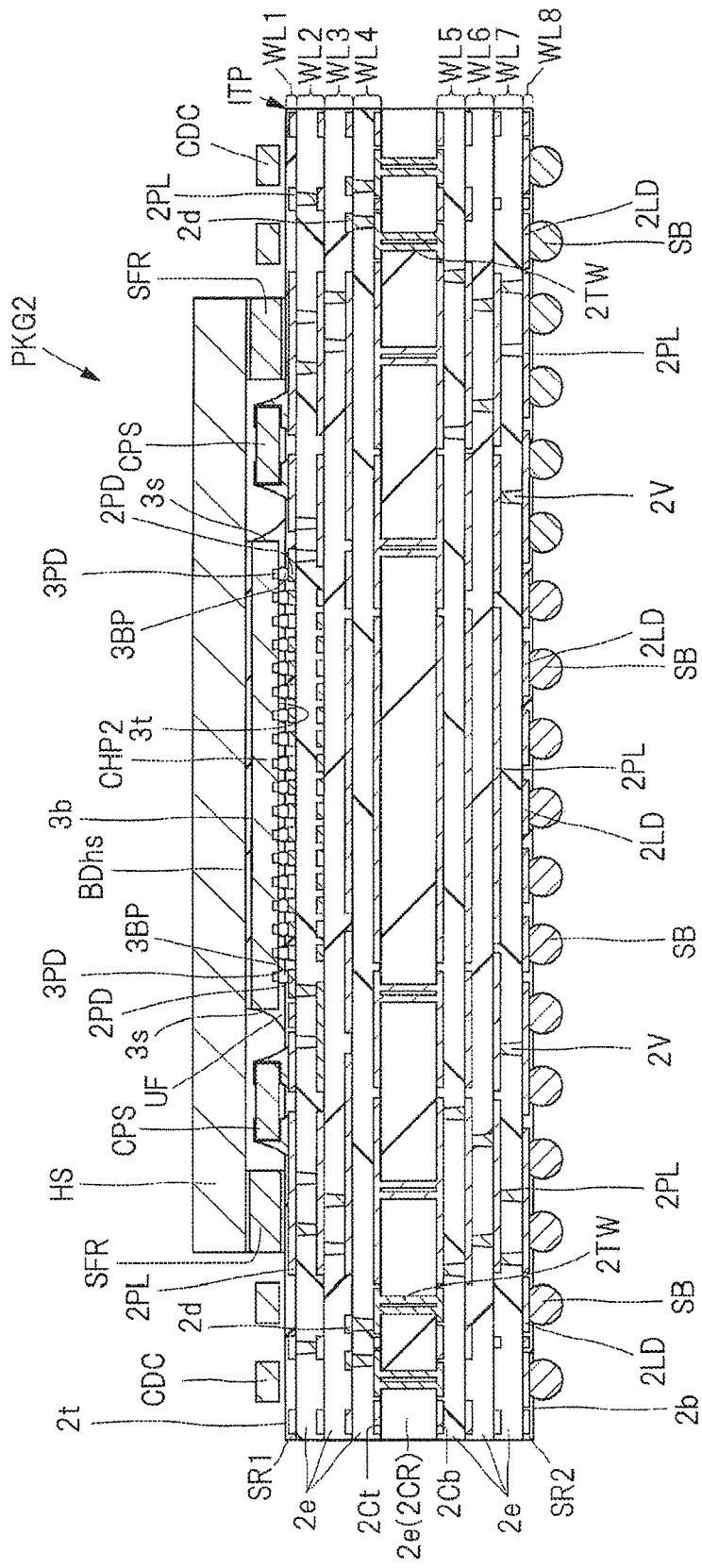
FIG. 6 is a cross-sectional view taken along a line A-A of FIG. 3.

Note that FIGS. 3 to 6 illustrate a small number of terminals for viewability. In addition, FIG. 6 illustrates a smaller number of solder balls SB than in the example illustrated in FIG. 4 for viewability. The number of terminals (a bonding pad 2PD, a land 2LD, and the solder ball SB) is not limited to the mode illustrated in FIGS. 3 to 6. For example, the present invention can be applied to a semiconductor device in which each number of terminals such as the bonding pad 2PD, the land 2LD, and the solder ball SB is about 100 to 10,000.

First, a description will be given regarding a schematic configuration of the semiconductor device PKG2 of the present embodiment with reference to FIGS. 3 to 6. The semiconductor device PKG2 of the present embodiment has a wiring substrate ITP, the semiconductor chip CHP2 (see FIG. 5) mounted on the wiring substrate ITP, and the plurality of capacitors CDC mounted on the wiring substrate ITP.

As illustrated in FIG. 6, the wiring substrate ITP has an upper surface (a surface, a main surface, or a chip mounting surface) 2t on which the semiconductor chip CHP2 is mounted, a lower surface (a surface, a main surface, or a mounting surface) 2b on the opposite side of the upper surface 2t, and a plurality of side surfaces 2s (see FIGS. 3 to 5) arranged between the upper surface 2t and the lower surface 2b, and forms a quadrangular outer shape when seen in a plan view as illustrated in FIGS. 4 and 5. In the example illustrated in FIGS. 4 and 5, a planar size of the wiring substrate ITP (dimensions when seen in a plan view, each dimension of the upper surface 2t and the lower surface 2b, or an outer size) forms a square or a rectangle whose side has a length of about 12 mm to 60 mm, for example. In addition, a thickness (height) of the wiring substrate ITP, that is, a distance from the upper surface 2t to the lower surface 2b illustrated in FIG. 6 is about, for example, 0.3 mm to 1.3 mm.

The wiring substrate ITP is an interposer (relay board) configured to electrically connect the semiconductor chip CHP2 mounted on the upper surface 2t side and the wiring substrate MB1 serving as the motherboard (mounting board) illustrated in FIG. 1. The wiring substrate ITP includes a plurality of wiring layers (eight layers in the example illustrated in FIG. 6) WL1, WL2, WL3, WL4, WL5, WL6, WL7, and WL8 which electrically connect the upper surface 2t side serving as the chip mounting surface and the lower surface 2b side serving as the mounting surface. Each wiring layer includes a conductor pattern such as a wire which is a path that supplies an electrical signal or power, and an insulating layer 2e which insulates a plurality of paths. Note that a layer constituted by only the conductor pattern without the insulating layer 2e is referred to also as a wiring layer.

In addition, most of the wiring layer WL1 which is arranged the closest on the upper surface 2t side among the plurality of wiring layers is covered by an insulating layer SR1 serving as a solder resist film. In addition, most of the wiring layer WL8 which is arranged the closest on the lower surface 2b side among the plurality of wiring layers is covered by an insulating layer SR2 serving as the solder resist film.

In addition, the wiring substrate ITP is formed by, for example, stacking the plurality of wiring layers on each of an upper surface 2Ct and a lower surface 2Cb of an insulating layer (a core member or a core insulating layer) 2CR made of a prepreg obtained by causing a glass fiber to be impregnated with resin through a build-up method. In addition, the wiring layer WL4 on the upper surface 2Ct side and the wiring layer WL5 on the lower surface 2Cb side of the insulating layer 2CR are electrically connected via a plurality of through-hole wires 2TW which are buried in a plurality of through-holes provided to penetrate from one of the upper surface 2Ct and the lower surface 2Cb to the other.

The plurality of bonding pads (bonding leads or semiconductor chip connecting terminals) 2PD which is electrically connected with the semiconductor chip CHP2 is formed in the upper surface 2t of the wiring substrate ITP. In addition, the plurality of lands 2LD which is external input and output terminals of the semiconductor device PKG2 is formed in the lower surface 2b of the wiring substrate ITP. The plurality of bonding pads 2PD and the plurality of lands 2LD are electrically connected with each other via a wire 2d, a via 2V, and the through-hole wire 2TW formed in the wiring substrate ITP.

Note that the wiring substrate ITP is illustrated as the wiring substrate in which the plurality of wiring layers is respectively stacked on the upper surface 2Ct side and the lower surface 2Cb side of the insulating layer 2CR serving as the core member in the example illustrated in FIG. 6. However, a so-called coreless substrate which is formed by stacking the insulating layer 2e and the conductor pattern such as the wire 2d in order without having the insulating layer 2CR made of a hard material such as the prepreg member may be used as a modification example with respect to FIG. 6. When the coreless substrate is used, the through-hole wire 2TW is not formed, and the respective wiring layers are electrically connected via the via 2V. In addition, FIG. 6 illustrates the wiring substrate ITP including the eight wiring layers byway of example, but a wiring substrate including, for example, nine wiring layers or more, or seven wiring layers or less may be used as a modification example.

In addition, the solder ball (a solder member, an external terminal, an electrode, or an external electrode) SB is connected with each of the plurality of lands 2LD in the example illustrated in FIG. 6. The solder ball SB is a conductive member that electrically connects a plurality of terminals (not illustrated) on the wiring substrate MB1 side and the plurality of lands 2LD at the time of mounting the semiconductor device PKG2 on the wiring substrate MB1 illustrated in FIG. 1. The solder ball SB is the solder member made of, for example, an Sn—Pb solder member that contains lead (Pb) or a so-called lead-free solder that does not substantially contain Pb. Examples of the lead-free solder include only tin (Sn), tin-bismuth (Sn—Bi), tin-copper-silver (Sn—Cu—Ag), tin-copper (Sn—Cu), and the like. Herein, the lead-free solder means a solder containing 0.1 wt % lead (Pb) or less, and this content is determined based on RoHS (Restriction of Hazardous Substances) directive.

In addition, the plurality of solder balls SB is arranged in rows and columns (in an array form or a matrix form) as illustrated in FIG. 4. In addition, the plurality of lands 2LD (see FIG. 6) to which the plurality of solder balls SB is bonded is also arranged in rows and columns (in a matrix form) although not illustrated in FIG. 4. The semiconductor device in which the plurality of external terminals (the solder balls SB and the lands 2LD) is arranged in rows and columns on the mounting surface side of the wiring substrate ITP as above is referred to as an area array type semiconductor device. The area array type semiconductor device can advantageously utilize the mounting surface (the lower surface 2b) of the wiring substrate ITP as an arrangement space of the external terminal and thus, is preferable in terms of the fact that increase in mounting area of the semiconductor device can be suppressed even when the number of external terminals increases. That is, it is possible to mount the semiconductor device whose external terminals increase in number in accordance with higher functionality and higher integration in a smaller space.

In addition, the semiconductor device PKG2 has the semiconductor chip CHP2 mounted on the wiring substrate ITP. As illustrated in FIG. 6, the semiconductor chip CHP2 includes a front surface (a main surface or an upper surface) 3t, a rear surface (a main surface or a lower surface) 3b on the opposite side of the front surface 3t, and side surfaces 3s positioned between the front surface 3t and the rear surface 3b, and forms a quadrangular outer shape which has a smaller plane area than the wiring substrate ITP when seen in a plan view as illustrated in FIG. 5. In the example illustrated in FIG. 5, the semiconductor chip CHP2 is mounted in a center portion of the upper surface 2t of the wiring substrate ITP such that the four side surfaces 3s extend, respectively, along the four side surfaces 2s of the wiring substrate ITP.

In addition, a plurality of pads (electrode pads or bonding pads) 3PD is formed on the front surface 3t side of the semiconductor chip CHP2 as illustrated in FIG. 6. The plurality of pads 3PD is exposed from a passivation film that protects the front surface 3t of the semiconductor chip CHP2 on the front surface 3t of the semiconductor chip CHP2. In the present embodiment, the plurality of pads 3PD is arranged in rows and columns (in a matrix form or an array form) on the front surface 3t of the semiconductor chip CHP2. It is possible to advantageously utilize the front surface 3t of the semiconductor chip CHP2 as an arrangement space of electrodes by arranging the plurality of pads 3PD which is the electrodes of the semiconductor chip CHP2, in rows and columns, so that it is preferable in terms of the fact that increase in plane area can be suppressed even when the number of electrodes of the semiconductor chip CHP2 increases. Meanwhile, the present invention can be applied to a semiconductor chip of a type in which the plurality of pads 3PD is formed at a peripheral edge portion of the front surface 3t as a modification example with respect to the present embodiment, although not illustrated.

In addition, the semiconductor chip CHP2 is mounted on the wiring substrate ITP in a state in which the front surface 3t is arranged to face the upper surface 2t of the wiring substrate ITP in the example illustrated in FIG. 6. Such a mounting method is referred to as a face-down mounting method, or a flip chip connection method.

In addition, a plurality of semiconductor elements (circuit elements) is formed on the main surface (specifically, a semiconductor element formation region provided on an element formation surface of a semiconductor substrate serving as a base member of the semiconductor chip CHP2) of the semiconductor chip CHP2, although not illustrated. The plurality of pads 3PD is electrically connected with the plurality of semiconductor elements, respectively, via wires (not illustrated) formed in a wiring layer arranged in the semiconductor chip CHP2 (specifically, between the front surface 3t and the semiconductor element formation region not illustrated).

The semiconductor chip CHP2 (specifically, the base member of the semiconductor chip CHP2) is made of, for example, silicon (Si). In addition, an insulating film which covers the base member and the wire of the semiconductor chip CHP2 is formed on the front surface 3t, and a part of each of the plurality of pads 3PD is exposed from the insulating film in an opening portion formed in the insulating film. In addition, each of the plurality of pads 3PD is made of metal and is made of aluminum (Al), for example, in the present embodiment.

In addition, protruding electrodes 3BP are connected with the plurality of pads 3PD, respectively, and the plurality of pads 3PD of the semiconductor chip CHP2 and the plurality of bonding pads 2PD of the wiring substrate ITP are electrically connected with each other via the plurality of protruding electrodes 3BP as illustrated in FIG. 6. The protruding electrode (bump electrode) 3BP is a metal member (conductive member) which is formed to protrude on the front surface 3t of the semiconductor chip CHP2. The protruding electrode 3BP is a so-called solder bump in which a solder member is stacked on the pad 3PD with an underlying metal film (under bump metal) interposed therebetween in the present embodiment. Examples of the underlying metal film can include a stacked film in which titanium (Ti), copper (Cu), and nickel (Ni) are stacked from a connection surface side to the pad 3PD (including a case in which a gold (Au) film is further formed on the nickel film). In addition, a lead-containing solder member or a lead-free solder can be used as the solder member constituting the solder bump similarly to the above-described solder ball SB. When the semiconductor chip CHP2 is mounted on the wiring substrate ITP, the solder bumps are formed in advance on both of the plurality of pads 3PD and the plurality of bonding pads 2PD, heat treatment (reflow process) is performed in a state in which the solder bumps are in contact with each other, and accordingly, the solder bumps are integrated, thereby forming the protruding electrode 3BP. In addition, a pillar bump (columnar electrode) in which a solder film is formed on a tip surface of a conductor post made of copper (Cu) or nickel (Ni) may be used as the protruding electrode 3BP as a modification example with respect to the present embodiment.

In addition, the semiconductor chip CHP2 has circuits into and from which a plurality of signals having different transmission speed is input and output in the present embodiment. Although not illustrated, the semiconductor chip CHP2 has a first circuit into and from which a first signal is input and output at the first transmission speed and a second circuit into and from which a second signal is input and output at the second transmission speed faster than the first transmission speed. The differential signal is transmitted as the second signal at a transmission speed of about, for example, 3 Gbps (Gigabit per second) to 50 Gbps. Hereinafter, a transmission path through which the second signal is transmitted will be described as a high-speed transmission path in the present embodiment. In addition, a transmission path through which the first signal is transmitted at the first transmission speed slower than the second transmission speed will be described as a low-speed transmission path. In addition, note that a first drive voltage that drives the first circuit is supplied to the first circuit in addition to the above-described first signal. In addition, a second drive voltage that drives the second circuit is supplied to the second circuit in addition to the above-described second signal.

In addition, an underfill resin (insulating resin) UF is arranged between the semiconductor chip CHP2 and the wiring substrate ITP as illustrated in FIG. 6. The underfill resin UF is arranged to block a space between the front surface 3t of the semiconductor chip CHP2 and the upper surface 2t of the wiring substrate ITP. In addition, the underfill resin UF is made of an insulating (non-conductive) material (for example, a resin material) and is arranged to seal electrically-connected portions (bonding portions of the plurality of protruding electrodes 3BP) between the semiconductor chip CHP2 and the wiring substrate ITP. When the bonding portions between the plurality of protruding electrodes 3BP and the plurality of bonding pads 2PD are covered by the underfill resin UF in this manner, it is possible to mitigate stress generating at the electrically-connected portions between the semiconductor chip CHP2 and the wiring substrate ITP. In addition, it is also possible to mitigate stress generating at the bonding portions between the plurality of pads 3PD of the semiconductor chip CHP2 and the plurality of protruding electrodes 3BP. Further, it is also possible to protect the main surface on which the semiconductor element (circuit element) of the semiconductor chip CHP2 is formed.

In addition, the semiconductor device PKG2 has the plurality of capacitors CDC and CPS which are mounted on the wiring substrate ITP as illustrated in FIG. 5. Each of the plurality of capacitors CDC is inserted in the high-speed transmission path SGP2 in series connection as described above. The insertion of the capacitor CDC in the high-speed transmission path SGP2 in series connection can be expressed as follows.

That is, the plurality of pads 3PD provided in the semiconductor chip CHP2 illustrated in FIG. 6 includes the electrode (electrode pad) RxL (see FIG. 2) for the low-speed signal transmitted at the first transmission speed which is relatively slow. In addition, the plurality of pads 3PD provided in the semiconductor chip CHP2 illustrated in FIG. 6 includes the electrodes (electrode pads) Rxp and Rxn (see FIG. 2) for the high-speed signal transmitted at the second transmission speed which is faster than the first transmission speed. In addition, the plurality of lands 2LD provided in the wiring substrate ITP illustrated in FIG. 6 includes a land LDL (see FIG. 2) for the low-speed signal transmitted at the first transmission speed which is relatively slow. In addition, the plurality of lands 2LD provided in the wiring substrate ITP illustrated in FIG. 6 includes a land LDH (see FIG. 2) for the high-speed signal transmitted at the second transmission speed which is faster than the first transmission speed.

In addition, each of the electrodes Rxp and Rxn is electrically connected with the land LDH via the capacitor CDC as illustrated in FIG. 2. Specifically, one electrode of the capacitor CDC is connected with the electrode Rxp or the electrode Rxp of the semiconductor chip CHP2 in the high-speed transmission path SGP2, and the other electrode of the capacitor CDC is connected with the land LDH in the high-speed transmission path SGP2.

In contrast, the electrode RxL and the land LDL constituting the low-speed transmission path SGP1 are electrically connected with each other without any capacitor interposed therebetween.

In addition, each of the plurality of capacitors CPS is inserted in the power supply circuit to connect the first potential and the second potential of the power supply circuit in parallel connection. The insertion of the capacitor CPS into the power supply circuit in parallel connection can be expressed as follows.

That is, the plurality of pads 3PD provided in the semiconductor chip CHP2 illustrated in FIG. 6 includes an electrode (electrode pad) Vs (see FIG. 2) to which the reference potential VSS (see FIG. 2) is supplied and an electrode (electrode pad) Vd (see FIG. 2) to which the power supply potential VDD (see FIG. 2) is supplied. In addition, the plurality of lands 2LD provided in the wiring substrate ITP illustrated in FIG. 6 includes a land LVs (see FIG. 2) to which the reference potential VSS is supplied and a land LVd (see FIG. 2) to which the power supply potential VDD is supplied. In addition, one electrode of the capacitor CPS is connected with the reference potential supplying path VSP side that connects the electrode Vs and the land LVs, and the other electrode of the capacitor CPS is connected with the power supply potential supplying path VDP side that connects the electrode Vd and the land LVd as illustrated in FIG. 2.

Details of the electrical connection structure between the capacitors CDC and CPS and the wiring substrate ITP other than the above description will be described later.

In addition, the plurality of capacitors CDC and CPS includes the capacitor CDC serving as the DC cut capacitor and the capacitor CPS for the power supply circuit which is used as the bypass capacitor, the decoupling capacitor, or the battery, as described above. Some of the plurality of capacitors CDC and CPS are illustrated with reference characters in FIG. 5, and all capacitors arranged inside a support frame SFR are the capacitors CPS, and the capacitors CDC are arranged outside the support frame SFR, when seen in a plan view.

In addition, when the DC cut capacitor CDC is arranged outside the support frame SFR, the capacitor CDC is exposed without being covered by the heat dissipation plate HS as illustrated in FIG. 6. Accordingly, when an electrical test is performed after assembling the semiconductor device PKG2, it is possible to perform the test by causing a DC inspection current to flow. Details of the electrical test will be described in detail at the time of describing a method of manufacturing the semiconductor device.

In addition, the heat dissipation plate (a heat spreader or a heat dissipation member) HS is attached to the rear surface 3b of the semiconductor chip CHP2 in the example illustrated in FIG. 6. The heat dissipation plate HS is, for example, a metal plate having a higher thermal conductivity than the wiring substrate ITP and has a function of discharging heat generated in the semiconductor chip CHP2 to the outside. In addition, the heat dissipation plate HS is attached to the rear surface 3b of the semiconductor chip CHP2 via an adhesive member (heat dissipation resin) BDhs. The adhesive member BDhs contains, for example, a large number of metal particles or filler (for example, alumina or the like) and accordingly, has a higher thermal conductivity than the underfill resin UF.

In addition, the support frame (stiffener ring) SFR which supports the heat dissipation plate HS is fixed around the semiconductor chip CHP2 in the example illustrated in FIGS. 3 and 6. The heat dissipation plate HS is adhesively fixed to the rear surface 3b of the semiconductor chip CHP2 and the support frame SFR. It is possible to suppress warp deformation of the wiring substrate ITP by fixing the metallic support frame SFR around the semiconductor chip CHP2, which is preferable from a viewpoint of improving mounting reliability. In addition, it is possible to increase the plane area of the heat dissipation plate HS by adhesively fixing the heat dissipation plate HS to the support frame SFR which is provided to surround the semiconductor chip CHP2. That is, it is preferable to adhesively fix the heat dissipation plate HS to the support frame SFR in terms of the fact that it is possible to improve heat dissipation performance and to stably fix the heat dissipation plate HS on the semiconductor chip CHP2 by widely securing the surface area of the heat dissipation plate HS.

Note that, although the description has been given by exemplifying the embodiment in which the heat dissipation plate HS is attached to the rear surface 3b of the semiconductor chip CHP2 in the present embodiment, an embodiment in which the rear surface 3b of the semiconductor chip CHP is exposed without attaching the heat dissipation plate HS may be configured as a modification example.

Connection Structure between Wiring Substrate and DC Cut Capacitor

Figure 7:
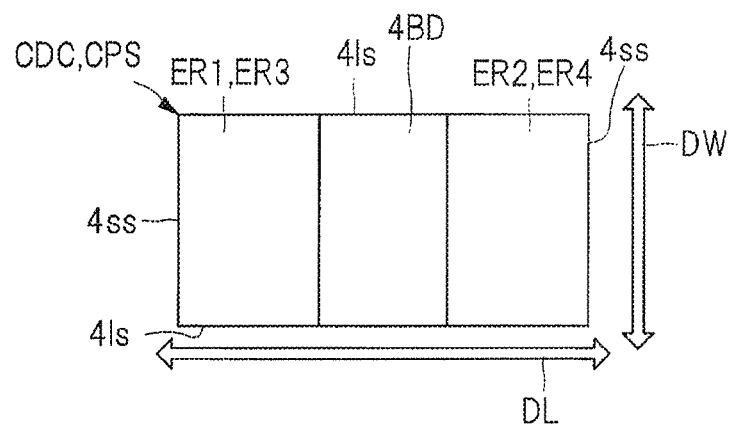
FIG. 7 is a plan view illustrating one of a plurality of capacitors illustrated in FIG. 5.
Figure 8:
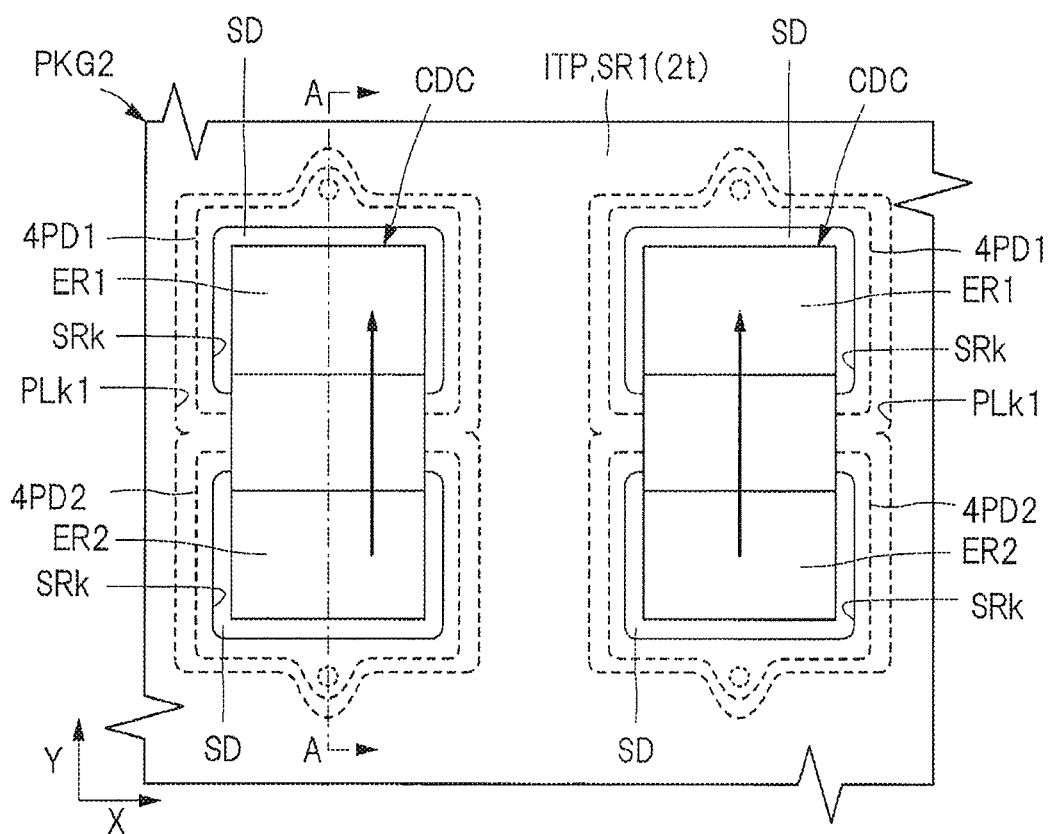
FIG. 8 is an enlarged plan view of a section A of FIG. 5.
Figure 9:
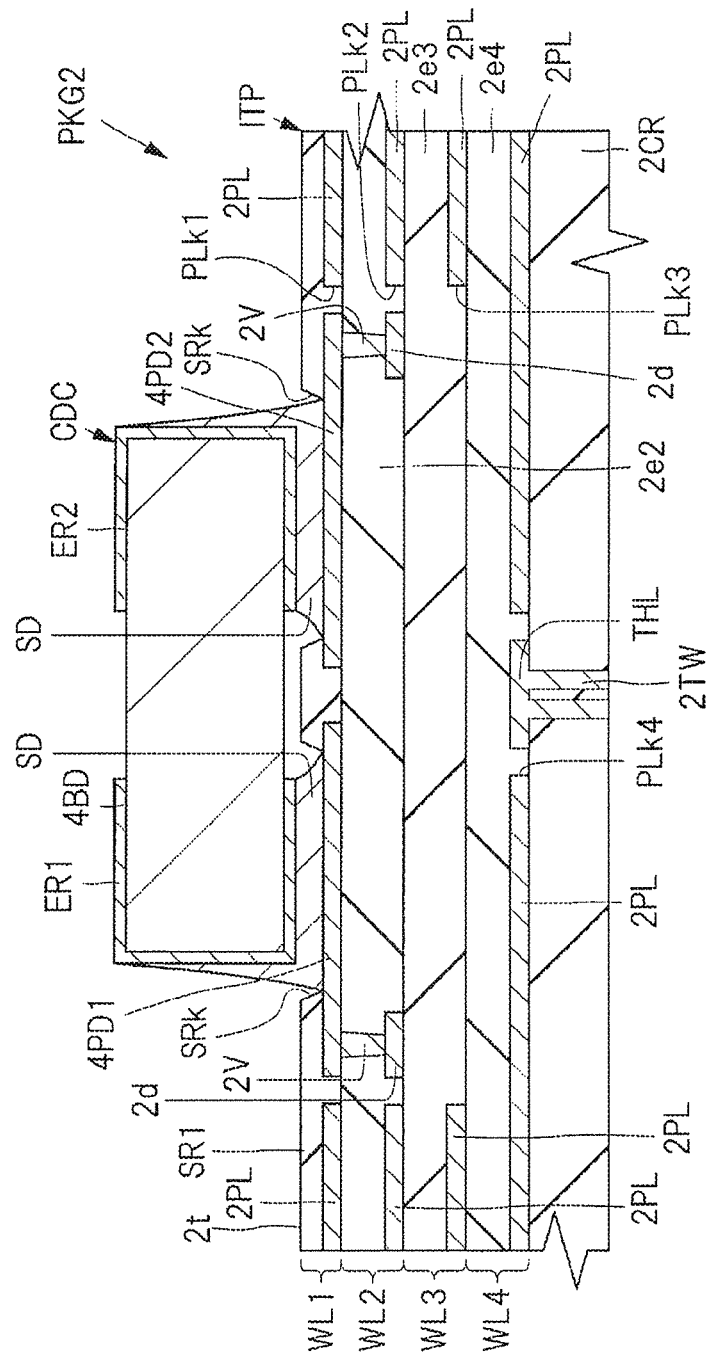
FIG. 9 is an enlarged cross-sectional view taken along a line A-A of FIG. 8.
Figure 10:
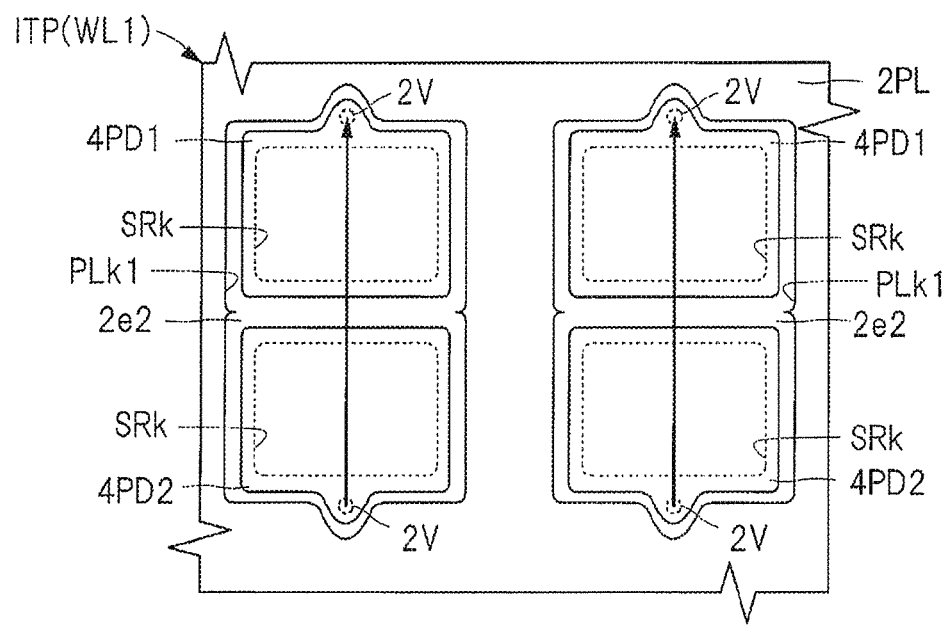
FIG. 10 is an enlarged plan view illustrating a structure of a first wiring layer arranged on an uppermost layer of the wiring substrate illustrated in FIG. 9.
Figure 11:
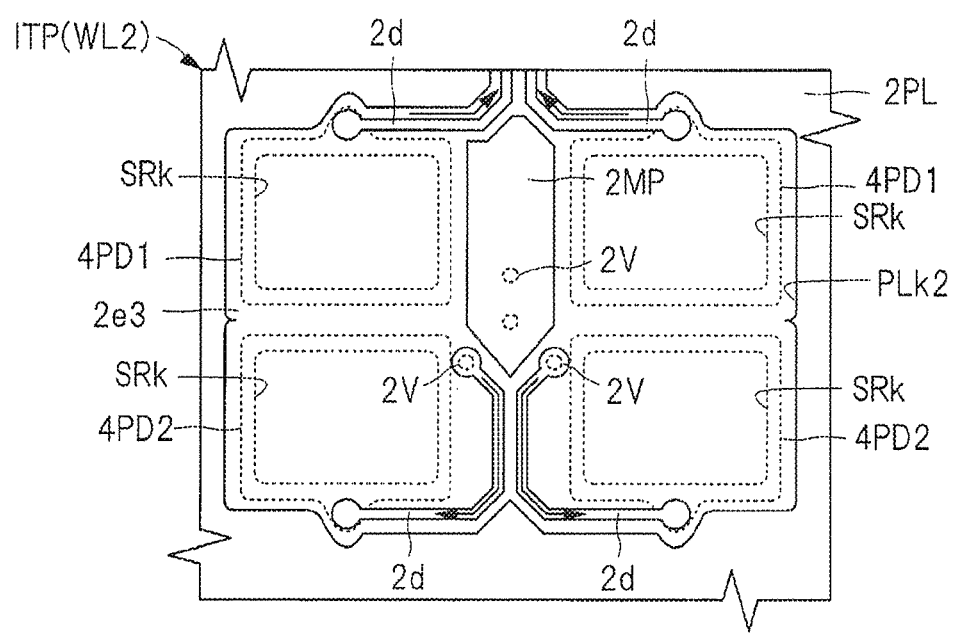
FIG. 11 is an enlarged plan view illustrating a second wiring layer on an inner side by one layer from the wiring layer illustrated in FIG. 10.
Figure 12:
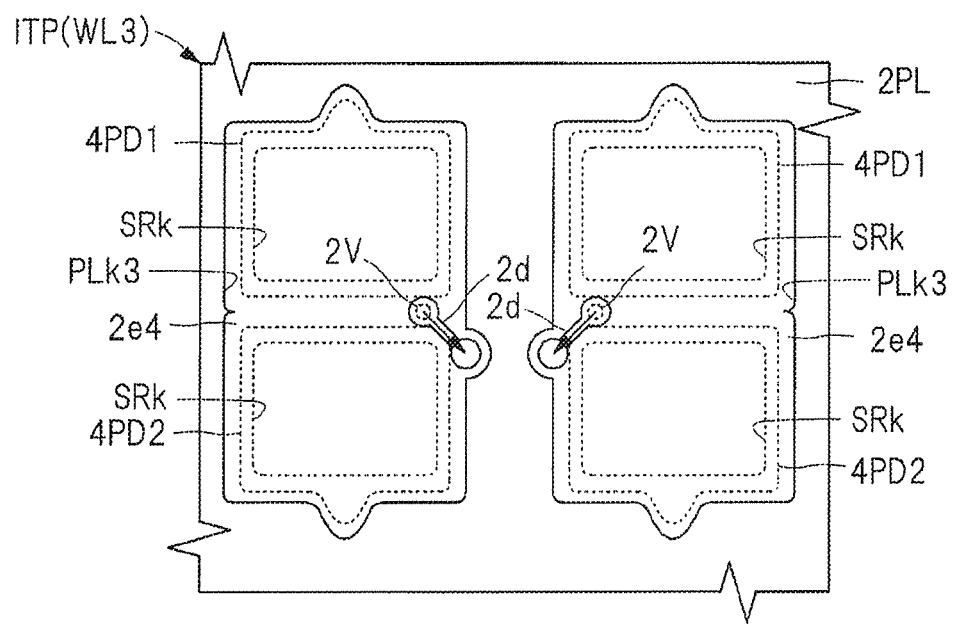
FIG. 12 is an enlarged plan view illustrating a third wiring layer on an inner side by one layer from the wiring layer illustrated in FIG. 11.
Figure 13:
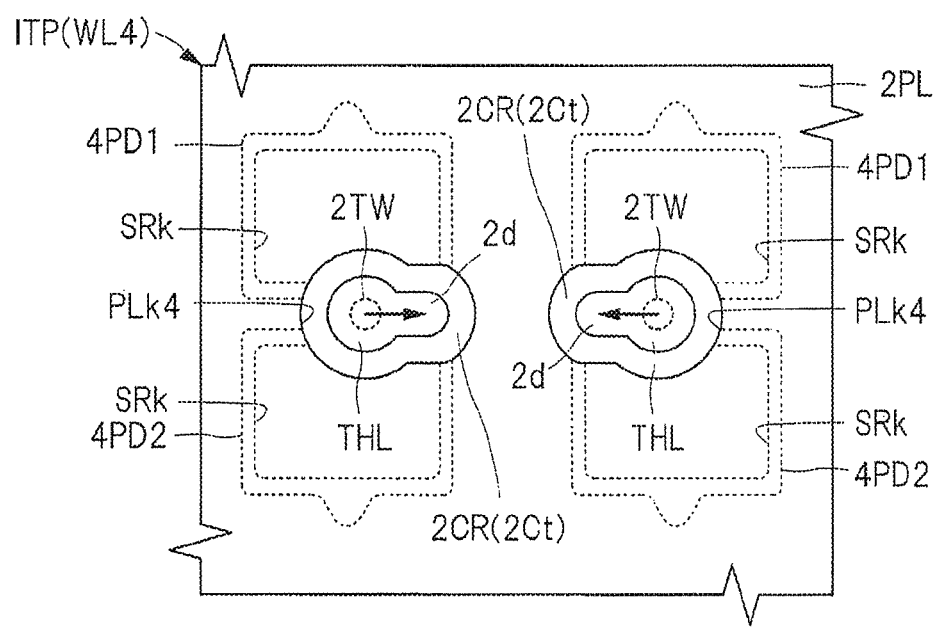
FIG. 13 is an enlarged plan view illustrating a fourth wiring layer on an inner side by one layer from the wiring layer illustrated in FIG. 12.

Next, a description will be given regarding details of the connection structure between the wiring substrate ITP and the capacitors CDC and CPS illustrated in FIGS. 5 and 6. FIG. 7 is a plan view illustrating one of the plurality of capacitors illustrated in FIG. 5. In addition, FIG. 8 is an enlarged plan view of a section A of FIG. 5. In addition, FIG. 9 is an enlarged cross-sectional view taken along a line A-A of FIG. 8. In addition, FIG. 10 is an enlarged plan view illustrating a structure of a first wiring layer arranged on an uppermost layer of the wiring substrate illustrated in FIG. 9. In addition, FIG. 11 is an enlarged plan view illustrating a second wiring layer on an inner side by one layer from the wiring layer illustrated in FIG. 10. In addition, FIG. 12 is an enlarged plan view illustrating a third wiring layer on an inner side by one layer from the wiring layer illustrated in FIG. 11. In addition, FIG. 13 is an enlarged plan view illustrating a fourth wiring layer on an inner side by one layer from the wiring layer illustrated in FIG. 12.

Note that the DC cut capacitor CDC and the capacitor CPS for the power supply circuit illustrated in FIG. 5 have the same structure in the present embodiment. Accordingly, FIG. 7 illustrates one capacitor as an example of the capacitor CDC and the capacitor CPS. In addition, FIG. 7 schematically illustrates an extending direction DL and a width direction DW of the capacitors CDC and CPS with arrows.

In addition, FIG. 8 is an enlarged plan view of a mounting surface of the capacitor CDC, and most part thereof is covered by the insulating layer SR1, and contours of terminals 4PD1 and 4PD2 which are formed in the first wiring layer WL1 (see FIG. 9), and a contour of an opening portion PLk1 formed in a conductor plane 2PL (see FIG. 9) are illustrated with dotted lines. In addition, a contour of an opening portion (terminal exposing opening portion) SRk is illustrated with a solid line.

In addition, the plurality of wiring layers on the lower surface 2Cb side of the insulating layer 2CR as illustrated in FIG. 6 is present below the fourth wiring layer WL4 illustrated in FIG. 9, although not illustrated in the enlarged view.

In addition, each drawing of FIGS. 10 to 13 illustrates members formed in the illustrated wiring layer using solid lines, and members formed on an upper layer or a lower layer of the illustrated wiring layer using dotted lines. In addition, FIGS. 8 and 10 to 13 schematically illustrate a direction in which a signal current flows (in other words, a transmission direction of a signal) with an arrow. In addition, a via and a through-hole wire for a power supply transmission path to supply reference potential or the like are present other than the via 2V and the through-hole wire 2TW which constitute a part of the high-speed transmission path, in each enlarged plan view of FIGS. 10 to 13, although not illustrated for viewability.

As illustrated in FIG. 7, each of the capacitors (chip capacitors) CDC and CPS forms a quadrangle when seen in a plan view. In addition, each of the capacitors CDC and CPS has two long sides (long side surfaces) 41s extending along the extending direction (longitudinal direction) DL and two short sides (short side surfaces) 4ss extending along the width direction DW perpendicular to the extending direction DL. In addition, each of the capacitors CDC and CPS includes electrodes ER1 and ER3 and electrodes ER2 and ER4 arranged at end portions, respectively, facing each other in the extending direction DL (in other words, the extending direction of the long side 41s). In addition, each of the capacitors CDC and CPS includes a main body portion 4BD which is interposed between the electrodes ER1 and ER3 and the electrodes ER2 and ER4, and the main body portion 4BD is formed of, for example, a plurality of conductor plates being stacked with an insulating layer (dielectric layer) interposed therebetween. The electrodes ER1 and ER3 and the electrodes ER2 and ER4 serve as external electrode terminals configured to take out capacitance formed between the plurality of the conductor plates which is arranged to face each other. Note that, although the description has been given regarding an example of the structure of the capacitors CDC and CPS, there are various modification examples of the structure of the capacitors CDC and CPS.

In addition, each of the plurality of capacitors CDC among the plurality of capacitors CDC and CPS illustrated in FIG. 5 is mounted on the upper surface 2t of the wiring substrate ITP as illustrated in FIG. 8. In the present embodiment, the high-speed transmission path SGP2 is constituted by the pair of differential signal transmission paths DSp and DSn in which the differential signals are transmitted as illustrated in FIG. 2 described above. Thus, the capacitors CDC which are inserted in the respective differential signal transmission paths DSp and DSn in series connection are arranged to be adjacent to each other as illustrated in FIG. 8. In other words, a pair of capacitors CDC constituting the differential pair is mounted on the wiring substrate ITP to be adjacent to each other.

In the example illustrated in FIG. 8, the electrode ER1 of one of the capacitors CDC is arranged to be adjacent to the electrode ER1 of the other capacitor CDC which forms a pair with the above-described one, and the electrode ER2 of one of the capacitors CDC is arranged to be adjacent to the electrode ER2 of the other capacitor CDC which forms a pair with the above-described one.

In this manner, the pair of capacitors CDC forming the differential pair is mounted to be adjacent to each other, so that it becomes easier to match each impedance of the differential signal transmission paths DSp and DSn (see FIG. 2). In addition, it becomes far easier to match each impedance of the differential signal transmission paths DSp and DSn by matching each flow direction of signal current of the pair of capacitors CDC constituting the differential pair as illustrated in FIG. 8 in addition to mounting the pair of capacitors CDC to be adjacent to each other as described above.

In addition, the first wiring layer WL1 having the mounting surface of the capacitor CDC (see FIG. 9) among the plurality of wiring layers provided in the wiring substrate ITP includes the terminal (a terminal pad or a conductor pattern) 4PD1 which is the conductor pattern to be electrically connected with the electrode ER1 of the capacitor CDC as illustrated in FIGS. 9 and 10. In addition, the wiring layer WL1 includes the terminal (the terminal pad or the conductor pattern) 4PD2 which is the conductor pattern to be electrically connected with the electrode ER2 of the capacitor CDC.

The terminal 4PD1 and the terminal 4PD2 provided in the wiring layer WL1 are exposed from the insulating layer SR1 in the opening portion SRk which is formed in the insulating layer (solder resist film) SR1 (see FIG. 9) that covers the wiring layer WL1. The electrode ER1 of the capacitor CDC is arranged to face a portion of the terminal 4PD1 exposed from the insulating layer SR1 and is electrically connected with the terminal 4PD1 via a conductive bonding member such as a solder member. In addition, the electrode ER2 of the capacitor CDC is arranged to face a portion of the terminal 4PD2 exposed from the insulating layer SR1 and is electrically connected with the terminal 4PD1 via a conductive bonding member SD such as a solder member.

As illustrated in FIG. 8, the terminal 4PD1 and the terminal 4PD2 are arranged at positions facing each other along the extending direction DL (see FIG. 7) of the capacitor CDC. In addition, the capacitor CDC is connected in series to each of the differential signal transmission paths DSp and DSn (see FIG. 2) in the present embodiment as described above. Thus, the terminal 4PD1 constituting one of the differential pair and the terminal 4PD1 constituting the other of the differential pair are arranged to be adjacent to each other as illustrated in FIG. 10. In addition, the terminal 4PD2 constituting one of the differential pair and the terminal 4PD2 constituting the other of the differential pair are arranged to be adjacent to each other.

In addition, the conductor plane (solid pattern) 2PL which is the conductor pattern formed to surround each periphery of the terminal 4PD1 and the terminal 4PD2 is formed in the wiring layer WL1. The conductor plane 2PL is the conductor pattern which is formed in a region in which a conductor pattern such as a signal transmission wire and a terminal is not formed and constitutes a part of a supplying path of the reference potential (first potential) or the power supply potential (second potential). The conductor plane 2PL is formed in each of the plurality of wiring layers provided in the wiring substrate ITP. In this manner, when the conductor plane 2PL is formed in each of the wiring layers, it is possible to suppress spread of an electric field and a magnetic field which spread from the signal transmission path to the periphery thereof during transmission of a signal, thereby suppressing crosstalk noise from another signal. Accordingly, it is possible to improve noise tolerance of the signal transmission path. In particular, it is preferable to improve the noise tolerance by forming the conductor plane in the case of including the high-speed transmission path through which a signal is transmitted at the transmission speed of 3 Gbps or higher as in the present embodiment.

In the case of forming the conductor plane 2PL in order to improve the noise tolerance, it is preferable to actively form the conductor plane 2PL in the region in which the conductor pattern such as the signal transmission wire and the terminal is not formed. Accordingly, the opening portion PLk1 is formed in the conductor plane 2PL in the wiring layer WL1, and the terminal 4PD1 and the terminal 4PD2 are formed inside the opening portion PLk1 as illustrated in FIG. 10. In addition, inside the opening portion PLk1, an insulating layer 2e2 which covers the wiring layer WL2 (see FIG. 9) on the inner side by one layer is exposed in a portion in which the terminal 4PD1 and the terminal 4PD2 are not formed.

In addition, the via 2V serving as the interlayer conducting path is connected with each of the terminal 4PD1 and the terminal 4PD2. Each of the terminal 4PD1 and the terminal 4PD2 is electrically connected with the second wiring layer WL2 which is positioned on the inner side of the wiring substrate ITP by one layer from the wiring layer WL1, via the via 2V.

Next, the second wiring layer WL2 which is positioned on the inner side of the wiring substrate ITP by one layer from the wiring layer WL1 includes the plurality of wires 2d to be electrically connected with the terminal 4PD1 or the terminal 4PD2 (see FIG. 9), described above, as illustrated in FIGS. 9 and 11. The plurality of wires 2d constitutes a part of the high-speed transmission path SGP2 that has been described with reference to FIG. 2.

In addition, the wiring layer WL2 includes the conductor plane 2PL which is formed to surround a periphery of a region in which the plurality of wires 2d is formed. The conductor plane 2PL provided in the wiring layer WL2 is the conductor pattern that suppresses the spread of the electric field and the magnetic field which spread from the signal transmission path to the periphery thereof during the transmission of the signal, as described above, and thus, is formed in a wide range. Accordingly, the area of the conductor plane 2PL provided in the wiring layer WL2 is larger than a sum of each area of the terminal 4PD1 and the terminal 4PD2 as illustrated in FIG. 11.

In addition, the plurality of wires 2d and the conductor plane 2PL, provided in the wiring layer WL2, are covered by the insulating layer 2e2 (see FIG. 9) that covers the wiring layer WL2.

In addition, the conductor plane 2PL provided in the wiring layer WL2 includes an opening portion PLk2 which is formed in a region overlapping with each of the terminal 4PD1 and the terminal 4PD2. In the example illustrated in FIG. 11, the area of the opening portion PLk2 is larger than the area of the opening portion PLk1 which is formed in the conductor plane 2PL of the wiring layer WL1 illustrated in FIG. 10. In addition, the opening portion PLk2 is formed at a position overlapping with all of the two terminals 4PD1 and the two terminals 4PD2 in the example illustrated in FIG. 11. In other words, of the conductor plane 2PL formed in the wiring layer WL2, the region which overlaps with the terminal 4PD1 and the terminal 4PD2 is entirely opened. In addition, when seen in a plan view, an upper surface of an insulating layer 2e3 which covers the third wiring layer WL3 illustrated in FIG. 9 is exposed in the opening portion PLk2 except for a portion in which the plurality of wires 2d and the conductor pattern 2MP are formed as illustrated in FIG. 11. Hereinafter, a reason for forming the opening portion PLk2 will be described.

As described above, the conductor plane 2PL is the solid pattern that covers the region in which the wiring pattern and the like are not formed in each of the wiring layers, and it is possible to suppress the spread of the electric field and the magnetic field which spread from the signal transmission path to the periphery thereof during the transmission of the signal by arranging the conductor plane 2PL to surround the periphery of the signal transmission path (periphery in a plane direction and a thickness direction).

Meanwhile, according to studies of the inventors of the present application, it has been found out that capacitive coupling occurs between the conductor plane 2PL and the terminals 4PD1 and 4PD2 when the conductor plane 2PL is arranged in the wiring layer WL2 on the inner side by one layer of the terminal 4PD1 and the terminal 4PD2 and the opening portion PLk2 is not formed in the region overlapping with the terminal 4PD1 and the terminal 4PD2, and parasitic capacitance is added in the course of the transmission path.

It is difficult to set the terminal 4PD1 and the terminal 4PD2 among the conductor patterns forming the high-speed transmission path to have a wiring width (minimum width dimension) such as a leading wire (for example, the wire 2d illustrated in FIG. 11) since it is necessary to improve the connection reliability by increasing the bonding area with the electrode ER1 and the electrode ER2 of the capacitor CDC as illustrated in FIG. 9. Note that the "minimum width dimension" of each of the terminal 4PD1 and the terminal 4PD2 mentioned herein indicates a shortest length in an X-direction or a Y-direction illustrated in FIG. 8, for example. It is difficult to make the terminal 4PD1 and the terminal 4PD2 small in length, even in any one of the lengths in the X-direction and in the Y-direction illustrated in FIG. 8, in order to increase the bonding area with the electrode ER1 and the electrode ER2 of the capacitor CDC.

Thus, when the capacitive coupling occurs between the conductor plane 2PL and the terminals 4PD1 and 4PD2, a value of the parasitic capacitance increases in proportion mainly to the area of a portion overlapping in the thickness direction. Further, when the parasitic capacitance is added to the terminal 4PD1 and the terminal 4PD2 forming the high-speed transmission path, the impedance in the high-speed transmission path apparently decreases. That is, a low impedance portion is added in a part of the high-speed transmission path, thereby causing impedance discontinuity. It is possible to suppress deterioration in characteristics such as reflection of a signal by designing wiring layout such that an impedance component of the transmission path approximates to a predetermined value (for example, 50 ohms in a single wire and 100 ohms in a differential wire) in a signal transmission path of a high frequency signal. Accordingly, it is preferable to reduce the value of the parasitic capacitance occurring between the terminal 4PD1 or the terminal 4PD2 and the conductor plane 2PL as much as possible to obtain impedance matching from a viewpoint of improving the quality of signal transmission.

Thus, the inventors of the present application have found out a method of suppressing the generation of the impedance discontinuity in the terminals 4PD1 and 4PD2 configured to mount the capacitor CDC in the case of mounting the capacitor CDC on the semiconductor device. That is, the conductor plane 2PL provided in the wiring layer WL2 which is the wiring layer on the inner side by one layer from the wiring layer WL1 includes the opening portion PLk2 which is formed in the region overlapping with each of the terminal 4PD1 and the terminal 4PD2 as illustrated in FIGS. 9 and 11.

A relation between the terminals 4PD1 and 4PD2 and the conductor plane 2PL illustrated in FIGS. 9 and 11 can be expressed as follows. That is, the conductor plane 2PL provided in the wiring layer WL2 is opened in the respective regions overlapping with the terminal 4PD1 and the terminal 4PD2.

In addition, the insulating layer 2e3 which covers the wiring layer WL3 (see FIG. 9) on the further inner side by one layer from the wiring layer WL2 is exposed in a region inside the opening portion PLk2 in which the wire 2d and the conductor pattern 2MP are not formed.

In addition, the value of the parasitic capacitance occurring due to the capacitive coupling increases in proportion to the area of the overlapping portion between the conductor plane 2PL and the terminal 4PD1 or the terminal 4PD2 in the thickness direction as described above. Accordingly, it is particularly preferable that the terminal 4PD1 and the terminal 4PD2 not entirely overlap with the conductor plane 2PL in the thickness direction as illustrated in FIG. 11. In other words, it is preferable that each of the contour of the terminal 4PD1 and the contour of the terminal 4PD2 be positioned inside an opening end portion (peripheral edge portion of the opened region) of the opening portion PLk2, when seen in a plan view, as illustrated in FIG. 11.

However, it is possible to reduce the value of the parasitic capacitance even when a part of the terminal 4PD1 and the terminal 4PD2 overlaps with the conductor plane 2PL in the thickness direction. For example, it is possible to reduce the value of the parasitic capacitance unless 90% or more of the plane area of the terminal 4PD1 and the terminal 4PD2 overlaps with the conductor plane 2PL. A description will be given later regarding a modification example of a case in which a part of the terminal 4PD1 and the terminal 4PD2 overlaps with a part of the conductor plane 2PL formed in the wiring layer WL2 in the thickness direction.

In addition, it is preferable that a shape of the opening portion PLk2 illustrated in FIG. 11 correspond to each shape and each position of the terminal 4PD1 and the terminal 4PD2 in the wiring layer WL1 (see FIG. 10). When the opening portion PLk2 is formed to include the entire region overlapping with the terminal 4PD1 and the terminal 4PD2 as illustrated in FIG. 11, the value of the parasitic capacitance does not greatly decrease even if the area of the opening portion PLk2 increases more.

Meanwhile, there is a case in which the conductor plane 2PL is utilized as a reference path (return path) of the high-speed transmission path. In this case, it is preferable to keep a spaced distance between the reference path and the high-speed transmission path constant. Accordingly, it is preferable that the area of the opening portion PLk2 not be extremely large. For example, it is preferable to set the contour of the opening end portion of the opening portion PLk2 along each contour of the terminal 4PD1 and the terminal 4PD2 in the wiring layer WL1 (see FIG. 10) as illustrated in FIG. 11.

From the above-described viewpoint, it is possible to reduce the area of the opening portion PLk2 and to reduce the parasitic capacitance when the opening end portions of the opening portions PLk2 are formed, respectively, outside the contour of the terminal 4PD1 and outside the contour of the terminal 4PD2 when seen in a plan view unless the layout of the wire 2d is considered.

However, there is a case in which it is difficult to form the opening portion PLk2 for each of the terminals 4PD1 and 4PD2 depending on the spaced distance between the terminal 4PD1 and the terminal 4PD2 as illustrated in FIG. 11. In this case, the opening portion PLk2 may be formed by linking an opening portion in a region overlapping with the terminal 4PD1 and an opening portion in a region overlapping with the terminal 4PD2 so as to collectively open the regions overlapping with the terminal 4PD1 and the terminal 4PD2 as illustrated in FIG. 11.

In addition, it is necessary to cause the wire 2d formed in the wiring layer WL2 to be spaced apart from the conductor plane 2PL. Accordingly, when the wire 2d is arranged near the opening portion PLk2 as illustrated in FIG. 11, there is a case in which it is difficult to arrange the conductor plane 2PL between the opening portion PLk2 and the wire 2d. In this case, the opening portion PLk2 that collectively opens the regions overlapping with the plurality of terminals 4PD1 and the plurality of terminals 4PD2 may be formed as illustrated in FIG. 11. In this case, the impedance of the wiring portion tends to slightly increase in a portion in which the conductor plane 2PL is not present but is partially canceled by residual capacitance of the terminals 4PD1 and 4PD2, and thus, the impedance discontinuity is reduced in some cases.

In addition, the conductor pattern 2MP illustrated in FIG. 11 is separated from the conductor plane 2PL in the wiring layer WL2. However, the conductor pattern 2MP is electrically connected with the conductor plane 2PL provided in the wiring layer WL1 illustrated in FIG. 10 and the conductor plane 2PL provided in the wiring layer WL3 illustrated in FIG. 13 via the via 2V to be connected with the conductor pattern 2MP. Accordingly, the same potential (for example, the reference potential) as that supplied to the conductor plane 2PL illustrated in FIG. 11 is supplied to the conductor pattern 2MP. In this case, it becomes necessary to consider the parasitic capacitance between the conductor pattern 2MP and the terminal 4PD1 or the parasitic capacitance between the conductor pattern 2MP and the terminal 4PD2 when the area of the conductor pattern 2MP increases. Accordingly, it is preferable to arrange the conductor pattern 2MP not to overlap with the terminal 4PD1 and the terminal 4PD2, when seen in a plan view, as illustrated in FIG. 11.

As described above, the terminal 4PD1 and the terminal 4PD2 which constitute a part of the high-speed transmission path are formed in the wiring layer WL1 according to the present embodiment. Further, the conductor plane 2PL which is formed in the wiring layer WL2 on the inner side by one layer from the wiring layer WL1 is opened in the respective regions overlapping with the terminal 4PD1 and the terminal 4PD2. Accordingly, it is possible to suppress the decrease in impedance due to the capacitive coupling between the conductor plane 2PL, and the terminal 4PD1 and the terminal 4PD2, and to improve the noise tolerance of the high-speed transmission path. Further, the semiconductor device PKG2 of the present embodiment can improve the noise tolerance of the high-speed transmission path, and thus, it is possible to improve the reliability.

Next, the third wiring layer WL3 illustrated in FIGS. 9 and 12 will be described. The third wiring layer WL3 which is positioned on the inner side by one layer from the wiring layer WL2 (see FIG. 9) in the wiring substrate ITP includes the plurality of wires 2d (see FIG. 12) to be electrically connected with the terminal 4PD1 (see FIG. 9) or the terminal 4PD2 (see FIG. 9) formed in the wiring layer WL1 (see FIG. 9). The plurality of wires 2d is wires which constitute a part of the high-speed transmission path SGP2 that has been described with reference to FIG. 2.

In addition, the wiring layer WL3 includes the conductor plane 2PL which is formed to surround a periphery of a region in which the plurality of wires 2d is formed. The conductor plane 2PL provided in the wiring layer WL3 is the conductor pattern that suppresses the spread of the electric field and the magnetic field which spread from the signal transmission path to the periphery thereof during the transmission of the signal, as described above, and thus, is formed in a wide range. Accordingly, the area of the conductor plane 2PL provided in the wiring layer WL3 is larger than the sum of each area of the terminal 4PD1 and the terminal 4PD2 as illustrated in FIG. 12.

In addition, the conductor plane 2PL provided in the wiring layer WL3 includes an opening portion PLk3 which is formed in a region overlapping with each of the terminal 4PD1 and the terminal 4PD2. In the example illustrated in FIG. 12, the area of the opening portion PLk2 is substantially the same level as the area of the opening portion PLk1 which is formed in the conductor plane 2PL of the wiring layer WL1 illustrated in FIG. 10.

In addition, the entire region overlapping with the terminal 4PD1 and the terminal 4PD2 is opened in the conductor plane 2PL formed in the wiring layer WL3 in the example illustrated in FIG. 12. In addition, the opening portion PLk3 is formed for each of the regions overlapping with a pair of the terminal 4PD1 and the terminal 4PD2 in the example illustrated in FIG. 12. Accordingly, the two opening portions PLk3 are formed in a range illustrated in FIG. 12. In addition, an upper surface of an insulating layer 2e4 which covers the fourth wiring layer WL4 illustrated in FIG. 9 is exposed in the opening portion PLk3 except for the portion in which the plurality of wires 2d is formed, when seen in a plan view, as illustrated in FIG. 12.

When the parasitic capacitance added to the terminal 4PD1 and the terminal 4PD2 is considered, there is the capacitive coupling with the conductor plane 2PL provided in the wiring layer WL2 which is the closest to the wiring layer WL1. Accordingly, it is possible to significantly reduce the value of the parasitic capacitance by forming the above-described opening portion PLk2 in the conductor plane 2PL of the wiring layer WL2 as described above. Accordingly, it is possible to improve the noise tolerance of the high-speed transmission path by providing the opening portion PLk2 illustrated in FIG. 11 regardless of any wiring structure of the wiring layer WL3.

However, it is preferable to consider capacitive coupling with the conductor plane 2PL provided in the wiring layer WL3 which is the wiring layer on the inner side by one layer from the wiring layer WL2 in the case of further improving the noise tolerance of the high-speed transmission path in addition to the above configuration. In particular, each thickness of wiring layers tends to be thinner in order to cope with both of a decrease in thickness of a semiconductor package and an increase of the number of the wiring layers along with higher functionality of a semiconductor device. When the capacitive coupling occurs between the conductor plane 2PL and the terminals 4PD1 and 4PD2, a value of the parasitic capacitance increases in inverse proportion mainly to a spaced distance between portions overlapping in the thickness direction. Accordingly, the value of the parasitic capacitance is likely to increase when each thickness of the plurality of wiring layers decreases. Note that each thickness of the wiring layers WL2 and WL3, for example, is 30 to 50 μm in the present embodiment. Further, a thickness of a wiring layer (a layer including the conductor plane 2PL and the wire 2d in the wiring layer WL2, and a layer including the conductor plane 2PL in the wiring layer WL3) included in each of the wiring layers WL2 and WL3 is 10 to 20 μm, and a thickness of the insulating layer 2e between the conductor pattern 2PL included in the wiring layer WL2 and the conductor pattern 2PL included in the wiring layer WL3 is 20 to 30 μm.

Thus, the opening portion PLk3 is formed in the regions of the conductor plane 2PL formed in the wiring layer WL3 that overlap with the terminal 4PD1 and the terminal 4PD2 in the present embodiment. A relation between the terminals 4PD1 and 4PD2, and the conductor plane 2PL of the wiring layer WL3 illustrated in FIGS. 9 and 12 can be also expressed as follows. That is, the conductor plane 2PL provided in the wiring layer WL3 is opened in the respective regions overlapping with the terminal 4PD1 and the terminal 4PD2.

However, it is possible to reduce the value of the parasitic capacitance even when apart of the terminal 4PD1 and the terminal 4PD2 overlaps with the conductor plane 2PL in the thickness direction. For example, it is possible to reduce the value of the parasitic capacitance unless 90% or more of the plane area of the terminal 4PD1 and the terminal 4PD2 overlaps with the conductor plane 2PL.

In addition, it is preferable that the area of the opening portion PLk3 illustrated in FIG. 12 be equal to or smaller than the area of the opening portion PLk2 illustrated in FIG. 11. As described above, the relation between the conductor plane 2PL which is formed in the wiring layer WL2 illustrated in FIG. 11, and the terminal 4PD1 and the terminal 4PD2, has the greatest influence in the case of considering the parasitic capacitance added to the terminal 4PD1 and the terminal 4PD2. Accordingly, a fact that the area of the opening portion PLk3 illustrated in FIG. 12 is larger than the area of the opening portion PLk2 hardly contributes to the reduction of the value of the parasitic capacitance.

Meanwhile, the conductor plane 2PL is utilized as the reference path (return path) of the high-speed transmission path as described above. In this case, it is preferable to keep a spaced distance between the return path and the high-speed transmission path constant. Accordingly, it is preferable that the area of the opening portion PLk3 illustrated in FIG. 12 be equal to or smaller than the area of the opening portion PLk2 illustrated in FIG. 11.

However, it is necessary to cause the wire 2d and the conductor plane 2PL to be spaced apart from each other when the wire 2d is formed in a peripheral edge portion of the opening portion PLk3 as illustrated in FIG. 12. Accordingly, there is a case in which the area of the opening portion PLk3 is larger than the area of the opening portion PLk2 illustrated in FIG. 11 depending on the wiring layout.

Next, the fourth wiring layer WL4 illustrated in FIGS. 9 and 13 will be described. The fourth wiring layer WL4 which is positioned on the inner side by one layer from the wiring layer WL3 (see FIG. 9) in the wiring substrate ITP includes the plurality of wires 2d (see FIG. 13) to be electrically connected with the terminal 4PD1 (see FIG. 9) or the terminal 4PD2 (see FIG. 9) formed in the wiring layer WL1 (see FIG. 9). In the example illustrated in FIG. 13, the plurality of wires 2d is electrically connected with the terminal 4PD2. The plurality of wires 2d constitutes a part of the high-speed transmission path SGP2 that has been described with reference to FIG. 2.

In addition, the wiring layer WL4 is a wiring layer which is formed on the upper surface 2Ct of the insulating layer 2CR serving as the core member in the present embodiment, and thus, the wiring layer WL4 includes a through-hole land THL which is electrically connected with the through-hole wire 2TW penetrating the insulating layer 2CR. The through-hole land THL is electrically connected with the wire 2d in the wiring layer WL4. The through-hole wire 2TW and the through-hole land THL are wires which constitute a part of the high-speed transmission path SGP2 that has been described with reference to FIG. 2.

In addition, the wiring layer WL4 includes the conductor plane 2PL which is formed to surround a periphery of a region in which the wire 2d and the through-hole land THL are formed. The conductor plane 2PL provided in the wiring layer WL4 is the conductor pattern that suppresses the spread of the electric field and the magnetic field which spread from the signal transmission path to the periphery thereof during the transmission of the signal, as described above, and thus, is formed in a wide range. Accordingly, the area of the conductor plane 2PL provided in the wiring layer WL4 is larger than the sum of each area of the terminal 4PD1 and the terminal 4PD2 as illustrated in FIG. 13.

In addition, the conductor plane 2PL provided in the wiring layer WL4 includes a plurality of opening portions PLk4. The opening portion PLk4 has a shape along the contour of a conductor pattern obtained by linking the wire 2d and the through-hole land THL when seen in a plan view. In addition, each area of the opening portion PLk4 is smaller than the sum of each area of the terminal 4PD1 and the terminal 4PD2. The wiring layer WL2 and the wiring layer WL3 are present between the wiring layer WL1 in which the terminal 4PD1 and the terminal 4PD2 are formed and the wiring layer WL4. Thus, the area of the opening portion PLk4 is not set to be larger than each area of the terminal 4PD1 and the terminal 4PD2 but is set to a size necessary to cause the conductor pattern obtained by linking the wire 2d and the through-hole land THL, and the conductor plane 2PL to be spaced apart from each other in the example illustrated in FIG. 13. The wire 2d and the through-hole land THL illustrated in FIG. 13 constitute a part of the high-speed transmission path. Accordingly, it is easy to keep the spaced distance between the reference path and the high-speed transmission path constant by setting a spaced distance between the conductor pattern obtained by linking the wire 2*d* and the through-hole land THL, and the conductor plane 2PL to be small.

However, the area of the opening portion PLk4 may be set to be equal to or larger than the sum of each area of the terminal 4PD1 and the terminal 4PD2 as a modification example with respect to FIG. 13 when it is necessary to consider capacitive coupling between the wiring layer WL4 and the wiring layer WL1 as the decrease in thickness of each wiring layer progresses. In this case, for example, an opening portion which is the same as the opening portion PLk1 illustrated in FIG. 10 is preferably formed in the wiring layer WL4 illustrated in FIG. 13.

In addition, the through-hole THL constituting a part of the high-speed transmission path is formed at a position overlapping with at least one of the terminal 4PD1 and the terminal 4PD2 in the thickness direction, when seen in a plan view, as illustrated in FIG. 13. In the example illustrated in FIG. 13, the through-hole land THL overlaps with both of the terminal 4PD1 and the terminal 4PD2. The example illustrated in FIG. 13 can be expressed from a different viewpoint as follows. That is, the through-hole land THL is arranged to straddle a region between the terminal 4PD1 and the terminal 4PD2 when seen in a plan view.

A formation position of the through-hole land THL is not limited to the position overlapping with at least one of the terminal 4PD1 and the terminal 4PD2 in the thickness direction from a viewpoint of electrically connecting the through-hole land THL illustrated in FIG. 13 and the terminal 4PD1 illustrated in FIG. 10. Accordingly, a modification example may be applicable in which the through-hole land THL is formed at a position overlapping with none of the terminal 4PD1 and the terminal 4PD2 as a modification example with respect to FIG. 13.

However, it is preferable to form the through-hole land THL constituting a part of the high-speed transmission path at the position overlapping with at least one of the terminal 4PD1 and the terminal 4PD2 in the thickness direction as illustrated in FIG. 13 from a viewpoint of simplifying the wiring layout and improving a degree of integration of the high-speed transmission path.

It is preferable to consider the parasitic capacitance caused by the occurrence of the capacitive coupling with the conductor plane 2PL formed in the wiring layer adjacent in the thickness direction in the case of a conductor pattern whose minimum width dimension is hardly made thinner, such as the wire 2*d* illustrated in FIGS. 11 and 12, among the conductor patterns constituting the high-speed transmission path as described above. As illustrated in FIG. 13, the through-hole land THL has a smaller minimum width dimension than the terminal 4PD1 and the terminal 4PD2 and has a larger minimum width dimension than the wire 2*d* illustrated in FIGS. 11 and 12. Accordingly, it is preferable that the conductor plane 2PL not be formed at a position of the wiring layer WL3, illustrated in FIG. 12, which overlaps with the through-hole land THL illustrated in FIG. 13 in the thickness direction.

Herein, the entire region overlapping with the terminal 4PD1 and the terminal 4PD2 in the conductor plane 2PL formed in the wiring layer WL3 is opened as illustrated in FIG. 12. Accordingly, when the through-hole land THL is formed at the position overlapping with at least one of the terminal 4PD1 and the terminal 4PD2 in the thickness direction, the through-hole land THL and the opening portion PLk3 illustrated in FIG. 12 overlap with each other as a result. That is, the opening portion PLk3 has both of the function of reducing the parasitic capacitance which occurs between the conductor plane 2PL of the wiring layer WL3 and the terminal 4PD1 or the terminal 4PD2 and the function of reducing parasitic capacitance which occurs between the conductor plane 2PL of the wiring layer WL3 and the through-hole land THL (see FIG. 13).

Accordingly, it is possible to reduce the number of the opening portions PLk3 to be formed in the conductor plane 2PL of the wiring layer WL3 illustrated in FIG. 12, and thus, a space which is available for leading the wire 2*d* increases. As a result, it is possible to improve the degree of integration of the high-speed transmission path.

In addition, the wire 2*d* which is formed in the wiring layer WL2 illustrated in FIG. 11, the wiring layer WL3 illustrated in FIG. 12, or the wiring layer WL4 illustrated in FIG. 13 hardly overlaps with the terminal 4PD1 or the terminal 4PD2 in a case in which the through-hole land THL is arranged to straddle the region between the terminal 4PD1 and the terminal 4PD2, when seen in a plan view, as illustrated in FIG. 13.

Next, the through-hole wire 2TW illustrated in FIG. 13 is electrically connected with the land 2LD and the solder ball SB via wires and the via serving as the interlayer conducting path which are formed in the wiring layer WL5, the wiring layer WL6, the wiring layer WL7, and the wiring layer WL8 stacked on the lower surface 2Cb side of the insulating layer 2CR illustrated in FIG. 6. However, the insulating layer 2CR serving as the core member is arranged between the wiring layer WL5 and the wiring layer WL1, and thus, the necessity of considering the generation of the parasitic capacitance with the terminal 4PD1 or the terminal 4PD2 illustrated in FIG. 10 is relatively low as compared to the case of the wiring layer WL2 or the wiring layer WL3.

Figure 14:
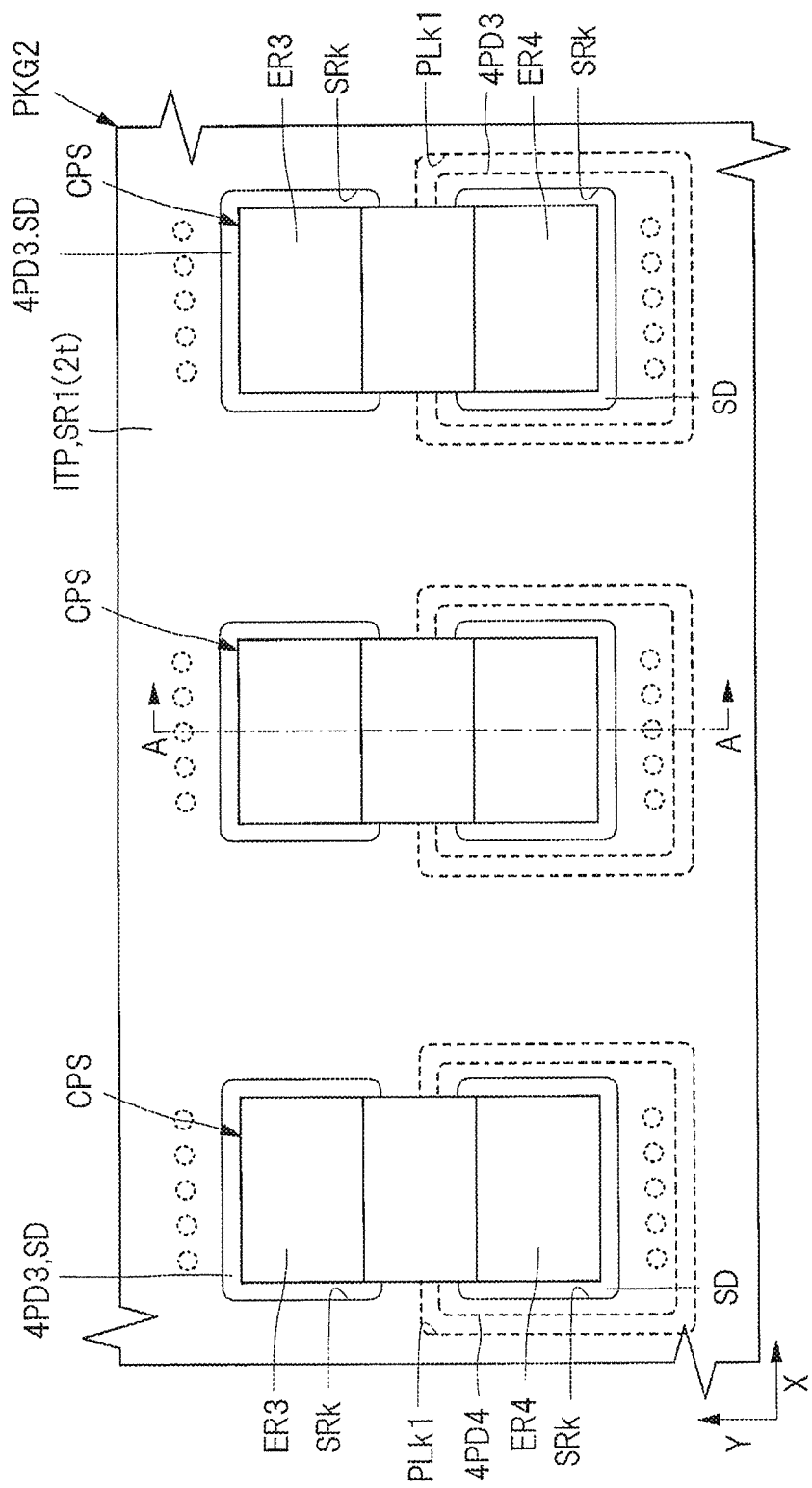
FIG. 14 is an enlarged plan view of a section B of FIG. 5.
Figure 15:
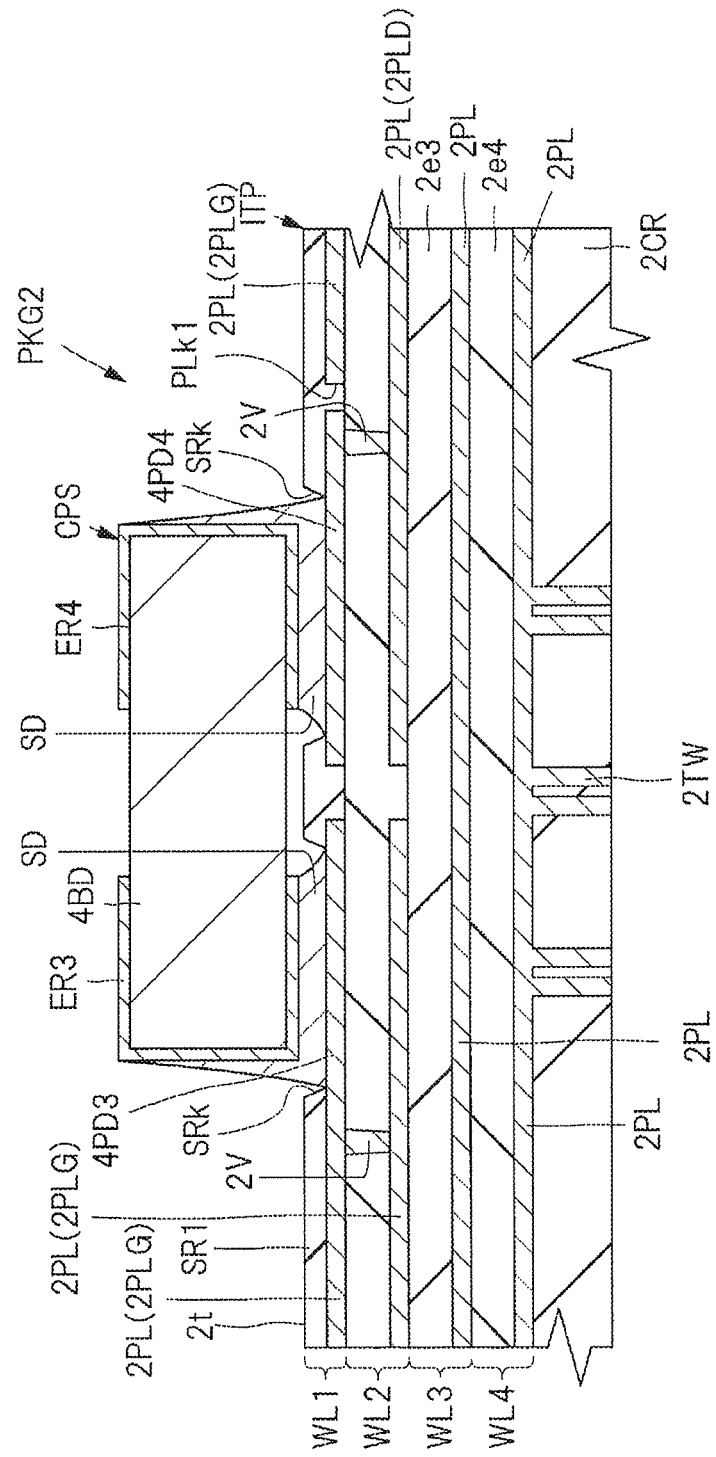
FIG. 15 is an enlarged cross-sectional view taken along a line A-A of FIG. 14.
Figure 16:
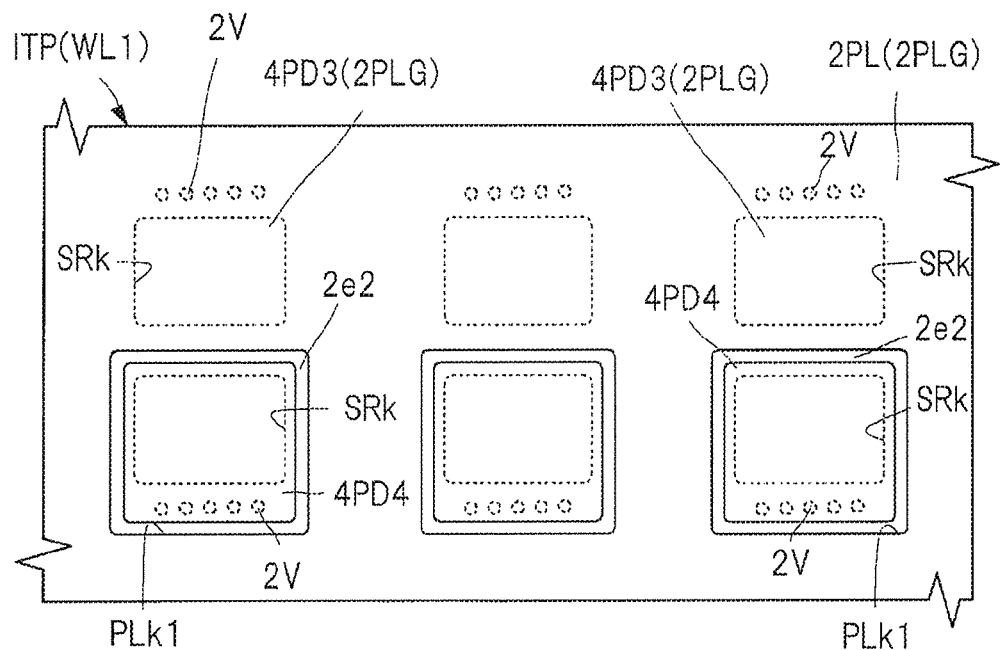
FIG. 16 is an enlarged plan view illustrating a structure of a first wiring layer arranged on an uppermost layer of the wiring substrate illustrated in FIG. 15.
Figure 17:
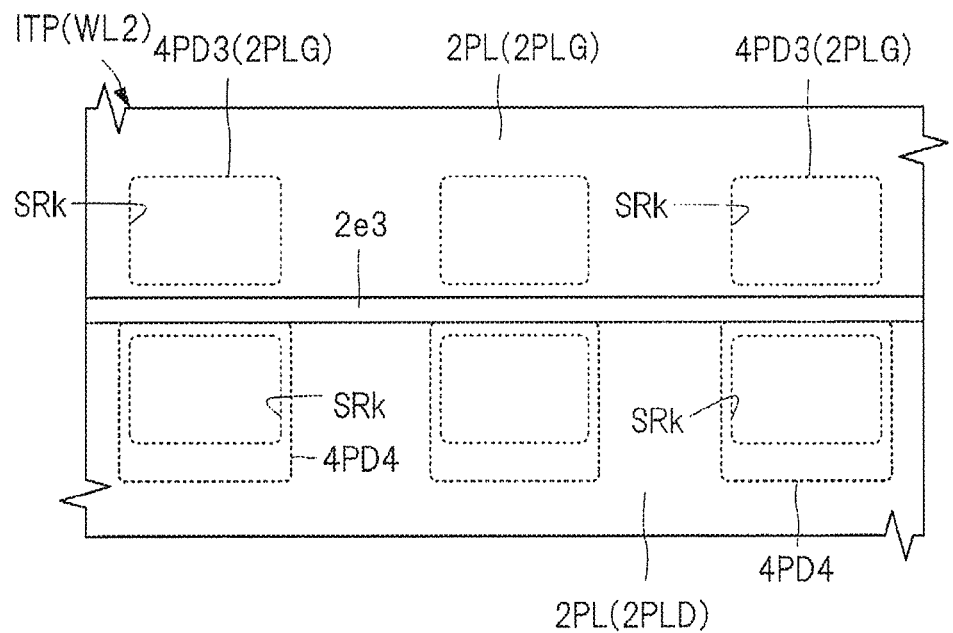
FIG. 17 is an enlarged plan view illustrating a second wiring layer on an inner side by one layer from the wiring layer illustrated in FIG. 16.

Connection Structure between Wiring Substrate and Capacitor Which Is Not Connected with High-Speed Transmission Path Next, a description will be given regarding a connection structure between the capacitor CPS for the power supply circuit which is not connected with the high-speed transmission path formed inside the support frame SFR illustrated in FIG. 5, and the wiring substrate ITP. FIG. 14 is an enlarged plan view of a section B of FIG. 5. In addition, FIG. 15 is an enlarged cross-sectional view taken along a line A-A of FIG. 14. In addition, FIG. 16 is an enlarged plan view illustrating a structure of the first wiring layer arranged on the uppermost layer of the wiring substrate illustrated in FIG. 15. In addition, FIG. 17 is an enlarged plan view illustrating the second wiring layer on an inner side by one layer from the wiring layer illustrated in FIG. 10.

Each of the plurality of capacitors CPS among the plurality of capacitors CDC and CPS illustrated in FIG. 5 is mounted on the upper surface 2*t* side of the wiring substrate ITP as illustrated in FIG. 14. In the present embodiment, the capacitor CPS is inserted between the reference potential supplying path VSP that supplies the reference potential (first potential) VSS to the semiconductor chip CHP2 and the power supply potential supplying path VDP that supplies the power supply potential (second potential) VDD to the semiconductor chip CHP2 in parallel connection as illustrated in FIG. 2 described above. That is, the capacitor CPS is the capacitor for the power supply circuit and is not connected with the high-speed transmission path SGP2 illustrated in FIG. 2.

The connection structure between the capacitor which is not connected with the high-speed transmission path SGP2 such as the capacitor CPS for the power supply circuit, and the wiring substrate ITP may be the same connection structure as the DC cut capacitor CDC that has been described with reference to FIGS. 8 to 13. However, even when the parasitic capacitance caused by the capacitive coupling between the conductor pattern configured to connect the capacitor CPS and the conductor plane 2PL is generated, such generation hardly causes a decrease of reliability in the case of the capacitor CPS which is not connected with the high-speed transmission path SGP2. Thus, the opening portion PLk2 (see FIG. 11) or the opening portion PLk3 (see FIG. 12) which is configured to reduce the parasitic capacitance is not necessarily formed in the case of a wiring structure of the power supplying path to be connected with the capacitor CPS.

For example, the first wiring layer WL1 which includes the mounting surface of the capacitor CPS (see FIG. 15) among the plurality of wiring layers provided in the wiring substrate ITP includes a terminal (a terminal pad or a conductor pattern) 4PD3 which is a conductor pattern to be electrically connected with the electrode ER3 (see FIG. 15) of the capacitor CPS as illustrated in FIGS. 15 and 16. However, the reference potential (for example, the ground potential) which is the same as that supplied to a conductor plane 2PLG in the periphery thereof, for example, is supplied to the terminal 4PD3, and thus, a part (part exposed in the opening portion SRk) of the conductor plane 2PLG is utilized as the terminal 4PD3. In addition, the wiring layer WL1 includes a terminal (a terminal pad or a conductor pattern) 4PD4 which is a conductor pattern to be electrically connected with the electrode ER4 of the capacitor CPS. The terminal 4PD4 is the terminal to which a potential (power supply potential) different from that supplied to the conductor plane 2PLG in the perimeter thereof is supplied and thus, is formed inside the opening portion PLk1 formed in the conductor plane 2PLG to be spaced apart from the conductor plane 2PLG.

In addition, the wiring layer WL2 includes the conductor plane 2PLG to which the first potential is supplied and a conductor plane 2PLD to which the second potential (power supply potential), different from the first potential is supplied as illustrated in FIGS. 15 and 17. However, the conductor plane 2PLG of the wiring layer WL2 overlaps with the conductor plane 2PLG of the wiring layer WL1 (see FIG. 15) which corresponds to the terminal 4PD3 in the thickness direction. In addition, the conductor plane 2PLD of the wiring layer WL2 overlaps with the entire terminal 4PD4 in the thickness direction. That is, an opening portion corresponding to the opening portion PLk2 illustrated in FIG. 11 is not formed, and only a gap configured to cause the conductor plane 2PLG and the conductor plane 2PLD to be spaced apart from each other is simply formed.

Further, the above-described conductor plane 2PL to which the first potential or the second potential is supplied is formed in each region of the wiring layer WL3 and the wiring layer WL4 overlapping with the capacitor CPS in the thickness direction, and the opening portion PLk3 (see FIG. 9) and the opening portion PLk4 are not formed in the conductor plane 2PL as illustrated in FIG. 15.

In this manner, it is possible to provide a simple structure in the portion that electrically connects the capacitor which is not connected with the high-speed transmission path SGP2 (see FIG. 2), and the wiring substrate ITP without forming the opening portion PLk2 (see FIG. 11) or the opening portion PLk3 (see FIG. 12) which is configured to reduce the parasitic capacitance. In this manner, regarding the capacitor CPS for the power supply circuit, it is possible to cause the conductor plane 2PLG for the reference potential and the conductor plane 2PLD for the power supply potential to face each other as illustrated in FIGS. 14 and 15 without requiring the structure to improve the noise tolerance like the high-speed transmission path. Alternatively, it is also possible to cause any one of the conductor plane 2PLG for the reference potential and the conductor plane 2PLD for the power supply potential to be extended to a portion immediately below the other terminal, that is, not to create an opening portion (cut shape). Accordingly, it is possible to eliminate a leading line (including the through-hole wire) configured for connection with the power supply and to improve a degree of freedom in design of the wiring substrate. As a result, it is possible to reduce inductance or resistance of the power supply and to improve characteristics of the power supply.

Note that the stability in input and output of a signal hardly decreases in a path through which the signal is transmitted at a transmission speed of, for example, lower than 5 Gbps, like the low-speed transmission path SGP1 illustrated in FIG. 2, without inserting the capacitor CDC, although not illustrated. However, it is preferable to provide the same structure as the wiring structure that has been described with reference to FIGS. 8 to 13 in the case of inserting the DC cut capacitor CDC in the low-speed transmission path SGP1 in series connection as a modification example with respect to the present embodiment. That is, it is preferable that the conductor plane 2PL which is formed in the wiring layer WL2 on the inner side by one layer than the wiring layer WL1 be opened in each region overlapping with the terminal 4PD1 and the terminal 4PD2.

Method of Manufacturing Semiconductor Device

Figure 18:
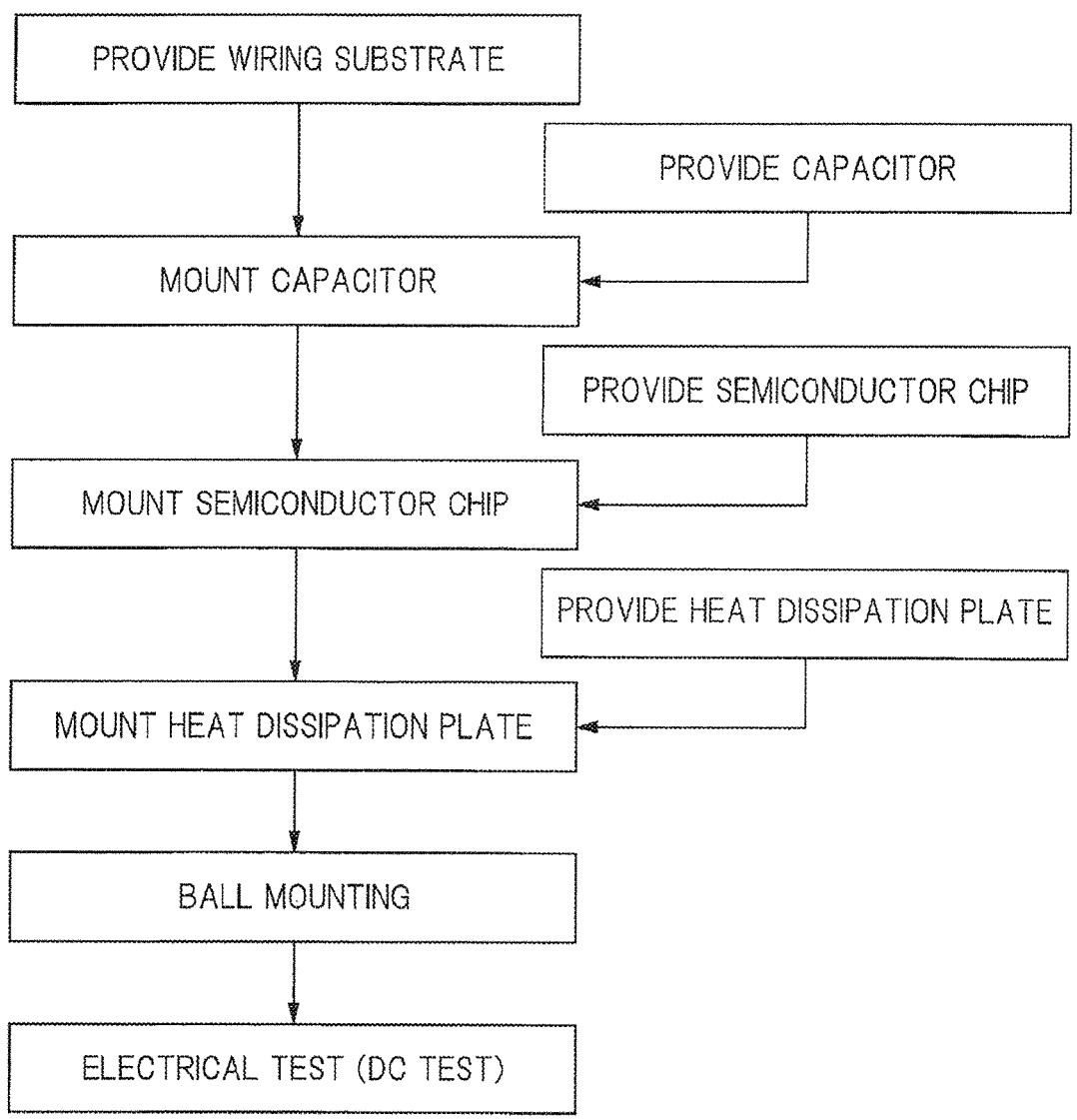
FIG. 18 is an explanatory diagram illustrating an overview of a process of manufacturing the semiconductor device that has been described with reference to FIGS. 1 to 17.

Next, a description will be given regarding a method of manufacturing the semiconductor device PKG2 that has been described with reference to FIGS. 1 to 17. The semiconductor device PKG2 is manufactured according to a flow illustrated in FIG. 18. FIG. 18 is an explanatory diagram illustrating an overview of a process of manufacturing the semiconductor device that has been described with reference to FIGS. 1 to 17. Details of each step will be described later. Note that a description will be given regarding a method of providing the wiring substrate ITP which is formed in a product size in advance and manufacturing the semiconductor device PKG2 for one layer in the following description of the manufacturing method. However, the invention can be applied to a multi-piece producing method, as a modification example, in which a so-called multi-piece board which is partitioned into a plurality of product formation regions is provided, assembly is performed for each of the plurality of product formation regions, and then, a plurality of semiconductor devices are acquired by dividing each of the product formation regions. In this case, a singulation step of cutting the multi-piece board to be divided for each of the product formation regions is added after a ball mounting step illustrated in FIG. 18 or an electrical test step.

1. Wiring Substrate Providing Step

Figure 19:
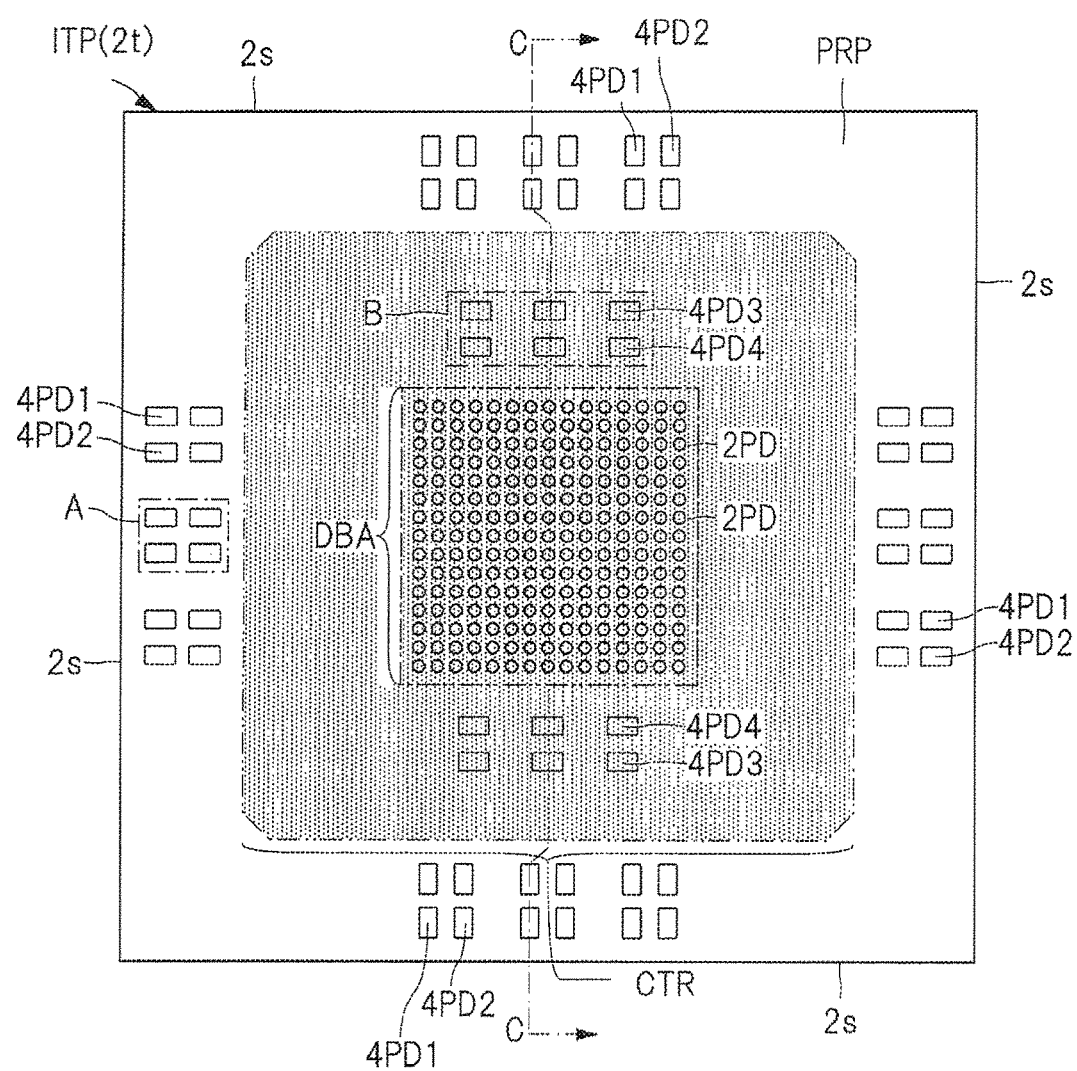
FIG. 19 is a plan view illustrating a chip mounting surface side of the wiring substrate which is provided in a wiring substrate providing step illustrated in FIG. 18.
Figure 20:
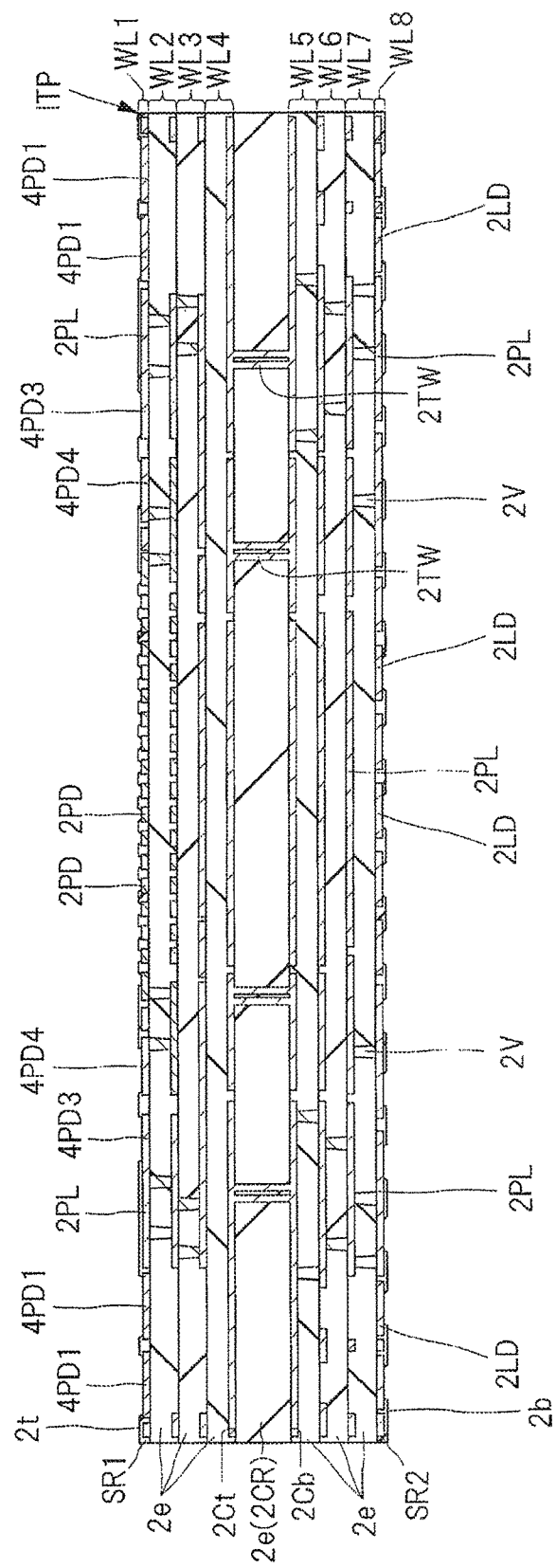
FIG. 20 is a cross-sectional view taken along a line C-C of FIG. 19.

First, the wiring substrate ITP illustrated in FIGS. 19 and 20 is provided in a wiring substrate providing step illustrated in FIG. 18. FIG. 19 is a plan view illustrating a chip mounting surface side of the wiring substrate which is provided in a wiring substrate providing step illustrated in FIG. 18. In addition, FIG. 20 is a cross-sectional view taken along a line C-C of FIG. 19. Note that FIG. 19 illustrates each outer edge of a chip mounting region DBA and a central region CTR with two-dot chain lines in order to illustrate each boundary among the chip mounting region DBA, the central region CTR, and a peripheral edge region PRP. In addition, a dot pattern is illustrated inside the central region CTR in order to clearly illustrate the central region CTR which is a region covered by the heat dissipation plate HS illustrated in FIG. 3.

In addition, an enlarged plane of a section A illustrated in FIG. 19 corresponds to a state in which the capacitor CDC and the bonding member SD illustrated in FIG. 8 are removed, and an enlarged plane of a section B corresponds to a state in which the capacitor CPS and the bonding member SD illustrated in FIG. 14 are removed. In addition, a plan view of the lower surface 2*b* (see FIG. 20) of the wiring substrate ITP illustrated in FIG. 19 is not illustrated. In this step, the lower surface 2*b* of the wiring substrate ITP is in a state in which a plurality of opening portions is formed in the insulating layer SR2 serving as the solder resist film, and the lands 2LD (see FIG. 20) are exposed in the above-described opening portions at positions of the plurality of solder balls SB illustrated in FIG. 4.

As illustrated in FIG. 19, the wiring substrate ITP includes the central region CTR in a central portion of the upper surface 2*t* forming the quadrangle when seen in a plan view and the peripheral edge region PRP that continuously surrounds the central region CTR. The central region CTR is a region which is covered by the heat dissipation plate HS illustrated in FIG. 6 in a heat dissipation plate mounting step illustrated in FIG. 18. Meanwhile, the peripheral edge region PRP is a region which is exposed from the heat dissipation plate HS illustrated in FIG. 6. In addition, the central region CTR includes the chip mounting region DBA which is a region in which the semiconductor chip CHP2 is mounted, in a step of mounting the semiconductor chip illustrated in FIG. 18.

In addition, a first conductor pattern group which includes the plurality of bonding pads 2PD, the plurality of terminals 4PD3, and the plurality of terminals 4PD4 is formed in the central region CTR. The plurality of bonding pads 2PD of the first conductor pattern group formed in the central region CTR is electrode terminals which are electrically connected with the semiconductor chip CHP2 via the protruding electrode 3BP illustrated in FIG. 6 in the semiconductor chip mounting step illustrated in FIG. 18. In addition, each of the plurality of terminals 4PD3 and the plurality of terminals 4PD4 of the first conductor pattern group is an electrode terminal configured for connection with the capacitor CPS for the power supply circuit that has been described with reference to FIGS. 14 to 17.

Note that FIG. 19 illustrates an example in which the bonding pads 2PD are arrayed in rows and columns as an example of array, but there are various modification examples of the array of the bonding pad 2PD. For example, the bonding pads 2PD may be arrayed along a peripheral edge portion of the chip mounting region DBA without forming the bonding pad 2PD in a central portion of the chip mounting region DBA.

In addition, a second conductor pattern group which includes the plurality of terminals 4PD1 and the plurality of terminals 4PD2 is formed in the peripheral edge region PRP of the upper surface 2*t* of the wiring substrate ITP. Each of the plurality of terminals 4PD1 and the plurality of terminals 4PD2 of the second conductor pattern group is an electrode terminal configured for connection with the DC cut capacitor CDC that has been described with reference to FIGS. 8 to 13.

A wiring structure of the wiring substrate ITP illustrated in FIG. 20 has been already described with reference to FIGS. 6 and 8 to 17, and the redundant description will be omitted. However, the solder ball SB illustrated in FIG. 6 is not connected in this step as illustrated in FIG. 20. The wiring substrate ITP which includes the insulating layer 2CR serving as the core member as illustrated in FIG. 20 can be manufactured by stacking the wiring layers through use of a build-up method on each side of the upper surface 2Ct and the lower surface 2Cb of the insulating layer 2CR using the insulating layer 2CR in which the plurality of through-hole wires 2TW is formed as the base member, for example, as a manufacturing method thereof. In addition, when the core member is not used, a wiring substrate can be manufactured by stacking a plurality of wiring layers on a base member (not illustrate) and then peeling off the base member.

2. Capacitor Mounting Step

Figure 21:
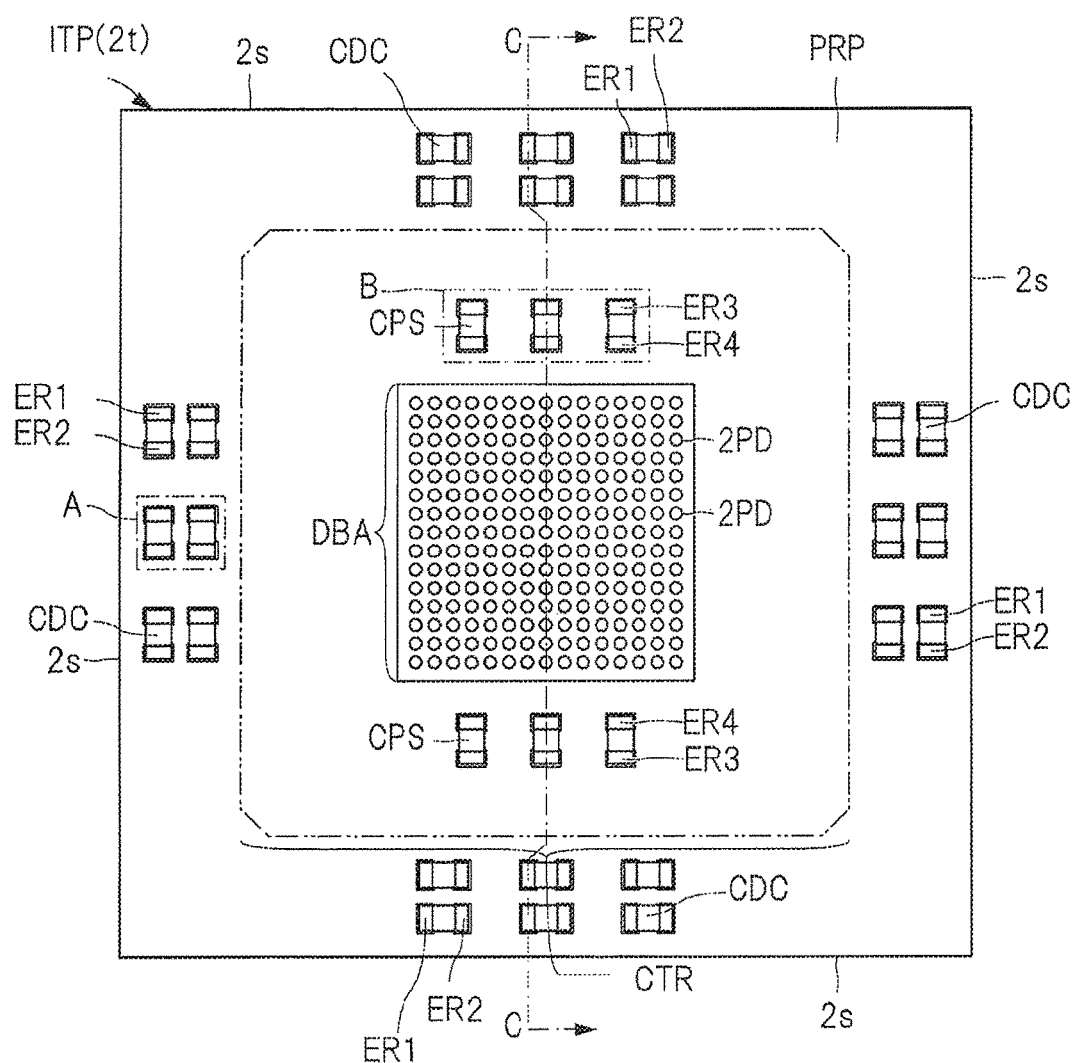
FIG. 21 is a plan view illustrating a state in which the plurality of capacitors is mounted on the wiring substrate illustrated in FIG. 19.
Figure 22:
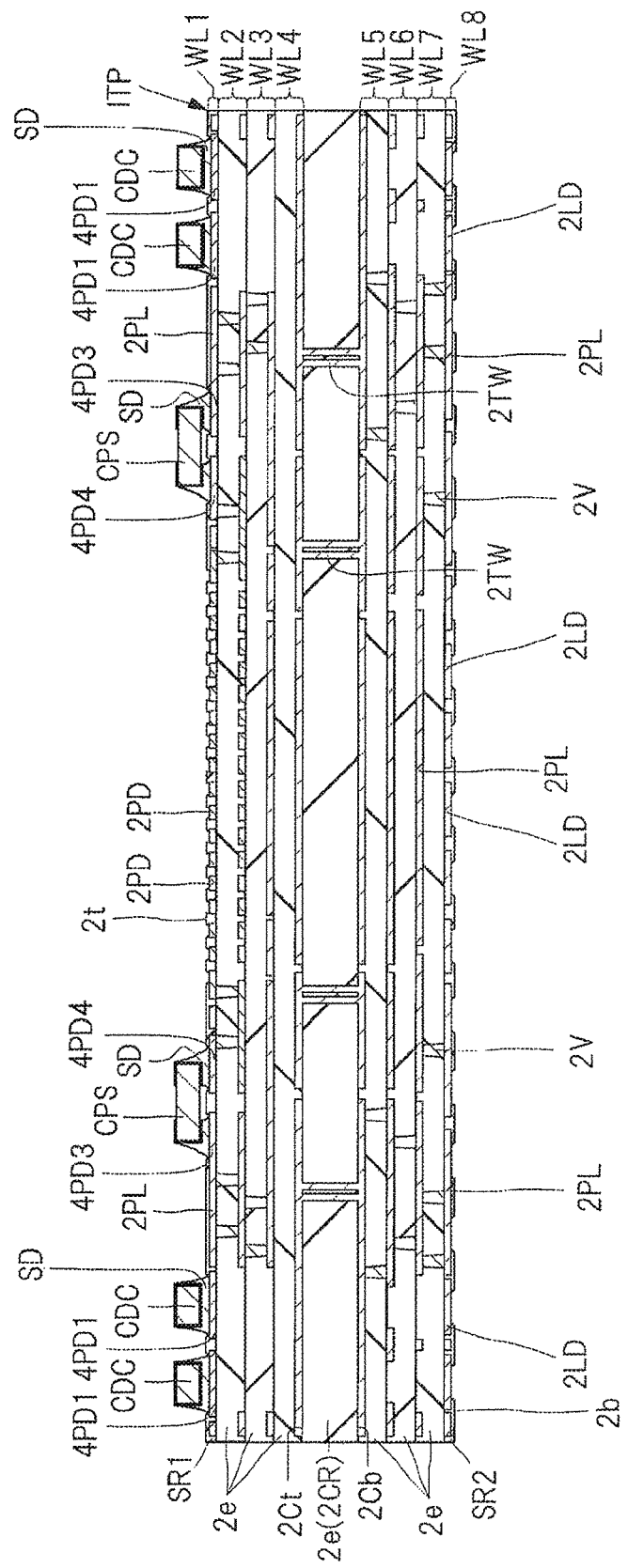
FIG. 22 is a cross-sectional view taken along a line C-C of FIG. 21.

Next, the pluralities of capacitors CDC and CPS are mounted on the upper surface 2*t* side of the wiring substrate ITP as illustrated in FIGS. 21 and 22 in a capacitor mounting step illustrated in FIG. 18. FIG. 21 is a plan view illustrating a state in which the plurality of capacitors is mounted on the wiring substrate illustrated in FIG. 19. In addition, FIG. 22 is a cross-sectional view taken along a line C-C of FIG. 21. Note that FIG. 21 does not illustrate the dot pattern inside the central region CTR for viewability of the plurality of capacitors CPS to be mounted in the central region CTR illustrated in FIG. 19. In addition, an enlarged plane of a section A illustrated in FIG. 21 corresponds to FIG. 8, and an enlarged plane of a section B corresponds to FIG. 14.

In this step, the pluralities of capacitors CDC and CPS are provided (a capacitor providing step) and mounted on the wiring substrate ITP as illustrated in FIGS. 21 and 22. At this time, all the plurality of DC cut capacitors CDC is mounted in the peripheral edge region PRP. Meanwhile, all the plurality of capacitors CPS for the power supply circuit are mounted in the central region CTR in the example illustrated in FIG. 21. Note that some of the plurality of capacitors CPS may be mounted in the peripheral edge region PRP as a modification example with respect to FIG. 21. However, it is preferable to arrange the capacitor CPS for the power supply circuit to be close to a circuit that consumes power, and thus, it is more preferable to mount the capacitor CPS in the central region CTR that includes the chip mounting region DBA.

In this step, the electrode ER1 of the capacitor CDC is connected with the terminal 4PD1 of the wiring substrate ITP via the bonding member SD which is the solder member as illustrated in FIGS. 8 and 9. In addition, the electrode ER2 of the capacitor CDC is connected with the terminal 4PD2 of the wiring substrate ITP via the bonding member SD which is the solder member. In addition, the electrode ER3 of the capacitor CPS is connected with the terminal 4PD3 of the wiring substrate ITP via the bonding member SD which is the solder member as illustrated in FIGS. 14 and 15. In addition, the electrode ER4 of the capacitor CPS is connected with the terminal 4PD4 of the wiring substrate ITP via the bonding member SD which is the solder member.

When the solder member is used as the bonding member SD, a solder material containing a solder component is coated in advance on each surface of the terminals 4PD1, 4PD2, 4PD3, and 4PD4 before mounting the capacitors CDC and CPS, and the capacitors CDC and CPS are placed on the solder material. In this state, the heat treatment (reflow process) is performed to a temperature equal to or higher than a melting point of the solder material, and accordingly, the capacitors CDC and CPS are fixed onto the terminals 4PD1, 4PD2, 4PD3 and 4PD4.

3. Chip Mounting Step

Figure 23:
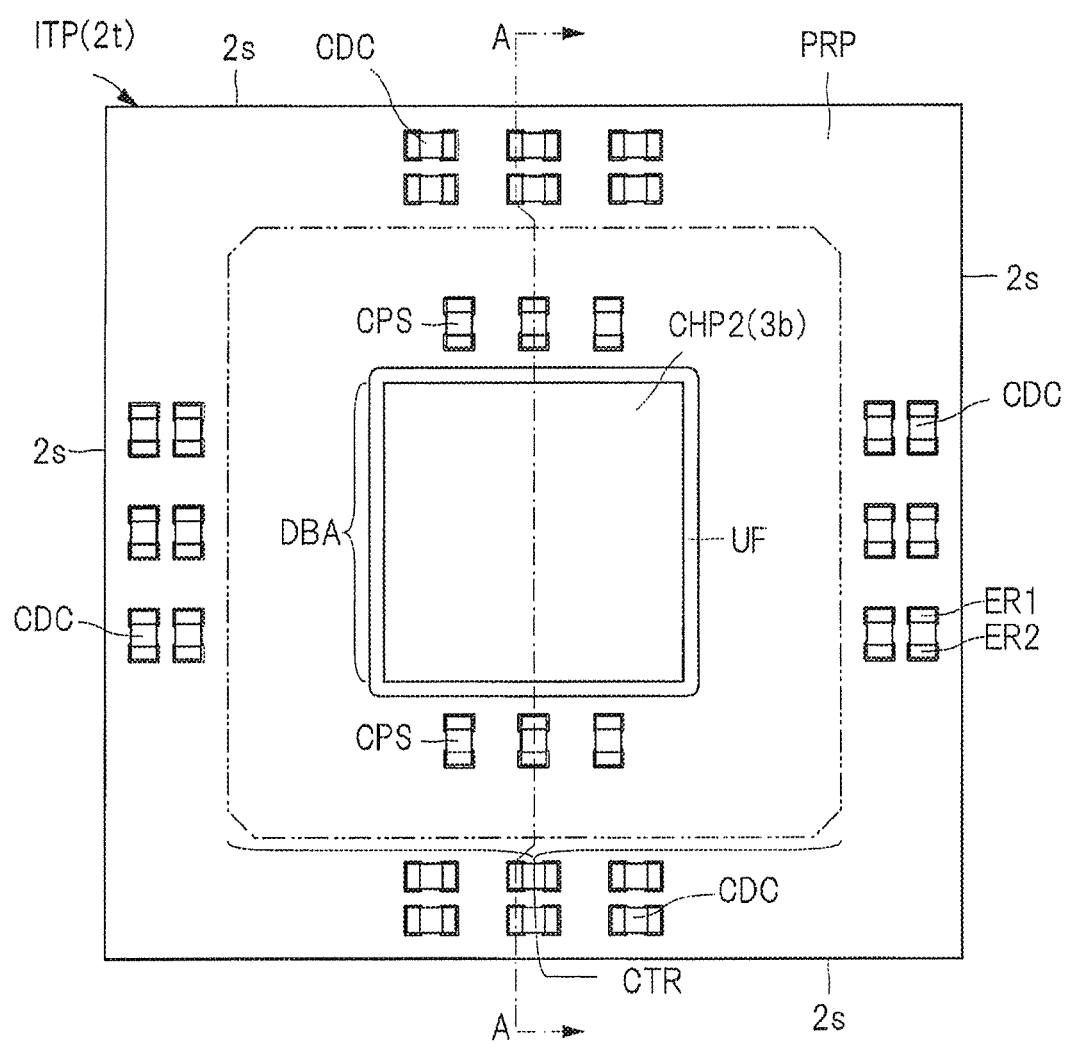
FIG. 23 is a plan view illustrating a state in which a semiconductor chip is mounted on the wiring substrate illustrated in FIG. 21.
Figure 24:
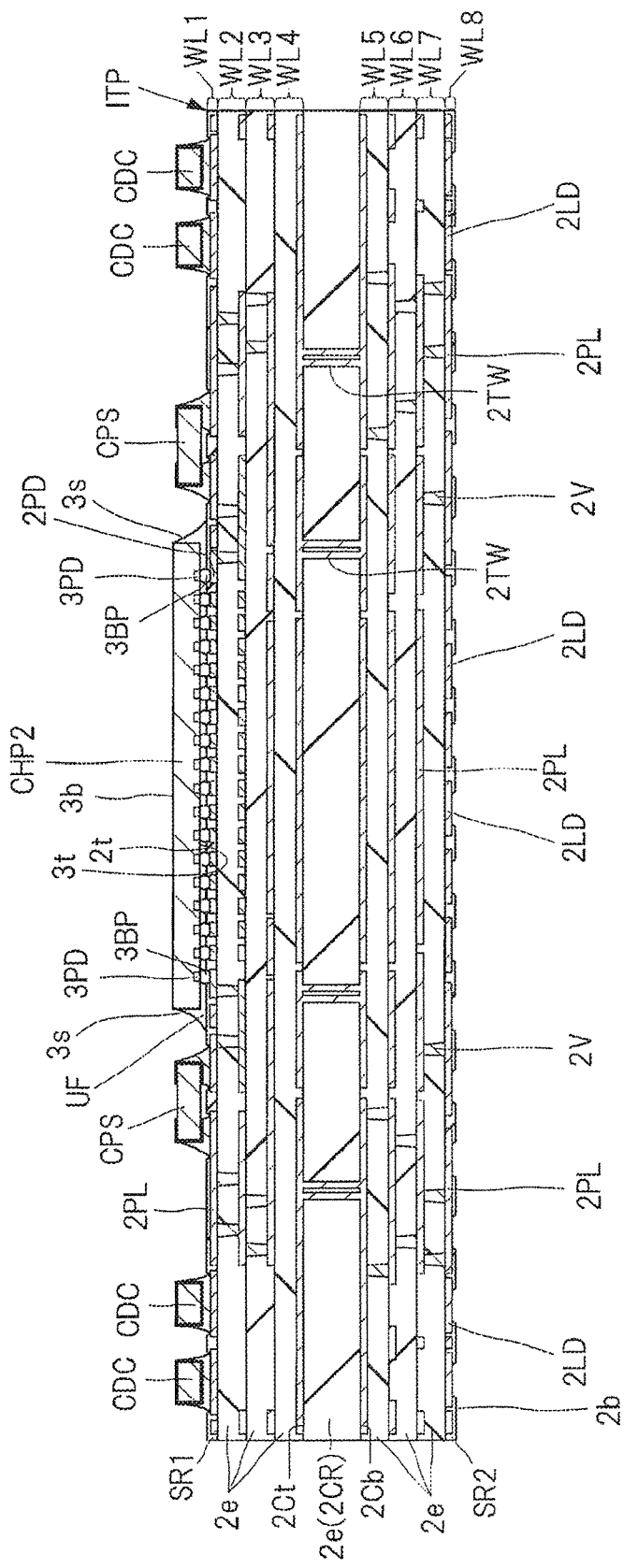
FIG. 24 is a cross-sectional view taken along a line A-A of FIG. 23.

Next, the semiconductor chip CHP2 is mounted in the chip mounting region DBA of the upper surface 2t of the wiring substrate ITP as illustrated in FIGS. 23 and 24 in the semiconductor chip mounting step illustrated in FIG. 18. FIG. 23 is a plan view illustrating a state in which a semiconductor chip is mounted on the wiring substrate illustrated in FIG. 21. In addition, FIG. 24 is a cross-sectional view taken along a line A-A of FIG. 23.

In this step, the semiconductor chip CHP2 is provided (a semiconductor chip providing step) and is mounted on the chip mounting region DBA of the wiring substrate ITP as illustrated in FIGS. 23 and 24. In the example illustrated in FIGS. 23 and 24, the mounting is performed according to a so-called facedown mounting method (or referred to also as a flip chip connection method) in a state in which the front surface 3t (see FIG. 24) of the semiconductor chip CHP2 and the upper surface 2t of the wiring substrate ITP face each other.

In addition, the plurality of pads 3PD formed on the front surface 3t side of the semiconductor chip CHP2 and the plurality of bonding pads 2PD of the wiring substrate ITP are electrically connected with each other via the plurality of protruding electrodes 3BP in this step as illustrated in FIG. 24. When the plurality of bonding pads 2PD is arranged in rows and columns as in the present embodiment, solder bumps, obtained by molding solder materials in spherical shapes, are used as the plurality of protruding electrodes 3BP in many cases. However, the protruding electrode 3BP is not limited to the solder bump and may use a pillar bump, for example, which is obtained by molding a metal material such as copper in a columnar shape.

In addition, the underfill resin (insulating resin) UF is arranged between the semiconductor chip CHP2 and the wiring substrate ITP in this step. The underfill resin UF is arranged so as to seal the electrically-connected portion (bonding portions of the plurality of protruding electrodes 3BP) between the semiconductor chip CHP2 and the wiring substrate ITP. In this manner, it is possible to mitigate the stress generating in the electrically-connected portion between the semiconductor chip CHP2 and the wiring substrate ITP by arranging the underfill resin UF so as to seal connection portions of the plurality of protruding electrodes 3BP.

There are two types of methods as a method of forming the underfill resin UF when roughly divided. In a pre-coating method which is a first method, the underfill resin UF is arranged in advance on the chip mounting region DBA (see FIG. 23) before mounting the semiconductor chip. Next, the semiconductor chip CHP2 is pressed from above the underfill resin UF, and electrically connects the wiring substrate ITP and the semiconductor chip CHP2. Thereafter, the underfill resin UF is cured to obtain a structural body illustrated in FIG. 24. Note that a film-like resin member can be used without being limited to a paste-like resin member as described above in the case of the present method of arranging the resin member before mounting the semiconductor chip CH2. In this case, "attachment" work is performed instead of "coating" work.

In addition, in a post-injection method which is a second method, the semiconductor chip CHP2 and the wiring substrate ITP are electrically connected with each other before arranging the underfill resin UF. Thereafter, a liquid-like resin is injected into the gap between the semiconductor chip CHP2 and the wiring substrate ITP and is cured, thereby obtaining the structural body illustrated in FIG. 24. In this step, any of the above-described pre-coating (or pre-attachment) method and the post-injection method may be used.

4. Heat Dissipation Plate Mounting Step

Figure 25:
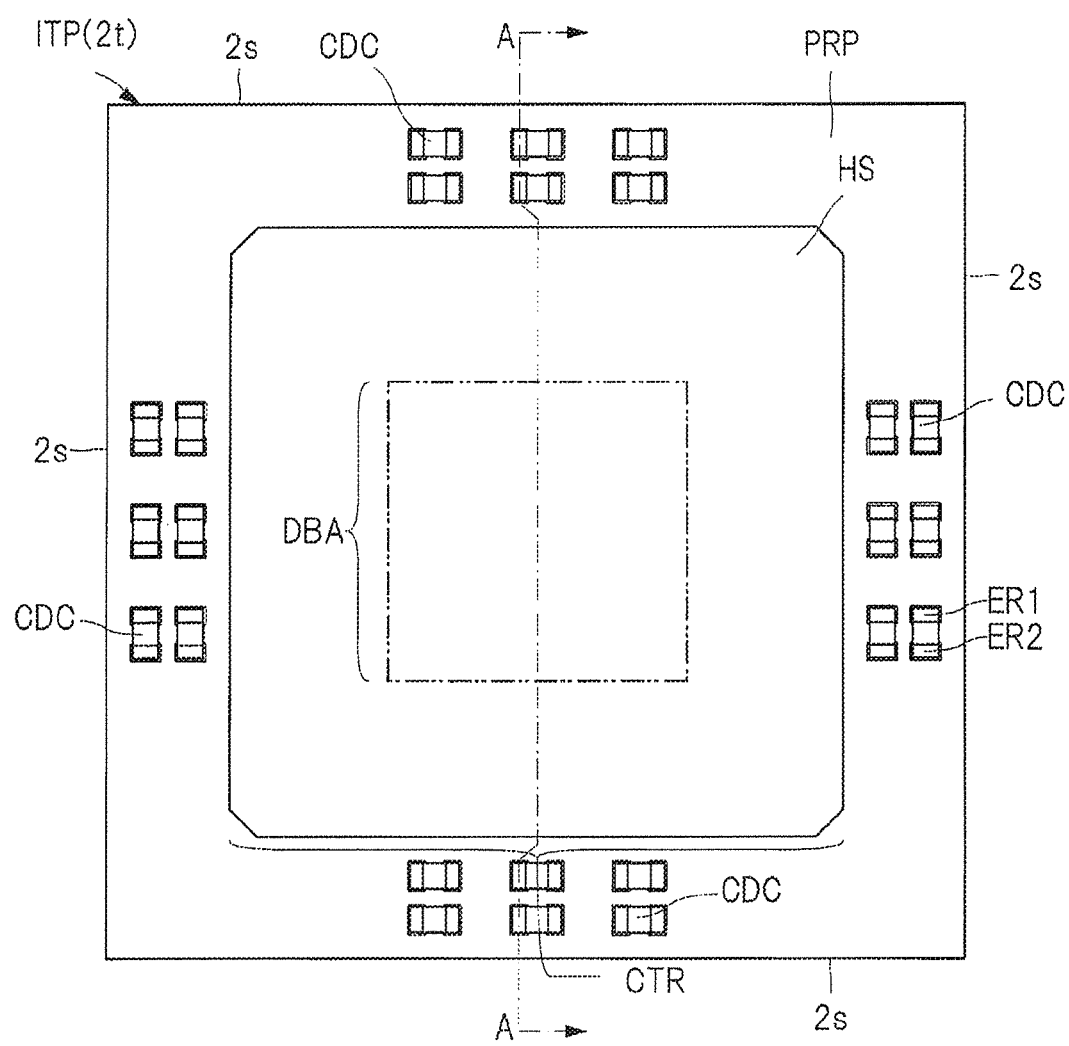
FIG. 25 is a plan view illustrating a state in which the semiconductor chip illustrated in FIG. 23 is covered by the heat dissipation plate.
Figure 26:
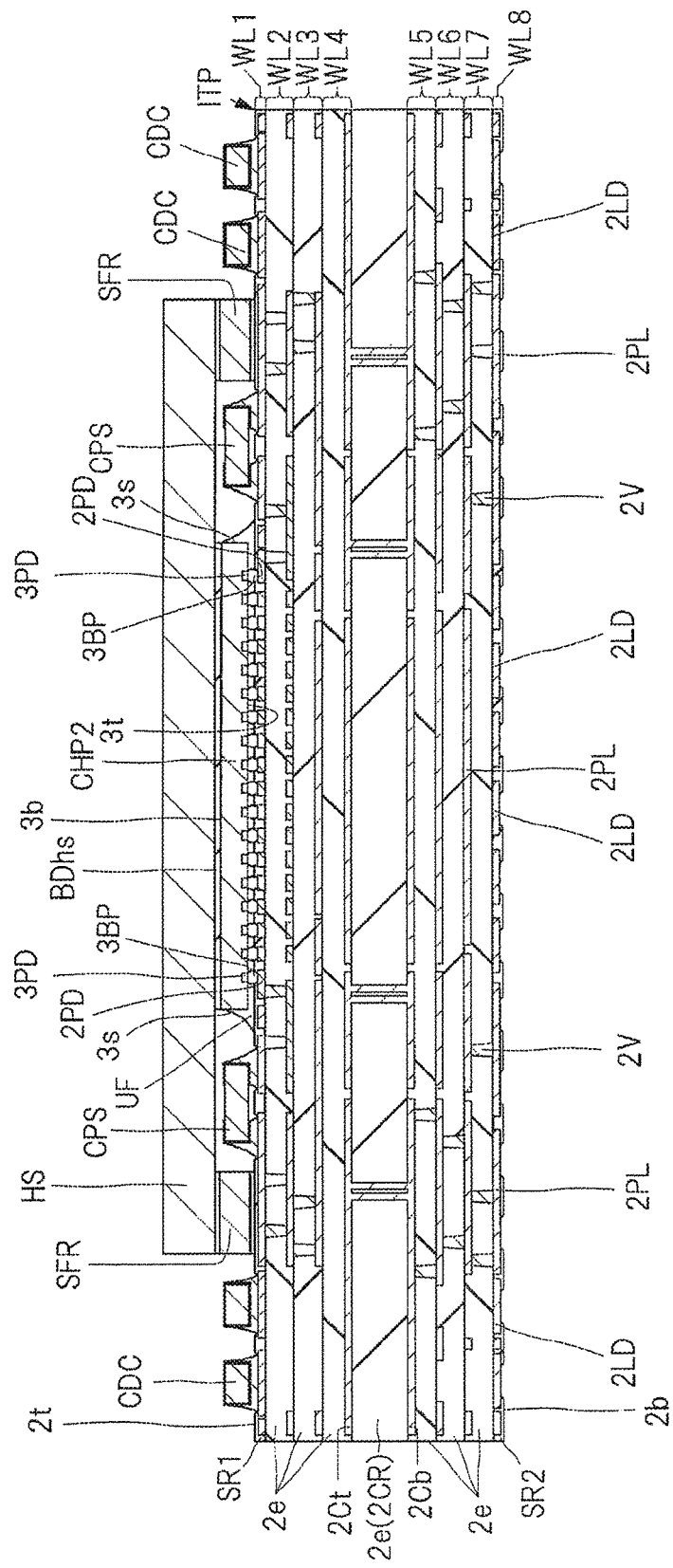
FIG. 26 is a cross-sectional view taken along a line A-A of FIG. 25.

Next, the heat dissipation plate HS is mounted on the semiconductor chip CHP2, and the semiconductor chip CHP2 is covered by the heat dissipation plate HS as illustrated in FIGS. 25 and 26 in the heat dissipation plate mounting step illustrated in FIG. 18. FIG. 25 is a plan view illustrating a state in which the semiconductor chip illustrated in FIG. 23 is covered by the heat dissipation plate. In addition, FIG. 26 is a cross-sectional view taken along a line A-A of FIG. 25.

In this step, the heat dissipation plate HS is provided (the semiconductor chip providing n step) and is mounted on the central region CTR (see FIG. 25) of the wiring substrate ITP as illustrated in FIGS. 25 and 26. Accordingly, the semiconductor chip CHP2 and the plurality of capacitors CPS for the power supply circuit are covered by the heat dissipation plate HS as illustrated in FIG. 26. Meanwhile, each of the plurality of DC cut capacitors CDC is exposed from the heat dissipation plate HS without being covered by the heat dissipation plate HS as illustrated in FIG. 25.

There are various methods as a method of attaching the heat dissipation plate HS. For example, in the example illustrated in FIG. 26, the support frame SFR is attached to a peripheral edge portion of the heat dissipation plate HS, and the heat dissipation plate HS is adhesively fixed to the wiring substrate ITP via the support frame SFR. In addition, the rear surface 3b of the semiconductor chip CHP2 is coated with the adhesive member (heat dissipation resin) BDhs, and the heat dissipation plate HS is adhesively fixed to the semiconductor chip CHP2 via the adhesive member BDhs.

The support frame SFR may be adhesively fixed to the wiring substrate ITP in advance, and the heat dissipation plate HS may be mounted on the fixed support frame SFR as another method different from the above-described method. In addition, it may be configured such that only the heat dissipation plate HS is adhesively fixed to the semiconductor chip CHP2 without providing the support frame SFR as a modification example with respect to FIG. 26.

Note that it is possible to omit the present step when the heat dissipation plate HS is not attached as a modification example with respect to the present embodiment.

5. Ball Mounting Step

Next, the plurality of solder balls SB is attached on the lower surface 2b side serving as the mounting surface of the wiring substrate ITP as illustrated in FIGS. 4 and 6 in the ball mounting step illustrated in FIG. 18. In this step, the solder ball SB is arranged on the land 2LD exposed from the insulating layer SR2 illustrated in FIGS. 4 and 6, and the reflow process (process of heating to cause the solder component to be melted and bonded and then cooling) is performed to cause the solder ball SB to be bonded to the land 2LD. Note that it is possible to omit the present step when the solder ball SB is not used as the conductive material that electrically connects the wiring substrate MB1 and the semiconductor device PKG2 illustrated in FIG. 1. Alternatively, a metal film such as a thin solder film may be formed instead of the solder ball SB on an exposed surface of the land 2LD in the present step.

6. Electrical Test Step (DC Test Step)

Figure 27:
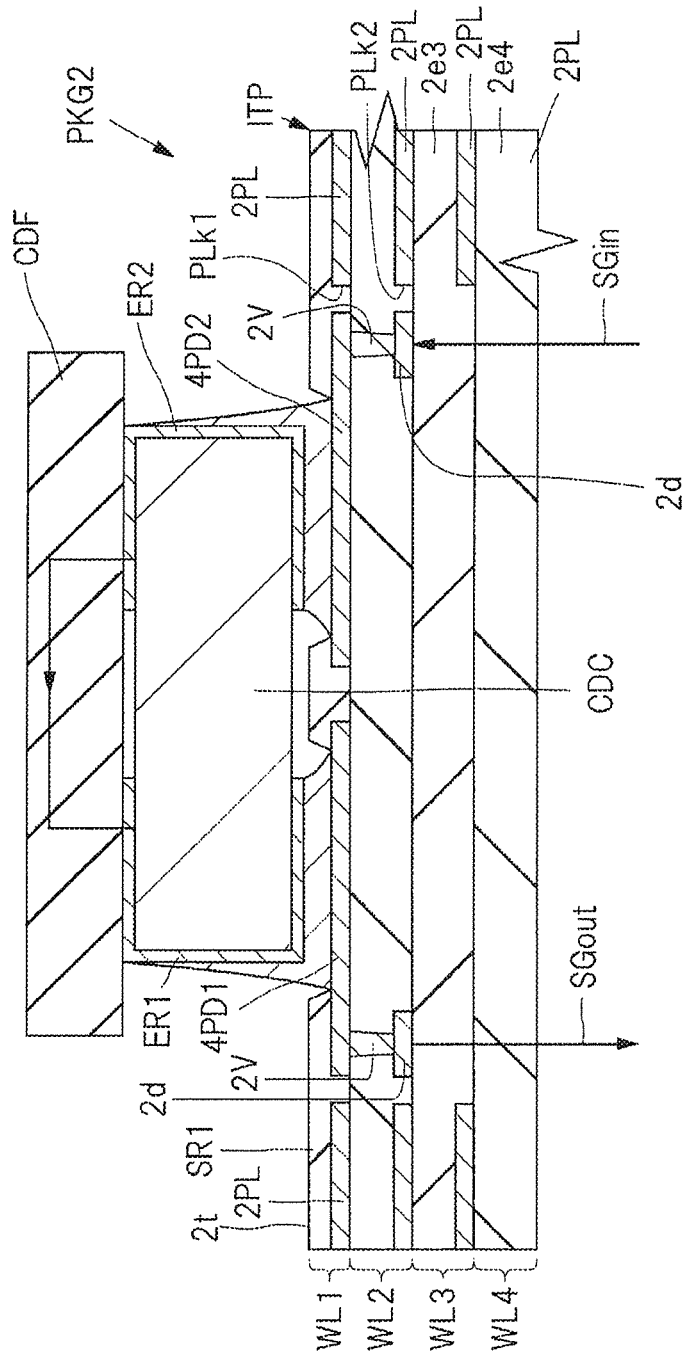
FIG. 27 is an enlarged cross-sectional view schematically illustrating a state in which inspection is performed by short-circuiting an electrode of the DC cut capacitor in an electrical test step illustrated in FIG. 18.

Next, an electrical test of a circuit formed in the semiconductor device PKG2 is performed in the electrical test step illustrated in FIG. 18. This electrical test includes a DC test in which inspection is performed by causing DC current to flow for inspection. The DC test includes, for example, a continuity test and the like to confirm an electrical connection state of the circuit. FIG. 27 is an enlarged cross-sectional view schematically illustrating a state in which inspection is performed by short-circuiting an electrode of the DC cut capacitor in the electrical test step illustrated in FIG. 18.

As described above, the inspection is performed by causing the DC current to flow in the DC test, and thus, the current for inspection is cut in the case of including the DC cut capacitor CDC in the circuit to be inspected. Accordingly, it is necessary to input a DC inspection signal SGin in a state in which the electrode ER2 and the electrode ER1 of the capacitor CDC are short-circuited as schematically illustrated in FIG. 27 when the DC test is performed with respect to the high-speed transmission path in which the capacitor CDC is inserted. When the electrode ER2 and the electrode ER1 of the capacitor CDC are short-circuited, an inspection signal SGout is output from the electrode ER1 even if the DC cut capacitor CDC is inserted in the high-speed transmission path in series connection, and it is possible to perform the DC test with respect to the entire circuit.

Herein, it is required to provide a structure in which a conductive member can be easily brought into contact with both of the electrode ER1 and the electrode ER2 of the capacitor CDC when the electrode ER2 and the electrode ER1 of the capacitor CDC are short-circuited as illustrated in FIG. 27. Thus, the DC cut capacitor CDC is arranged at the position not to be covered by the heat dissipation plate HS as illustrated in FIG. 25 in the present embodiment. In this case, the electrode ER1 and the electrode ER2 of the capacitor CDC are exposed, and thus, it is possible to bring the conductive member configured for the short circuit between the electrode ER2 and the electrode ER1 of the capacitor CDC into contact with both of the electrodes.

There are various modes of the conductive member configured for the short circuit between the electrode ER2 and the electrode ER1 of the capacitor CDC. For example, an anisotropic conductive film (conductive member) CDF obtained by burying a conductive member inside a resin film is pressed to cover both of the electrode ER1 and the electrode ER2 of the capacitor CDC in the example illustrated in FIG. 27. In this state, the inspection signal SGin is input from the solder ball SB (see FIG. 6) side on the mounting surface side, the inspection signal SGout which has passed through the anisotropic conductive film CDF is output from another solder ball SB. In this case, it is possible to collectively short-circuit the plurality of capacitors CDC, and thus, it is possible to efficiently perform the DC test.

In addition, it is possible to perform the short circuit by bringing a contact terminal (probe terminal) for inspection into contact with each of the electrode ER1 and the electrode ER2 as a modification example with respect to FIG. 27.

Method of Mounting Semiconductor Device

Next, a description will be given regarding a method of mounting the semiconductor device PKG1 and the semiconductor device PKG2 on the wiring substrate MB1 serving as the motherboard to electrically connect the semiconductor device PKG1 and the semiconductor device PKG2 with reference to FIG. 1.

As illustrated in FIG. 1, a plurality of terminals TM1 for connection with the semiconductor device PKG1 and a plurality of terminals TM2 configured for connection with the semiconductor device PKG2 are formed on an upper surface (mounting surface) MBt of the wiring substrate MB1. The semiconductor device PKG1 has the plurality of solder balls SB serving as the external terminals. The semiconductor device PKG1 and the wiring substrate MB1 are electrically connected with each other by bonding the plurality of solder balls SB of the semiconductor device PKG1 to the plurality of terminals TM1 of the wiring substrate MB1, respectively, in the method of mounting the semiconductor device in the present embodiment. In addition, the semiconductor device PKG2 and the wiring substrate MB1 are electrically connected with each other by bonding the plurality of solder balls SB of the semiconductor device PKG2 to the plurality of terminals TM2 of the wiring substrate MB1, respectively, in the method of mounting the semiconductor device in the present embodiment.

As described above, the semiconductor device PKG1 and the semiconductor device PKG2 are electrically connected with each other via the high-speed transmission path SGP2 of the wiring substrate MB1 by electrically connecting the semiconductor device PKG1 and the semiconductor device PKG2 to the wiring substrate MB1. At this time, the DC cut capacitor CDC is mounted in the semiconductor device PKG2 in the present embodiment, and thus, the capacitor CDC is not mounted in the wiring substrate MB1. As a result, it is possible to reduce the size of the wiring substrate MB1, and thus, it is possible to reduce the size of the electronic device EDV1. In addition, it is unnecessary to mount the DC cut capacitor CDC on the wiring substrate MB1 serving as the motherboard, and thus, it is possible to reduce a product mounting area on the wiring substrate MB1 and to improve a degree of freedom in wiring design of the wiring substrate MB1. As a result, it is possible to improve signal quality or power quality.

MODIFICATION EXAMPLE

In the foregoing, the invention made by the inventors of the present invention has been concretely described based on the embodiment. However, it is needless to say that the present invention is not limited to the foregoing embodiment and various modifications and alterations can be made within the scope of the present invention.

First Modification Example

Figure 28:
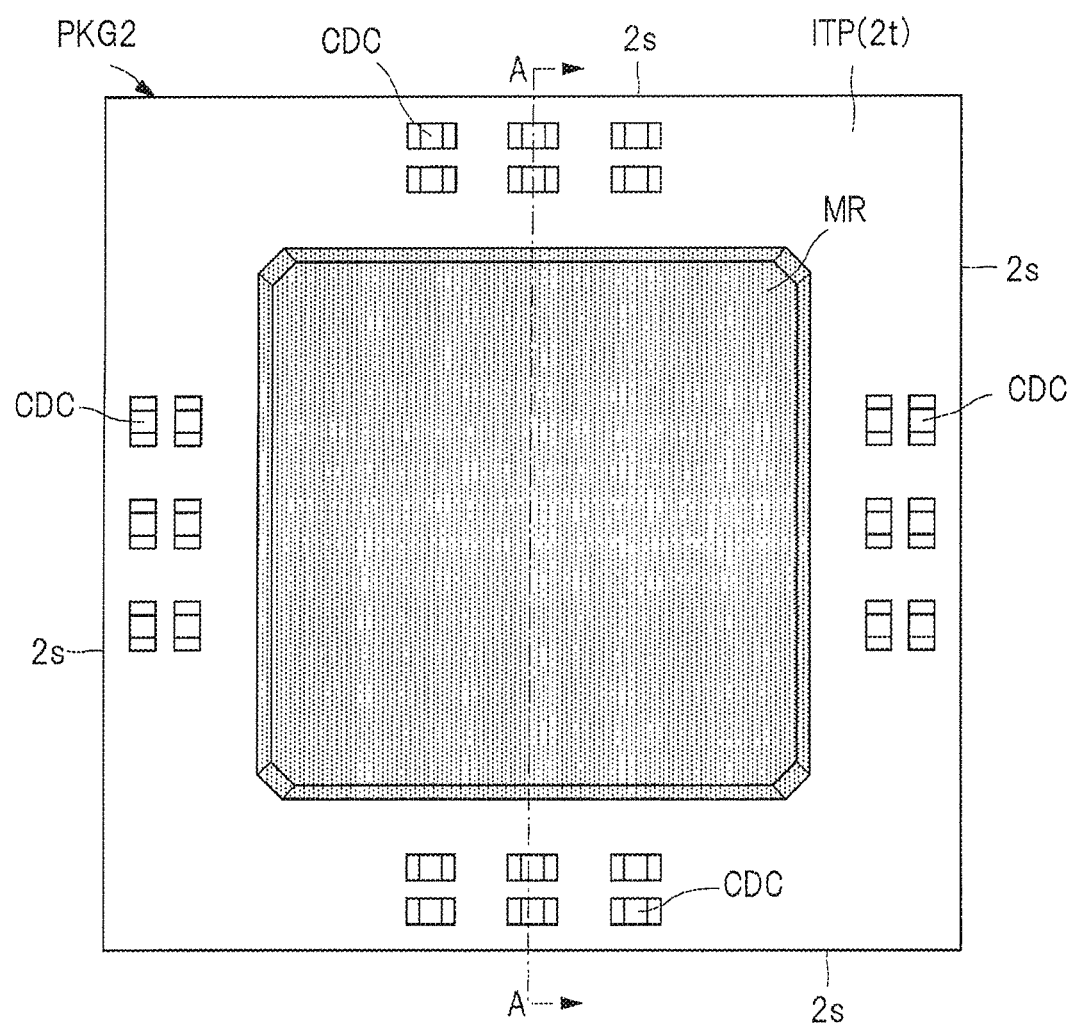
FIG. 28 is a plan view illustrating a modification example with respect to FIG. 3.
Figure 29:
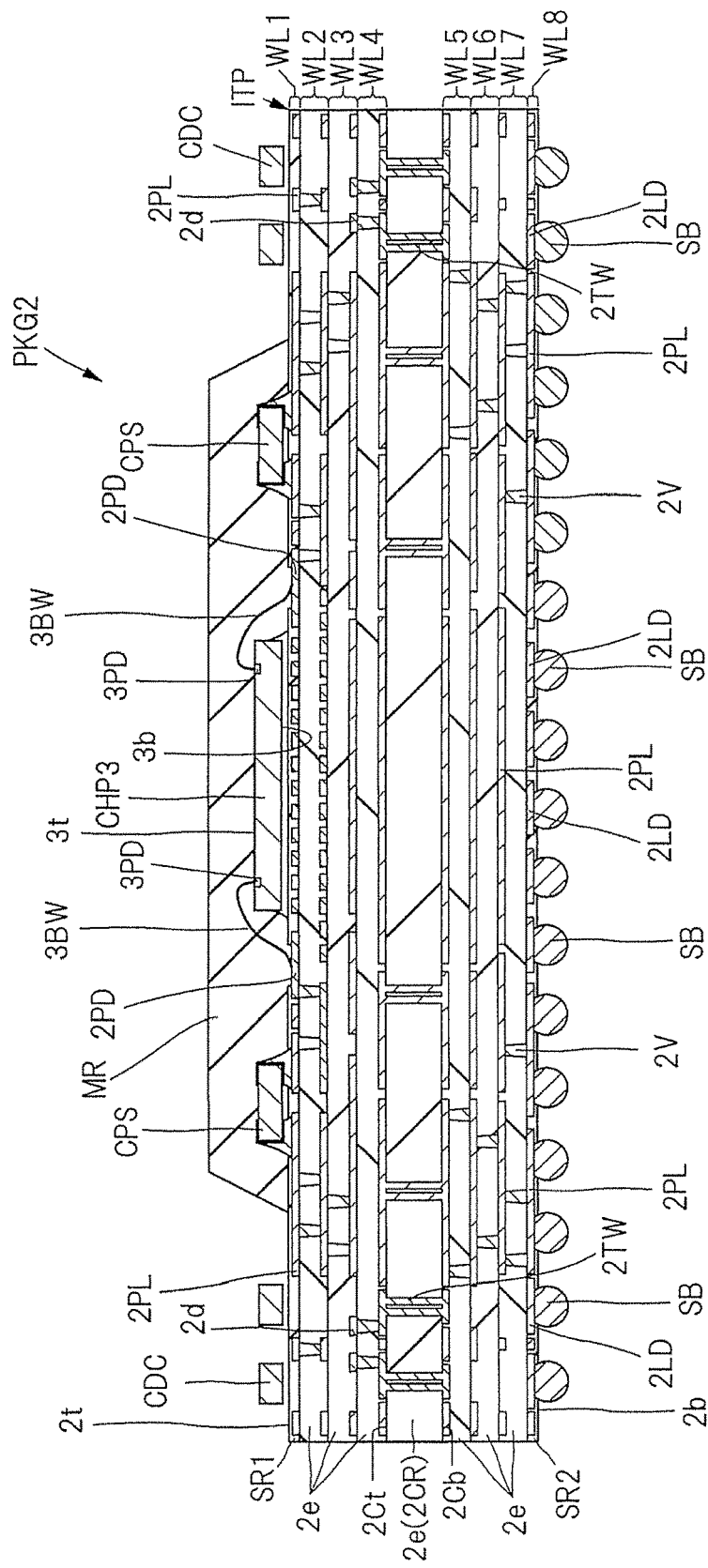
FIG. 29 is a cross-sectional view taken along a line A-A of FIG. 28.

For example, the description has been given in the above-described embodiment by exemplifying the example in which the semiconductor chip CHP2 is mounted on the wiring substrate ITP using the facedown mounting method. However, a semiconductor chip CHP3 may be mounted in a state in which the rear surface 3b of the semiconductor chip CHP3 faces the upper surface 2t of the wiring substrate ITP using a so-called face-up mounting method as illustrated in FIG. 29 as a modification example. FIG. 28 is a plan view illustrating the modification example with respect to FIG. 3. In addition, FIG. 29 is a cross-sectional view taken along a line A-A of FIG. 28.

The semiconductor chip CHP3 illustrated in FIG. 29 is different from the semiconductor chip CHP2 illustrated in FIG. 6 in that the plurality of pads 3PD serving as electrode terminals of the semiconductor chip CHP3 is arranged to be aggregated in a peripheral edge portion of the front surface 3t. In addition, the semiconductor chip CHP3 is different from the semiconductor chip CHP2 illustrated in FIG. 6 in terms of being electrically connected with the wiring substrate ITP via a plurality of wires 3BW serving as conductive members instead of the plurality of protruding electrodes 3BP illustrated in FIG. 6. In addition, the semiconductor chip CHP3 is different from the semiconductor chip CHP2 illustrated in FIG. 6 in terms of being mounted on the wiring substrate ITP using the face-up mounting method. The semiconductor chip CHP3 is the same as the semiconductor chip CHP2 illustrated in FIG. 6 except for the above-described differences.

In addition, a wire bonding step of electrically connecting the semiconductor chip CHP3 and the plurality of bonding pads (bonding leads or semiconductor chip connecting terminals) 2PD of the wiring substrate ITP to each other via the plurality of wires 3BW is performed after the semiconductor chip mounting step illustrated in FIG. 18 and before the ball mounting step in the case of mounting the semiconductor chip CHP3 on the wiring substrate ITP using the face-up mounting method. In addition, a sealing step of sealing the semiconductor chip CHP3, the plurality of wires 3BW, and the plurality of capacitors CPS with resin and forming a sealing body MR is included after the above-described wire bonding step and before the ball mounting step in the case of mounting the semiconductor chip CHP3 on the wiring substrate ITP using the face-up mounting method.

In addition, the example illustrated in FIG. 29 is different from the example illustrated in FIG. 6 in that the semiconductor chip CHP3, the plurality of wires 3BW, and the plurality of capacitors CPS are sealed by the sealing body (resin body) MR made of resin. However, it is common between FIG. 6 and FIG. 28 that the semiconductor chip and the plurality of capacitors CPS are covered by a certain member (the sealing body MR or the heat dissipation plate HS illustrated in FIG. 6). In addition, each of the plurality of DC cut capacitors CDC is also exposed from the member (the sealing body MR) that covers the semiconductor chip CHP3 (see FIG. 29) in FIG. 28. Accordingly, it is possible to perform the DC test in the electrical test step even if the DC cut capacitor CDC is inserted in the high-speed transmission path in series connection as described in the above-described embodiment.

The modification example illustrated in FIGS. 28 and 29 is the same as the embodiment that has been described in the above-described embodiment except for the above-described differences. Accordingly, the redundant description will be omitted. In addition, parts that have been described as the semiconductor chip CHP2 in the above-described embodiment can be substituted with the semiconductor chip CHP3 regarding parts other than the above-described differences.

Second Modification Example

In addition, the opening portion PLk2 is formed in the conductor plane 2PL of the wiring layer WL2 so as to open the entire region overlapping with the terminal 4PD1 and the terminal 4PD2 which are configured for connection with the DC cut capacitor as illustrated in FIG. 11 in the example that has been described in the above-described embodiment. However, it is also possible to reduce the parasitic capacitance even when a conductor pattern is formed in a part of the region overlapping with the terminal 4PD1 or the terminal 4PD2 as long as the opening portion PLk2 is formed in the region overlapping with the terminal 4PD1 and the terminal 4PD2. FIGS. 30 to 33 are enlarged plan views each illustrating a modification example with respect to the second wiring layer illustrated in FIG. 11.

Figure 30:
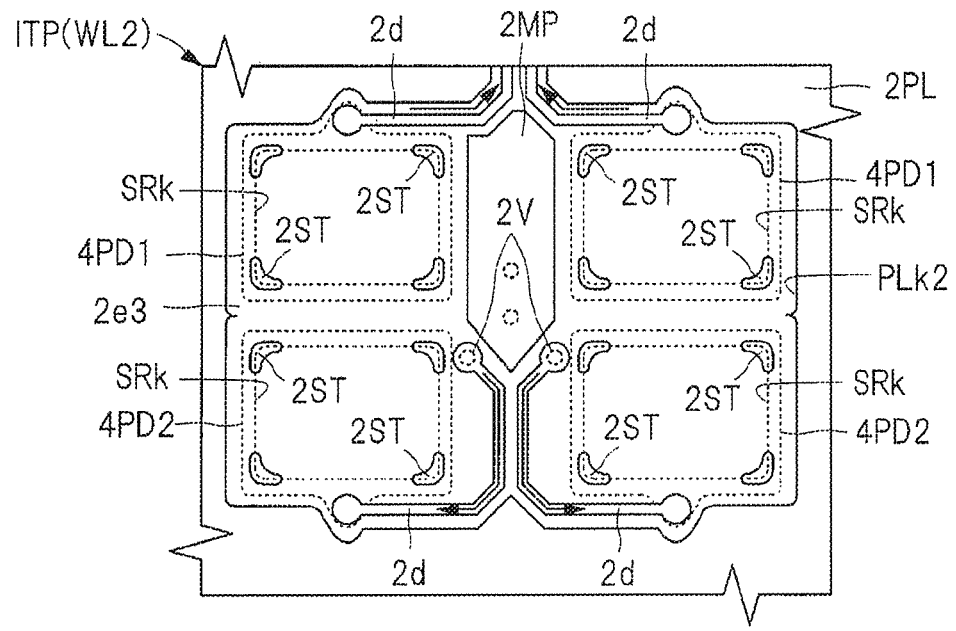
FIG. 30 is an enlarged plan view illustrating a modification example with respect to a second wiring layer illustrated in FIG. 11.

A plurality of conductor patterns 2ST is formed inside the opening portion PLk2 formed in the conductor plane 2PL in the modification example illustrated in FIG. 30. The plurality of conductor patterns 2ST is made of the same metal material as the conductor plane 2PL or the wire 2d.

In addition, the plurality of conductor patterns 2ST is formed at positions overlapping with the opening portion SRk which is formed in the insulating layer SR1 (see FIG. 8) in order to expose the terminal 4PD1 or the terminal 4PD2. Specifically, the opening portion SRk forms a quadrangle when seen in a plan view, and the conductor pattern 2ST is formed at a position overlapping with each corner (intersection of the respective sides) of the quadrangular opening portion SRk. When the opening portion PLk2 which is larger than the area of the terminal 4PD1 and the terminal 4PD2 is formed as illustrated in FIG. 11, an exposed part of the insulating layer 2e3 as a base has less structural strength as compared to a part of the insulating layer 2e3 which is covered by the conductor plane 2PL. It is possible to improve the strength inside the opening portion PLk2 by forming the plurality of conductor patterns 2ST in a part of the region overlapping with the terminal 4PD1 or the terminal 4PD2.

In particular, a peripheral edge portion of the bonding member SD overlaps with a peripheral edge portion of the opening portion SRk at the time of mounting the capacitor CDC as illustrated in FIG. 8 or 9. Thus, when the capacitor CDC is pressed by the anisotropic conductive film CDF or the like at the time of short-circuiting the electrode ER1 and the electrode ER2 of the capacitor CDC illustrated in FIG. 27, a stress generated due to pressure at the time of pressing is easily concentrated on a position overlapping with each corner of the opening portion SRk in the thickness direction in the electrical test step that has been described in the above-described embodiment. Alternatively, the generated stress is easily concentrated on the position overlapping with each corner of the opening portion SRk in the thickness direction than the other positions due to a temperature cyclic load applied after mounting the capacitor CDC.

Thus, the conductor pattern 2ST is arranged at the position overlapping with each corner of the opening portion SRk in the thickness direction as illustrated in FIG. 30, and accordingly, it is possible to suppress destruction of the insulating layer or the like caused by the stress concentration in the wiring layer WL2.

Figure 31:
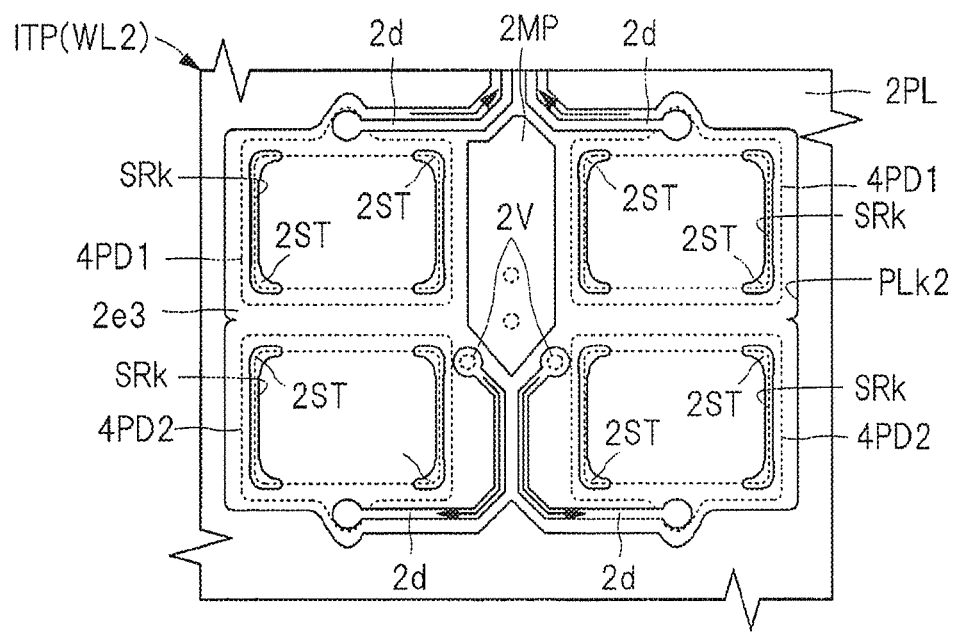
FIG. 31 is an enlarged plan view illustrating another modification example with respect to a second wiring layer illustrated in FIG. 11.

In addition, the conductor pattern 2ST may be provided to extend along a short side of the opening portion SRk (in other words, along a long-side direction of the capacitor CDC illustrated in FIG. 8) as in another modification example illustrated in FIG. 31. In this case, the area of the conductor pattern 2ST increases as compared to the modification example illustrated in FIG. 30, and thus, an effect of serving as a reinforcement member increases. However, the parasitic capacitance increases if the area of the conductor pattern 2ST increases too much, and thus, it is preferable to set a sum of each area of the plurality of conductor patterns 2ST formed at the positions overlapping with the terminal 4PD1 in the thickness direction to be less than 10% of the area of the terminal 4PD1. In addition, it is preferable to set a sum of each area of the plurality of conductor patterns 2ST formed in the positions overlapping with the terminal 4PD2 in the thickness direction to be less than 10% of the area of the terminal 4PD2.

Figure 32:
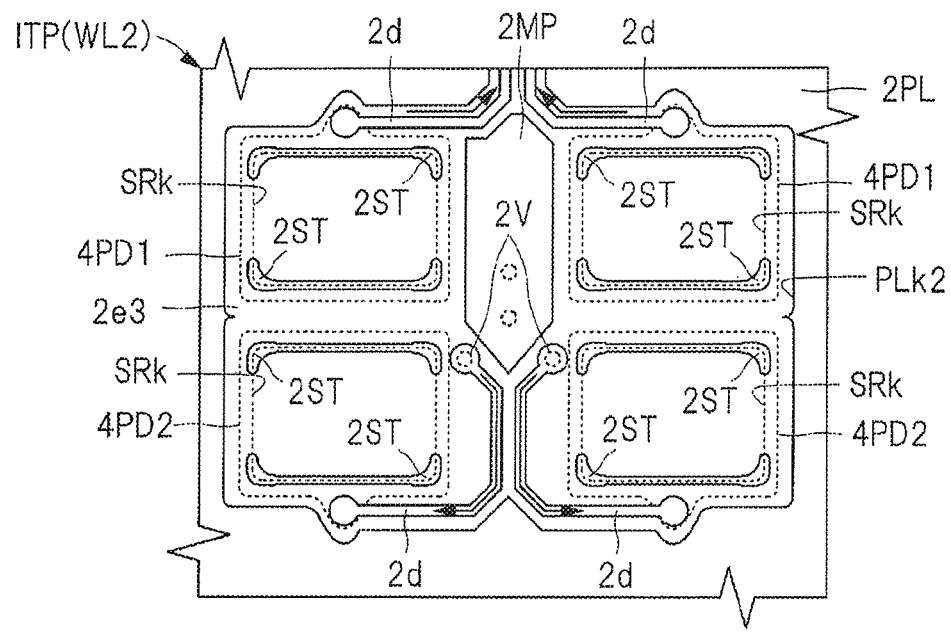
FIG. 32 is an enlarged plan view illustrating a modification example with respect to a second wiring layer illustrated in FIG. 31.

In addition, there is also a method of providing the conductor pattern 2ST to extend along a long side of the opening portion SRk and not to extend along the short side of the opening portion SRk like in another modification example illustrated in FIG. 32 as a still another modification example with respect to FIG. 31. Also in this case, it can be suppressed that the conductor pattern 2ST functions as an antenna. However, comparing the example illustrated in FIG. 31 with the example illustrated in FIG. 32, the effect of improving the strength inside the opening portion PLk2 is higher in the example illustrated in FIG. 32 than the modification example of FIG. 31, but a value of the parasitic capacitance is smaller in the modification example illustrated in FIG. 31 than the modification example illustrated in FIG. 32. Accordingly, it is preferable to determine an extending direction of the conductor pattern 2ST such that the sum of the area of the conductor patterns 2ST becomes small in a range of a degree of required reinforcement.

Figure 33:
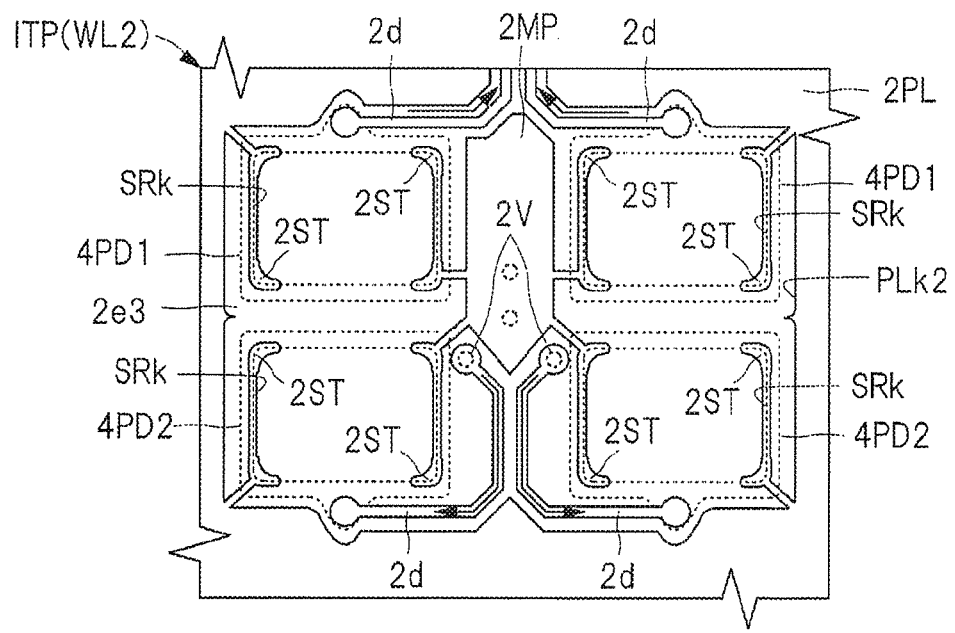
FIG. 33 is an enlarged plan view illustrating another modification example with respect to a second wiring layer illustrated in FIG. 31.

In addition, it is preferable to link each of the conductor patterns 2ST with the conductor plane 2PL or the conductor pattern 2MP to which the reference potential is supplied as in another modification example illustrated in FIG. 33 from a viewpoint of suppressing that the conductor pattern 2ST becomes a noise source of the high-speed transmission path. In this case, a potential of the conductor pattern 2ST becomes stable, and thus, the noise caused by the conductor pattern 2ST is hardly generated.

Figure 34:
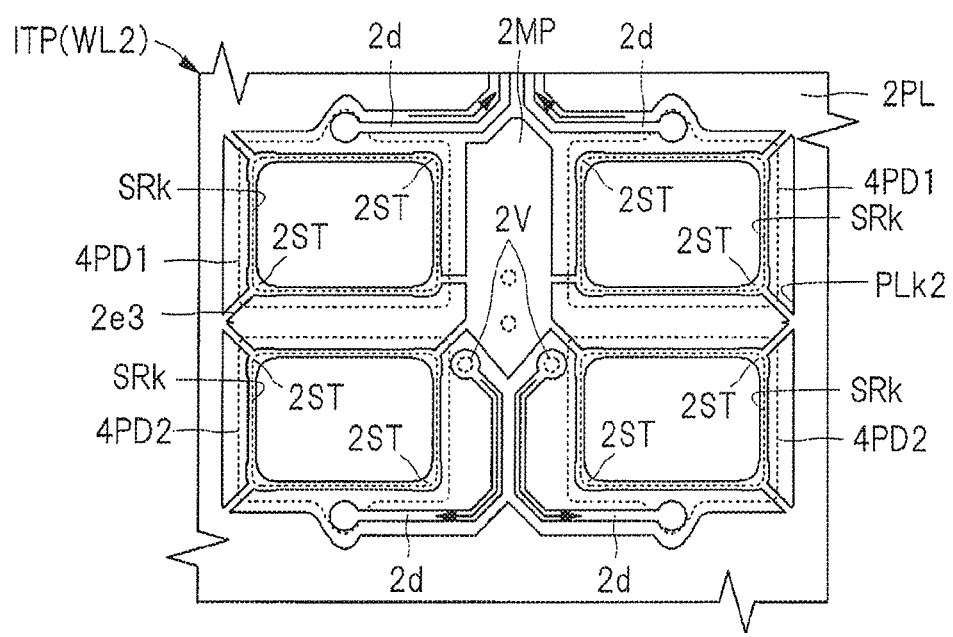
FIG. 34 is an enlarged plan view illustrating a modification example with respect to a second wiring layer illustrated in FIG. 33.

Further, the conductor pattern 2ST may be formed in an annular shape along the peripheral edge portion of the opening portion SRk as illustrated in FIG. 34 when it is desired to further improve the strength inside the opening portion PLk2. However, the annular conductor pattern sometimes functions as the antenna and affects transmission characteristics of the high-speed transmission path in this case. Thus, it is preferable to link each of the conductor patterns 2ST with the conductor plane 2PL or the conductor pattern 2MP to which the reference potential is supplied as in FIG. 33 even in the present modification example.

Third Modification Example

In addition, in the example that has been described in the above-described embodiment, the description has been given regarding the embodiment in which the same capacitor is used as the DC cut capacitor and the capacitor for the power supply circuit. However, the DC cut capacitor and the capacitor for the power supply circuit may be different capacitors. For example, the capacitor CPS includes the electrode ER3 and the electrode ER4 each of which extends in the long-side direction of the capacitor CPS in a modification example illustrated in FIG. 35. In other words, the capacitor CPS according to the modification example illustrated in FIG. 35 includes the electrode ER3 and the electrode ER4 which are arranged to face each other along a short-side direction of the capacitor CPS.

When each of the electrodes ER3 and ER4 provided in the capacitor CPS for the power supply circuit extends in the long-side direction, it is possible to increase the area of the electrode ER3 and the electrode ER4. As a result, it is possible to reduce the inductance of the power supply circuit to which the capacitor CPS is connected.

Figure 35:
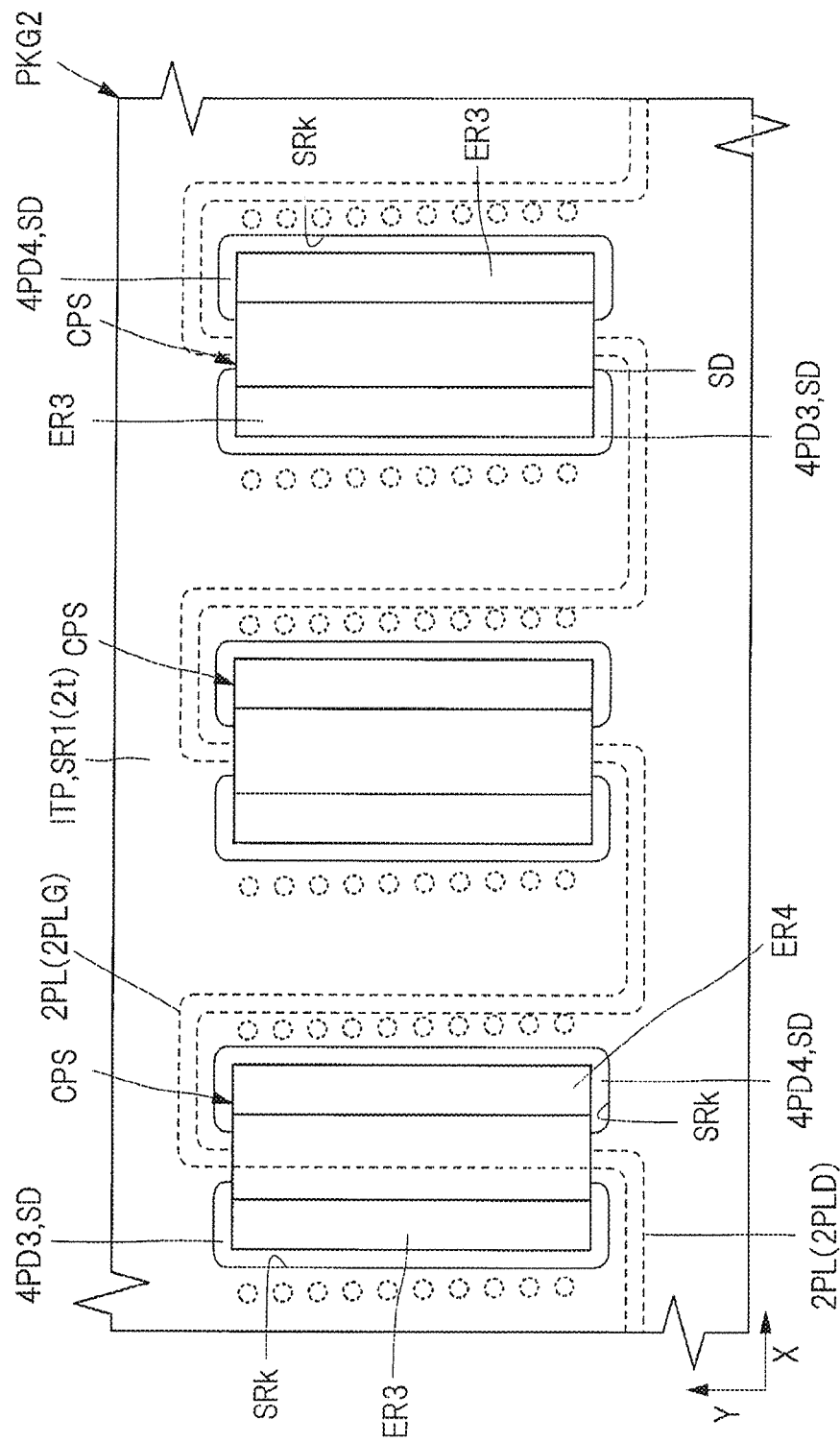
FIG. 35 is an enlarged plan view illustrating a modification example of the capacitor illustrated in FIG. 14.

In addition, each of a part of the conductor plane 2PLD for the power supply potential and a part of the conductor plane 2PLG for the ground potential is formed in a comb shape, and the part formed in a comb shape is utilized as the terminal ER3 or the terminal ER4 in the modification example illustrated in FIG. 35.

In addition, it is possible to apply the modification examples in combination within the scope of the technical idea that has been described in the above-described embodiment.

EXPLANATION OF REFERENCE CHARACTERS

2b Lower surface (surface, main surface, or mounting surface)
2Cb Lower surface
2CR Insulating layer (core member or core insulating layer)
2Ct Upper surface
2d Wire
2e, 2e2, 2e3, 2e4 Insulating layer
2LD, LDL, LDH, LVd, LVs Land (terminal, external input and output terminal, or ball land)
2MP, 2ST Conductor pattern
2PD Bonding pad (bonding lead or semiconductor chip connecting terminals)
2PL Conductor plane (conductor pattern or solid pattern)
2PLD Conductor plane (power supply plane, conductor pattern for power supply potential, or solid pattern)
2PLG Conductor plane (ground plane, conductor pattern for reference potential, or solid pattern)
2s Side surface (side)
2t Upper surface (surface, main surface, or chip mounting surface)
2TW Through-hole wire (interlayer conducting path or interlayer conducting path for core insulating layer)
2V Via (interlayer conducting path)
3b Rear surface (main surface or lower surface)
3BP Protruding electrode (bump electrode, columnar electrode, or conductive member)
3BW Wire (conductive member)
3PD Pad (electrode pad, electrode terminal, or bonding pad)
3s Side surface (side)
3t Front surface (main surface or upper surface)
4BD Main body portion
4ls Long side (long side surface)
4PD1, 4PD2, 4PD3, 4PD4 Terminal (terminal pad or conductor pattern)
4ss Short side (short side surface)
HS Heat dissipation plate (heat spreader or heat dissipation member)
BDhs Adhesive member (heat dissipation resin)
CDC Capacitor (capacitor for DC circuit or chip capacitor)
CDF Anisotropic conductive film (conductive member)
CHP1, CHP2, CHP3 Semiconductor chip
CPS Capacitor (capacitor for power supply circuit, bypass capacitor, decoupling capacitor, capacitor for battery, or chip capacitor)
CTR Central region (region)
DBA Chip mounting region (region)
DL Extending direction (long-side direction)
DSp, DSn Differential signal transmission path
DW Width direction
EDV1 Electronic device (electronic equipment)
ER1, ER2, ER3, ER4 Electrode (capacitor electrode)
HS Heat dissipation plate (member, heat spreader, or heat dissipation member)
ITP Wiring substrate (interposer)
MB1 Wiring substrate (motherboard or mounting board)
MBt Upper surface (mounting surface)
MR Sealing body (resin body)
PKG1, PKG2 Semiconductor device
PLk1, PLk2, PLk3, PLk4 Opening portion
PRP Peripheral edge region (region)

Rx, RxL, Rxn, Rxp, Tx, TxL, Txn, Txp, Vd, Vs Electrode (electrode pad)
SB Solder ball (solder member, external terminal, electrode, or external electrode)
SD Bonding member (solder member or conductive member)
SFR Support frame (stiffener ring)
SGin, SGout Inspection signal
SGP Signal transmission path
SGP1 Low-speed transmission path
SGP2 High-speed transmission path
SR1, SR2 Insulating layer (solder resist film)
SRk Opening portion (terminal exposing opening portion)
THL Through-hole land
TM1, TM2 Terminal
UF Underfill resin (insulating resin)
VDD Power supply potential (potential)
VDP Power supply potential supplying path
VSP Reference potential supplying path
VSS Reference potential (potential)
WL1, WL2, WL3, WL4, WL5, WL6, WL7, WL8 Wiring layer

The invention claimed is:

1. A method of manufacturing a semiconductor device, comprising the steps of:
   (a) providing a wiring substrate including a first surface;
   (b) after the step (a), mounting a semiconductor chip and a first capacitor on the first surface of the wiring substrate, the semiconductor chip including a plurality of electrode pads, and the first capacitor including a first electrode and a second electrode;
   (c) after the step (b), covering the semiconductor chip with a first member such that the first capacitor is exposed from the first member; and
   (d) performing an electrical test of a circuit with which the first capacitor is coupled, while short-circuiting the first electrode of the first capacitor and the second electrode of the first capacitor, the first capacitor being not covered by the first member.

2. The method of manufacturing a semiconductor device according to claim 1,
   wherein the first capacitor is inserted, in series connection, in a signal transmission path through which an electrical signal is input to or output from a first circuit formed in the semiconductor chip.

3. The method of manufacturing a semiconductor device according to claim 2,
   wherein both of the first electrode and the second electrode of the first capacitor are pressed by a conductive member and short-circuited in the step (d),
   wherein the plurality of wiring layers included in the wiring substrate has:
      a first wiring layer including a first terminal pad electrically connected with the first electrode of the first capacitor and a second terminal pad electrically connected with the second electrode of the first capacitor, and
      a second wiring layer positioned on an inner side by one layer from the first wiring layer of the wiring substrate and including a first conductor pattern having a larger area than each of the first terminal pad and the second terminal pad,
   wherein the first conductor pattern includes a first opening portion formed at a region overlapping with each of the first terminal pad and the second terminal pad in the second wiring layer,
   wherein a plurality of second conductor patterns is formed inside the first opening portion of the first wiring layer,
   wherein the first wiring layer is covered by a first insulating layer, and each of the first terminal pad and the second terminal pad is exposed from the first insulating layer in a plurality of terminal exposing opening portions formed in the first insulating layer,
   wherein the plurality of terminal exposing opening portions forms quadrangles when seen in a plan view, and
   wherein the plurality of second conductor patterns formed inside the first opening portion of the first wiring layer is arranged at positions overlapping corners of the terminal exposing opening portion.

4. The method of manufacturing a semiconductor device according to claim 3,
   wherein the plurality of second conductor patterns formed inside the first opening portion of the first wiring layer extends along each short side of terminal exposing opening portion.

5. The method of manufacturing a semiconductor device according to claim 4,
   wherein each of the plurality of second conductor patterns formed inside the first opening portion of the first wiring layer is linked with the first conductor pattern to which a first potential is supplied.

* * * * *